(12) United States Patent
Scheuermann et al.

(10) Patent No.: US 8,126,949 B1
(45) Date of Patent: Feb. 28, 2012

(54) RECONFIGURABLE FILTER NODE FOR AN ADAPTIVE COMPUTING MACHINE

(75) Inventors: W. James Scheuermann, Saratoga, CA (US); Otis Lamont Frost, III, Palo Alto, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1111 days.

(21) Appl. No.: 11/952,998

(22) Filed: Dec. 7, 2007

Related U.S. Application Data

(62) Division of application No. 10/386,896, filed on Mar. 11, 2003, now Pat. No. 7,353,243.

(60) Provisional application No. 60/420,762, filed on Oct. 22, 2002, provisional application No. 60/421,543, filed on Oct. 24, 2002.

(51) Int. Cl.
*G06F 17/10* (2006.01)

(52) U.S. Cl. ........................................ 708/319; 708/316

(58) Field of Classification Search .................. 708/319, 708/316
See application file for complete search history.

(56) References Cited

U.S. PATENT DOCUMENTS 6,963,890 B2 * 11/2005 Dutta et al. .................... 708/319

* cited by examiner

*Primary Examiner* — Tan V Mai
(74) *Attorney, Agent, or Firm* — Patterson & Sheridan, LLP.

(57) ABSTRACT

A reconfigurable filter node including an input data memory adapted to store a plurality of input data values, a filter coefficient memory adapted to store a plurality of filter coefficient values, and a plurality of computational units adapted to simultaneously compute filter data values. Filter data values are the outputs of a filter in response to input data values or a second plurality of filter coefficients to be used in subsequent filter data value computations. First and second input data registers load successive input data values input data memory or from adjacent computational units. Each computational unit comprises a pre-adder adapted to output either the sum two input data values stored in the computational unit or alternately to output a single input data value, and a multiply-and-accumulate unit adapted to multiply the output of the pre-adder by a filter coefficient and accumulate the result.

11 Claims, 52 Drawing Sheets

NODE WRAPPER INTERFACES

700

700

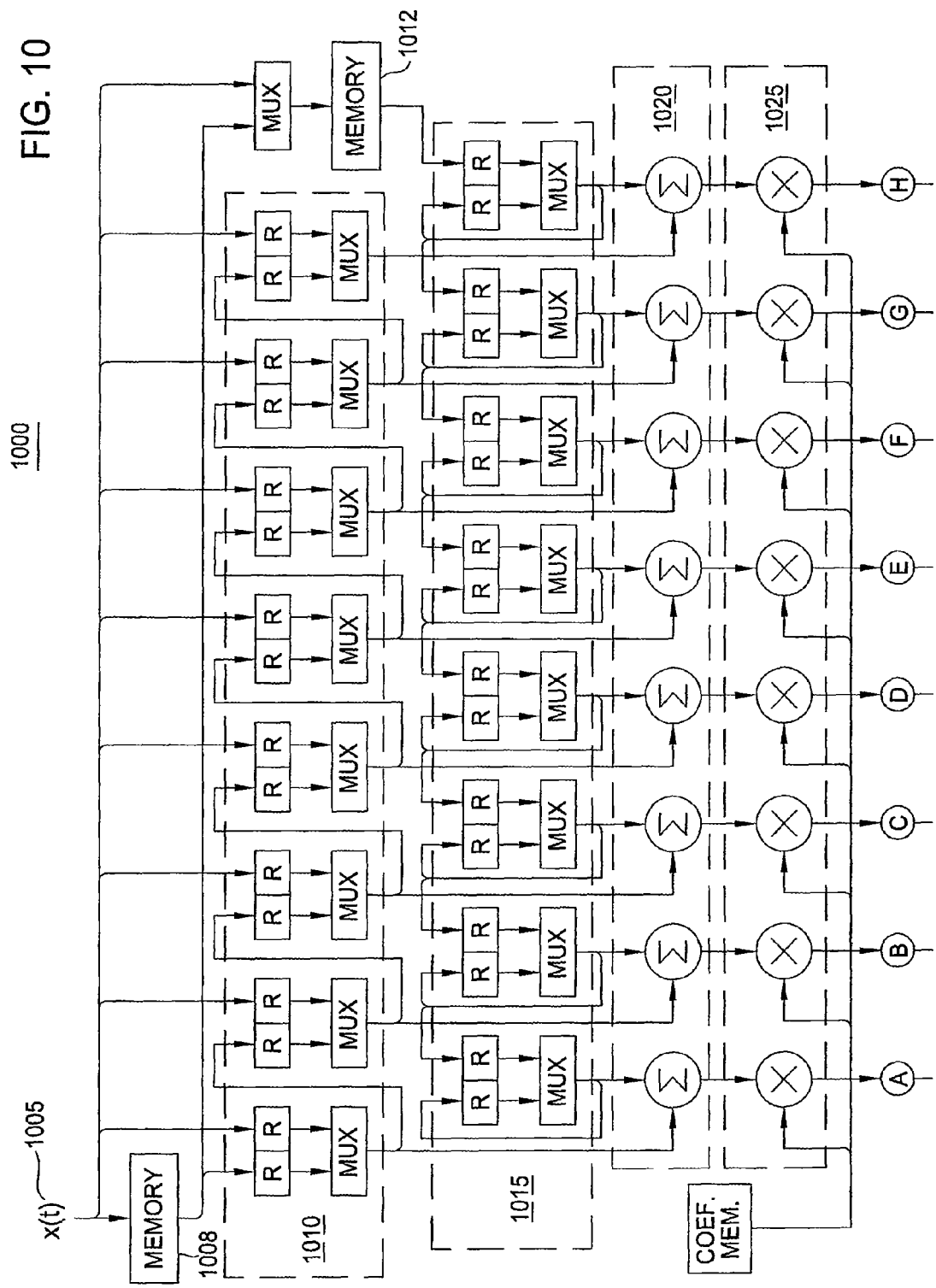

FILTER INPUT x(t)

| x(99) | x(100) | x(101) | x(102) | x(103) |
|---|---|---|---|---|

FILTER COEFFICIENTS

| $h_{20}$ $h_{21}$ $h_{22}$ $h_{23}$ $h_{24}$ $h_{25}$ $h_{26}$ $h_{27}$ $h_{28}$ $h_{29}$ $h_{30}$ $h_{31}$ $h_{32}$ $h_{33}$ $h_{34}$ $h_{35}$ $h_{36}$ $h_{37}$ $h_{38}$ $h_{39}$ | $h_0$ $h_1$ $h_2$ $h_3$ |
|---|---|

(LEFT-MOST)  COMPUTATIONAL UNIT #1

(A) 67 66 65 64 63 62 61 60 59 58 57 56 55 54 53 52 51 50 49 48 | 95 94 93 92
     28 29 30 31 32 33 34 35 36 37 38 39 40 41 42 43 44 45 46 47 | ⑯ 17 18 19

COMPUTATIONAL UNIT #2

(B) 68 67 66 65 64 63 62 61 60 59 58 57 56 55 54 53 52 51 50 49 | 96 95 94 93
     29 30 31 32 33 34 35 36 37 38 39 40 41 42 43 44 45 46 47 48 | ⑰ 18 19 20

COMPUTATIONAL UNIT #3

(C) 69 68 67 66 65 64 63 62 61 60 59 58 57 56 55 54 53 52 51 50 | 97 96 95 94
     30 31 32 33 34 35 36 37 38 39 40 41 42 43 44 45 46 47 48 49 | ⑱ 19 20 21

COMPUTATIONAL UNIT #4

(D) 70 69 68 67 66 65 64 63 62 61 60 59 58 57 56 55 54 53 52 51 | 98 97 96 95
     31 32 33 34 35 36 37 38 39 40 41 42 43 44 45 46 47 48 49 50 | ⑲ 20 21 22

COMPUTATIONAL UNIT #5

(E) 71 70 69 68 67 66 65 64 63 62 61 60 59 58 57 56 55 54 53 52 | 99 98 97 96
     32 33 34 35 36 37 38 39 40 41 42 43 44 45 46 47 48 49 50 51 | ⑳ 21 22 23

COMPUTATIONAL UNIT #6

(F) 72 71 70 69 68 67 66 65 64 63 62 61 60 59 58 57 56 55 54 53 | 100 99 98 97
     33 34 35 36 37 38 39 40 41 42 43 44 45 46 47 48 49 50 51 52 | ㉑ 22 23 24

COMPUTATIONAL UNIT #7

(G) 73 72 71 70 69 68 67 66 65 64 63 62 61 60 59 58 57 56 55 54 | 101 100 99 98
     34 35 36 37 38 39 40 41 42 43 44 45 46 47 48 49 50 51 52 53 | ㉒ 23 24 25

COMPUTATIONAL UNIT #8

(H) 74 73 72 71 70 69 68 67 66 65 64 63 62 61 60 59 58 57 56 55 | 102 101 100 99
     35 36 37 38 39 40 41 42 43 44 45 46 47 48 49 50 51 52 53 54 | ㉓ 24 25 26

........ THEN MUX

FILTER OUTPUT y(t)

| y(4 to 83) | y(5 to 84) | y(6 to 85) | y(7 to 86) | y(8 to 87) |
|---|---|---|---|---|

A) Example Half-Band Filter Impulse Response:
(may or may not be symmetrical)

$h_i = 1, i = 1/2$
$h_i = 0, i = 1, 3, \ldots 1/2-2,$

B) Direct Form Half-Band Interpolation Filter (assumed asymetrical)

C) Polyphase Form Interpolation Filter (assumed asymetrical)

A) Example Half-Band Filter Impulse Response:
(may or may not be symmetrical, length: l + 1 = 11)

$h_i = 1, i = 1/2$
$h_i = 0, i = 1, 3, \ldots 1/2-2,$

B) Direct Form Half-Band Decimation Filter (assumed asymetrical)

C) Polyphase Form Decimation Filter (assumed asymetrical)

A) Complex FIR Filter:

B) Coefficient Update

RECONFIGURABLE FILTER NODE FOR AN ADAPTIVE COMPUTING MACHINE

CROSS-REFERENCES TO RELATED APPLICATIONS

This application is a divisional of U.S. patent application Ser. No. 10/386,896, filed Mar. 11, 2003, which claims priority to provisional application No. 60/420,762, filed on Oct. 22, 2002 and provisional application No. 60/421,543, filed on Oct. 24, 2002, the disclosures of which are incorporated by reference herein.

BACKGROUND OF THE INVENTION

This invention is related in general to digital processing architectures and more specifically to the design of a reconfigurable filter node for use in an adaptive computing engine.

The advances made in the design and development of integrated circuits ("ICs") have generally produced information processing devices falling into one of several distinct types or categories having different properties and functions, such as microprocessors and digital signal processors ("DSPs"), application specific integrated circuits ("ASICs"), and field programmable gate arrays ("FPGAs"). Each of these different types or categories of information processing devices have distinct advantages and disadvantages.

Microprocessors and DSPs, for example, typically provide a flexible, software programmable solution for a wide variety of tasks. The flexibility of these devices requires a large amount of instruction decoding and processing, resulting in a comparatively small amount of processing resources devoted to actual algorithmic operations. Consequently, microprocessors and DSPs require significant processing resources, in the form of clock speed or silicon area, and consume significantly more power compared with other types of devices.

ASICs, while having comparative advantages in power consumption and size, use a fixed, "hard-wired" implementation of transistors to implement one or a small group of highly specific tasks. ASICs typically perform these tasks quite effectively; however, ASICs are not readily changeable, essentially requiring new masks and fabrication to realize any modifications to the intended tasks.

FPGAs allow a degree of post-fabrication modification, enabling some design and programming flexibility. FPGAs are comprised of small, repeating arrays of identical logic devices surrounded by several levels of programmable interconnects. Functions are implemented by configuring the interconnects to connect the logic devices in particular sequences and arrangements. Although FPGAs can be reconfigured after fabrication, the reconfiguring process is comparatively slow and is unsuitable for most real-time, immediate applications. Additionally, FPGAs are very expensive and very inefficient for implementation of particular functions. An algorithmic operation implemented on an FPGA may require orders of magnitude more silicon area, processing time, and power than its ASIC counterpart, particularly when the algorithm is a poor fit to the FPGA's array of homogeneous logic devices.

One type of valuable processing is implementing digital filters. Such filters are used in digital signal processing such as to encode or decode signals, modulate or demodulate communications, and perform interpolation or decimation of signals prior to additional processing. Most digital filtering must be performed in real-time, so processing speed is an important design consideration. In addition, with some applications, such as mobile telephones and communication devices, limited battery capacity makes power consumption a consideration. Cost is also a consideration for many applications, making the efficient use of silicon area a priority in filtering applications.

Thus, it is desirable to provide a node for use in an adaptive computing engine specifically adapted to digital filtering applications. It is further desirable that the digital filter node provide fast performance, flexible configuration, low power consumption, and low cost for a wide variety of digital filter types.

BRIEF SUMMARY OF THE INVENTION

The present invention includes a reconfigurable filter node including an input data memory adapted to store a plurality of input data values, a filter coefficient memory adapted to store a plurality of filter coefficient values, and a plurality of computational units adapted to simultaneously compute filter data values. Each computational unit is adapted to process at least one input data value and one filter coefficient.

In an embodiment, the filter data values are the outputs of a filter in response to input data values. Alternatively, the filter data values are a second plurality of filter coefficients to be used in subsequent filter data value computations. The filter data values can be stored in the filter coefficient memory in this alternate embodiment.

In another embodiment, the plurality of computational units include a left computational unit, a right computational unit, and a plurality of intermediate computational units logically positioned between the left and right computational units. Each computational unit comprises a first input data value register adapted to store an input data value. Each first input data value register of the intermediate computational units is adapted to load a successive input data value from the first input data value register of an adjacent computational unit.

In a further embodiment, each computational unit further includes a second input data value register adapted to store an input data value. Each second input data value register of the intermediate computational units is adapted to load a successive input data value from the second input data value register of an adjacent computational unit. In yet another embodiment, the first and second input data value registers of each intermediate computational unit load successive data input values from different adjacent computational units.

An additional embodiment of the invention includes at least one multiplexer located between a pair of adjacent intermediate computational units to selectively disengage the pair of adjacent first and second input data registers and selectively engage the pair of adjacent first and second data registers to the input data memory.

In another embodiment of the invention, each computational unit comprises a pre-adder adapted to output either the sum two input data values stored in the computational unit or alternately to output a single input data value. In a further embodiment, each computational unit includes a multiply-and-accumulate unit adapted to multiply the output of the pre-adder by a filter coefficient and accumulate the result. A coefficient memory selects a first filter coefficient for simultaneous use by a first plurality of computational units, and a multiplexer alternately selects either the first filter coefficient or a second filter coefficient from the coefficient memory for use by a second plurality of computational units.

Yet another embodiment of the invention comprises an output data multiplexer for selectively accessing an output data value from each of the plurality of computational units. Optionally, an output data memory stores the output data values. A data address generator directs output data values to specified memory addresses within the output data memory. An optional additional data address generator specifies memory addresses to retrieve output data values.

BRIEF DESCRIPTION OF THE DRAWINGS

The present invention will be discussed with reference to the drawings, in which.

DETAILED DESCRIPTION OF THE INVENTION

To address the deficiencies of prior types of information processing devices, an adaptive computing engine (ACE) architecture has been developed that provides the programming flexibility of a microprocessor, the speed and efficiency of an ASIC, and the post-fabrication reconfiguration of an FPGA. The details of this architecture are disclosed in the U.S. patent application Ser. No. 09/815,122, entitled "Adaptive Integrated Circuitry with Heterogeneous and Reconfigurable Matrices of Diverse and Adaptive Computational Units having Fixed, Application Specific Computational Elements," filed on Mar. 22, 2001, and incorporated by reference herein.

Figure 1:
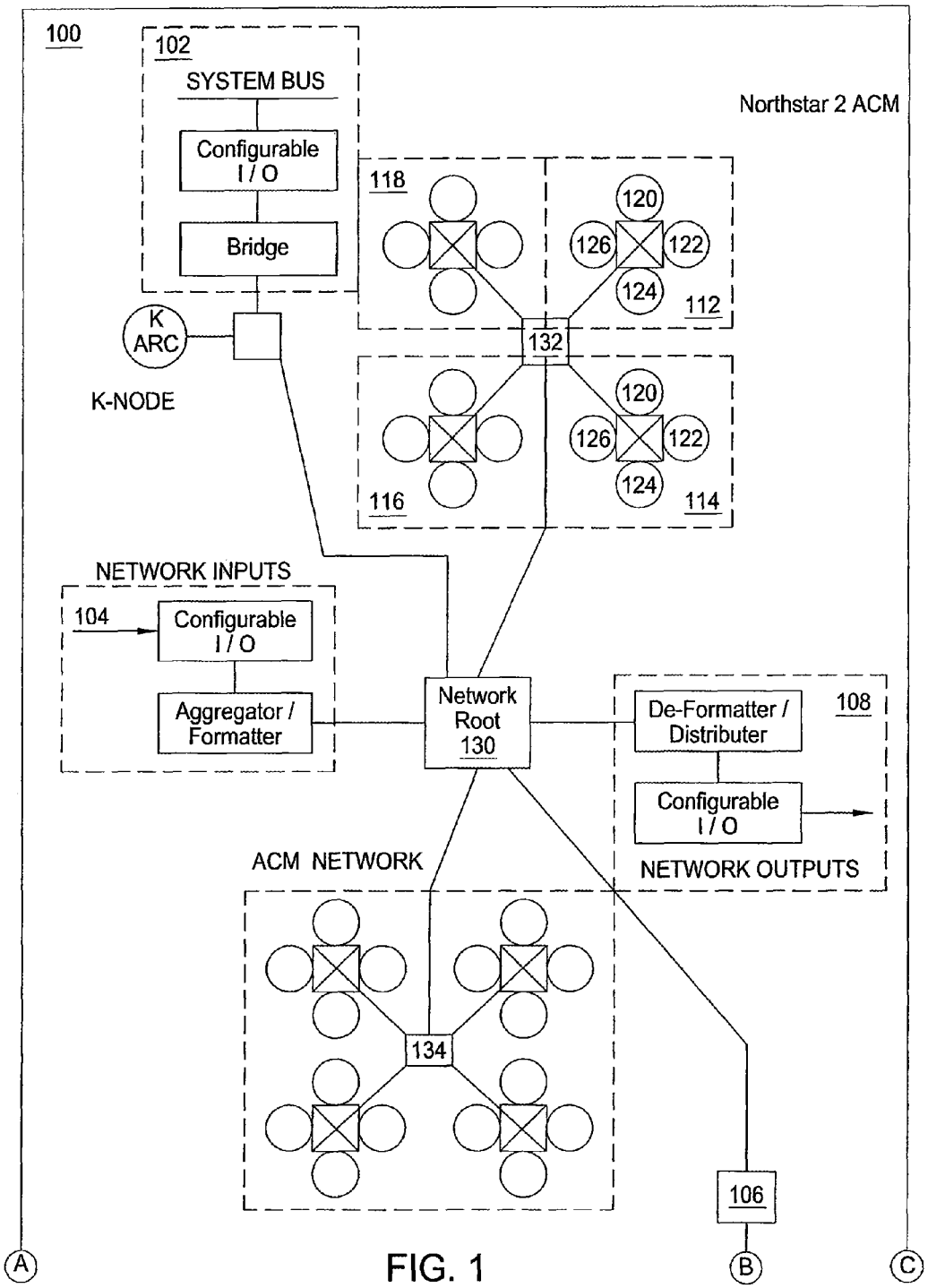
FIG. 1 illustrates an adaptive computing device according to an embodiment of the invention.
Figure 1:
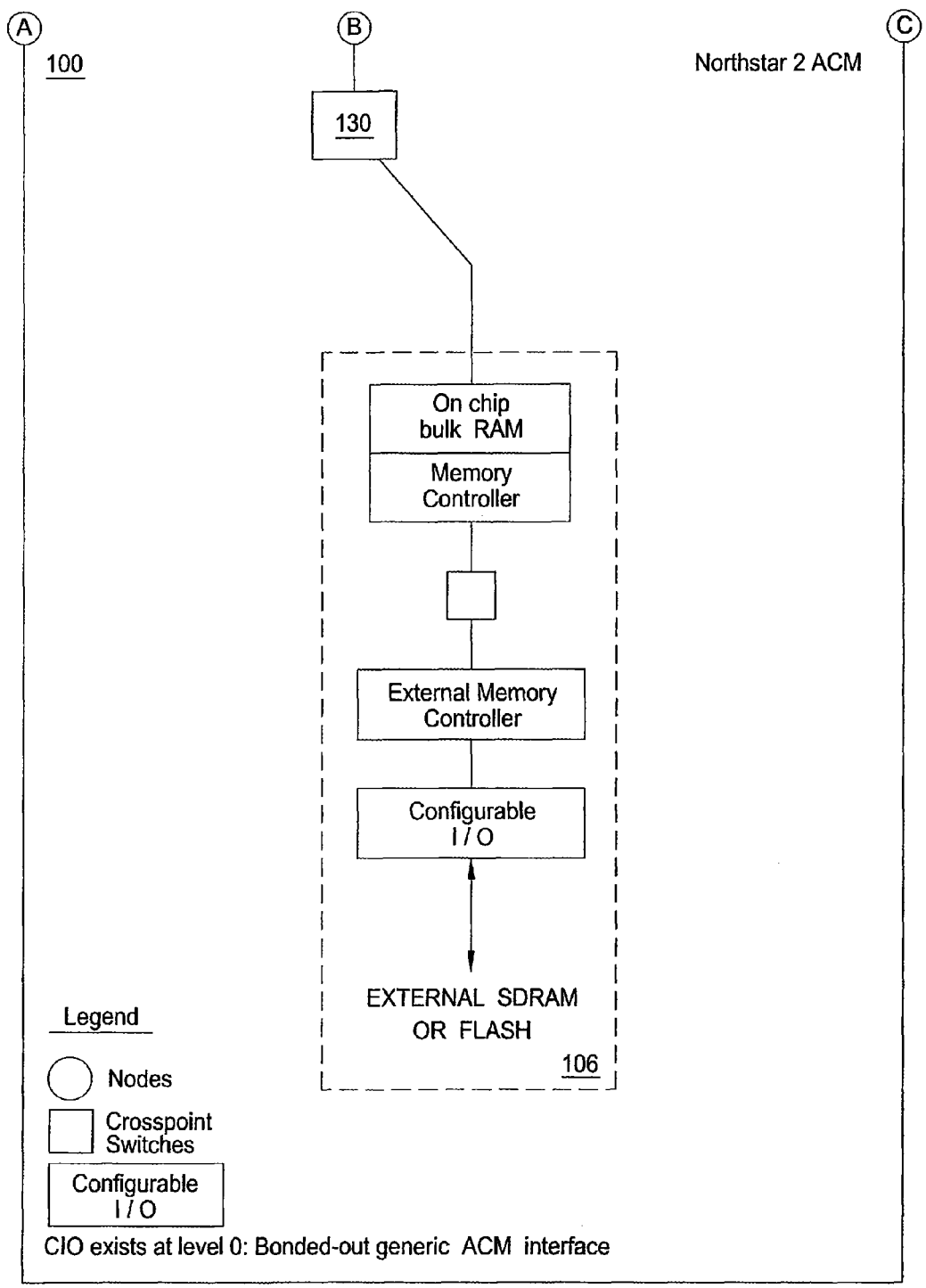

In general, the ACE architecture includes a plurality of heterogeneous computational elements coupled together via a programmable interconnection network. FIG. 1 illustrates an embodiment 100 of an ACE device. In this embodiment, the ACE device is realized on a single integrated circuit. A system bus interface 102 is provided for communication with external systems via an external system bus. A network input interface 104 is provided to send and receive real-time data. An external memory interface 106 is provided to enable this use of additional external memory devices, including SDRAM or flash memory devices. A network output interface 108 is provided for optionally communicating with additional ACE devices, as discussed below with respect to FIG. 2.

A plurality of heterogeneous computational elements (or nodes), including computing elements 120, 122, 124, and 126, comprise fixed and differing architectures corresponding to different algorithmic functions. Each node is specifically adapted to implement one of many different categories or types of functions, such as internal memory, logic and bit-level functions, arithmetic functions, control functions, and input and output functions. The quantity of nodes of differing types in an ACE device can vary according to the application requirements.

Because each node has a fixed architecture specifically adapted to its intended function, nodes approach the algorithmic efficiency of ASIC devices. For example, a binary logical node may be especially suited for bit-manipulation operations such as, logical AND, OR, NOR, XOR operations, bit shifting, etc. An arithmetic node may be especially well suited for math operations such as addition, subtraction, multiplication, division, etc. Other types of nodes are possible that can be designed for optimal processing of specific types.

Programmable interconnection network 110 enables communication among a plurality of nodes, and interfaces 102, 104, 106, and 108. By changing the number and order of connections between various nodes, the programmable interconnection network is able to quickly reconfigure the ACE device for a variety of different tasks. For example, merely changing the configuration of the interconnections between nodes allows the same set of heterogeneous nodes to implement vastly different functions, such as linear or non-linear algorithmic operations, finite state machine operations, memory operations, bit-level manipulations, fast Fourier or discrete cosine transformations, and many other high level processing functions for advanced computing, signal processing, and communications applications.

In an embodiment, programmable interconnection network 110 comprises a network root 130 and a plurality of crosspoint switches, including switches 132 and 134. In an embodiment, programmable interconnection network 110 is logically and/or physically arranged as a hierarchical tree to maximize distribution efficiency. In this embodiment, a number of nodes can be clustered together around a single crosspoint switch. The crosspoint switch is further connected with additional crosspoint switches, which facilitate communication between nodes in different clusters. For example, cluster 112, which comprises nodes 120, 122, 124, and 126, is connected with crosspoint switch 132 to enable communication with the nodes of clusters 114, 116, and 118. Crosspoint switch is further connected with additional crosspoint switches, for example crosspoint switch 134 via network root 130, to enable communication between any of the plurality of nodes in ACE device 100.

Figure 2:
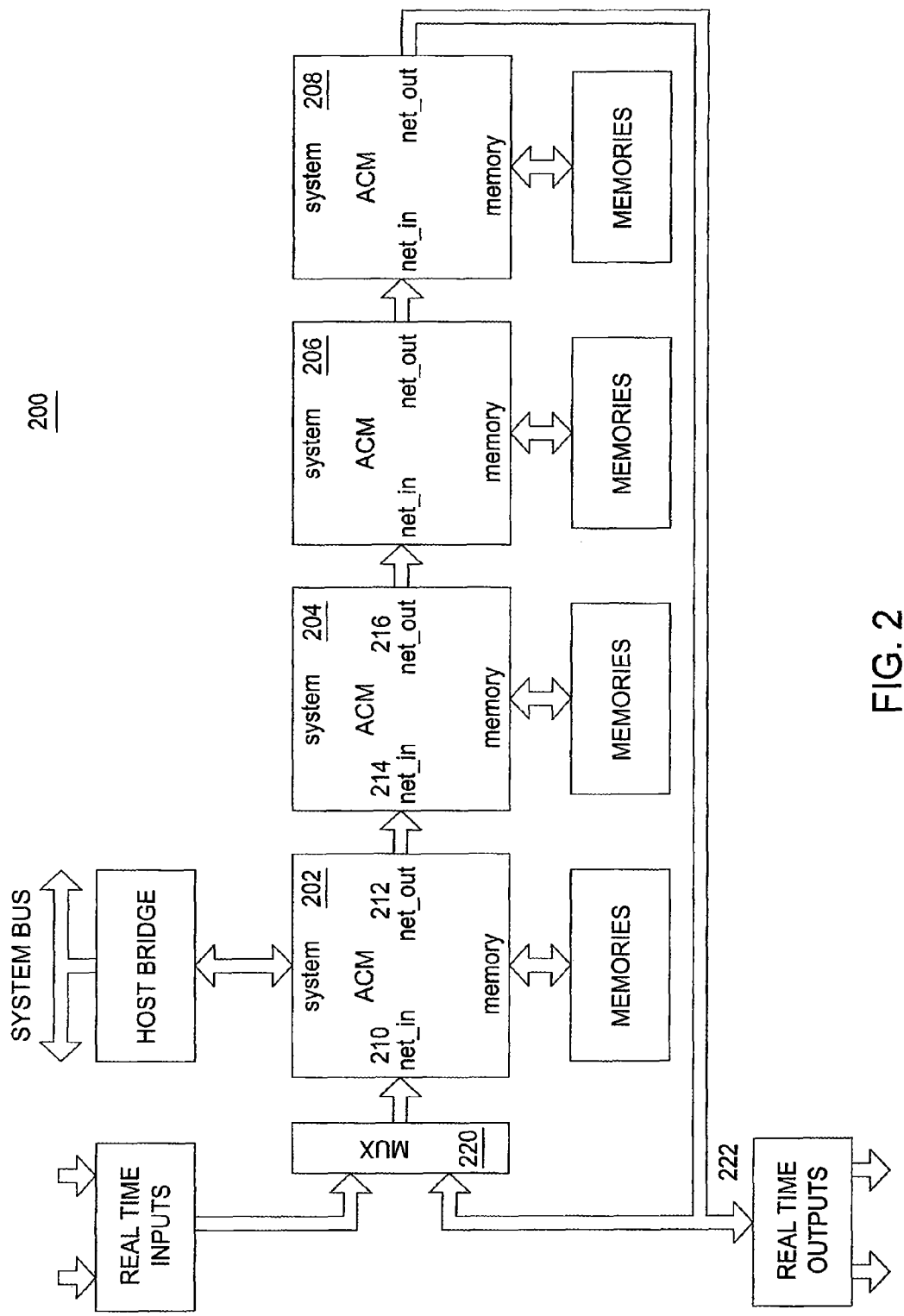
FIG. 2 illustrates a system of adaptive computing devices according to an embodiment of the invention.

The programmable interconnection network 110, in addition to facilitating communications between nodes within ACE device 100, also enables communication with nodes within other ACE devices. FIG. 2 shows a plurality of ACE devices 202, 204, 206, and 208, each having a plurality of nodes, connected together in a development system 200. The system bus interface of ACE device 202 communicates with external systems via an external system bus. Real-time input is communicated to and from ACE device 202 via a network input interface 210. Real-time inputs and additional data generated by ACE device 202 can be further communicated to ACE device 204 via network output interface 212 and network input interface 214. ACE device 204 communicates real-time inputs and additional data generated by either itself or ACE device 202 to ACE device 206 via network output interface 216. In this manner, any number of ACE devices may be coupled together to operate in parallel. Additionally, the network output interface 218 of the last ACE device in the series, ACE device 208, communicates real-time data output and optionally forms a data feedback loop with ACE device 202 via multiplexer 220.

As indicated above, there exists a need for a node in an adaptive computing engine (ACE) adapted to digital filtering applications that offers fast performance, flexible configuration, low power consumption, and low cost. In accordance with the present invention, a reconfigurable filter node (RFN) fulfills these requirements and integrates seamlessly with other types of nodes in the ACE architecture.

Figure 3:
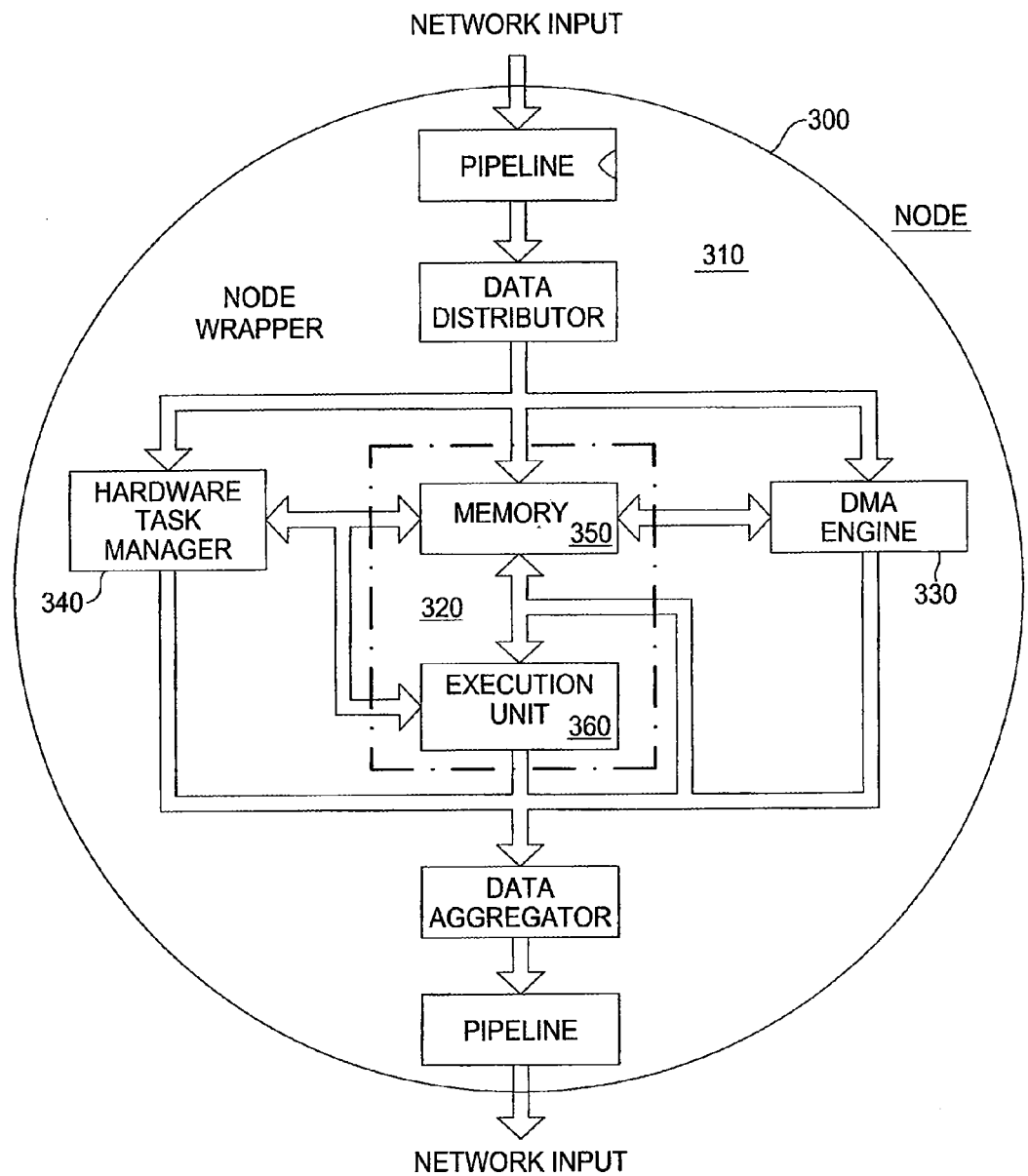
FIG. 3 illustrates a node of an adaptive computing device according to an embodiment of the invention.

FIG. 3 is a block diagram illustrating the general internal structure of a node for use in a ACE. Node 300 can be any type of node, including a node for internal memory, logic and bit-level functions, arithmetic functions, control functions, input and output functions, or an RFN according to the present invention. Node 300 includes a node wrapper 310 to facilitate communications with the programmable interconnection network. Node wrapper 310 receives data and configuration information from the programmable interconnection network and distributes information as appropriate to the node core 320. Node wrapper 310 also collects information from the node core 320 and sends it to other nodes or external devices via programmable interconnection network.

Figure 5:
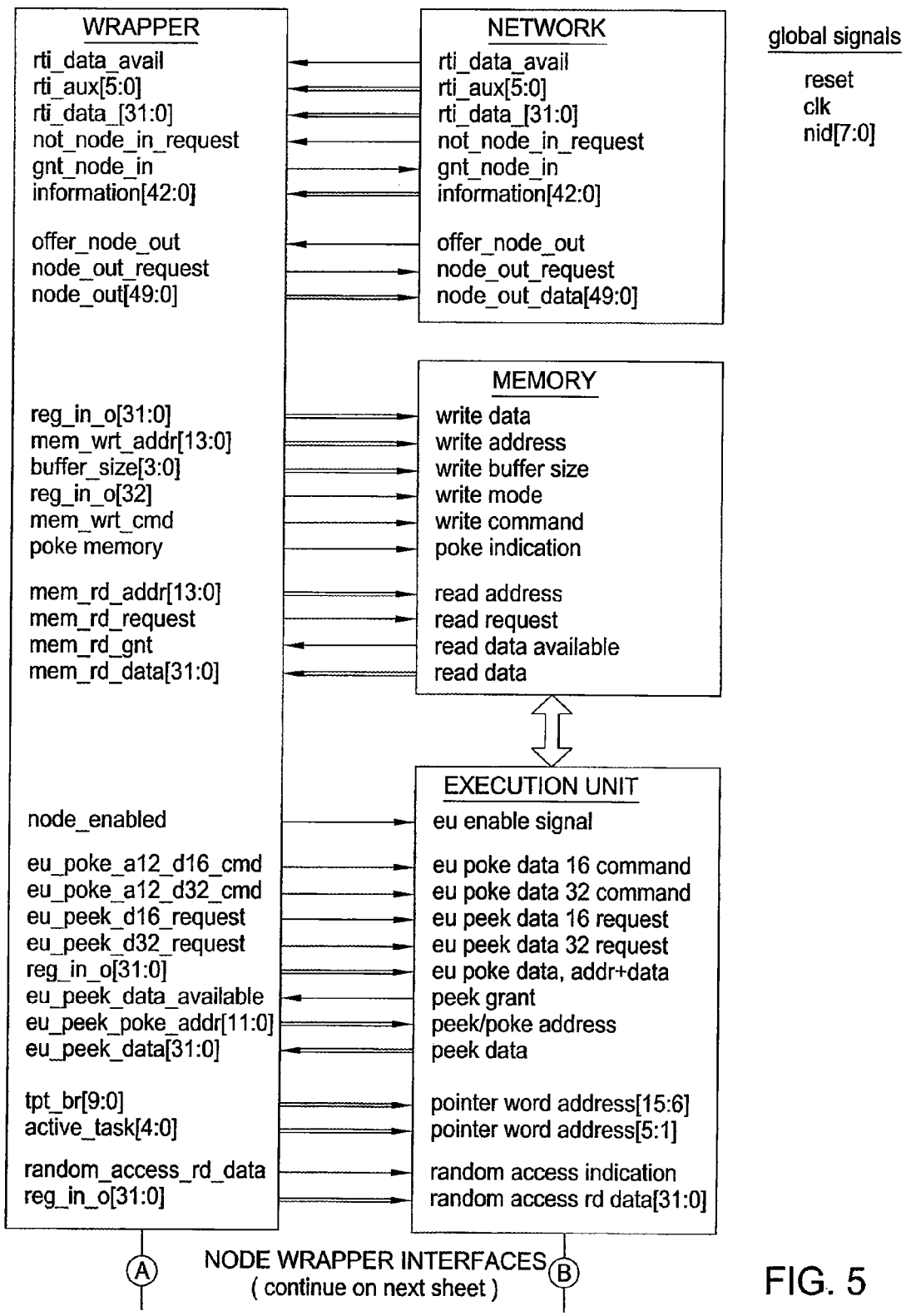
FIG. 5 illustrates the node wrapper interface according to an embodiment of the invention.
Figure 5:
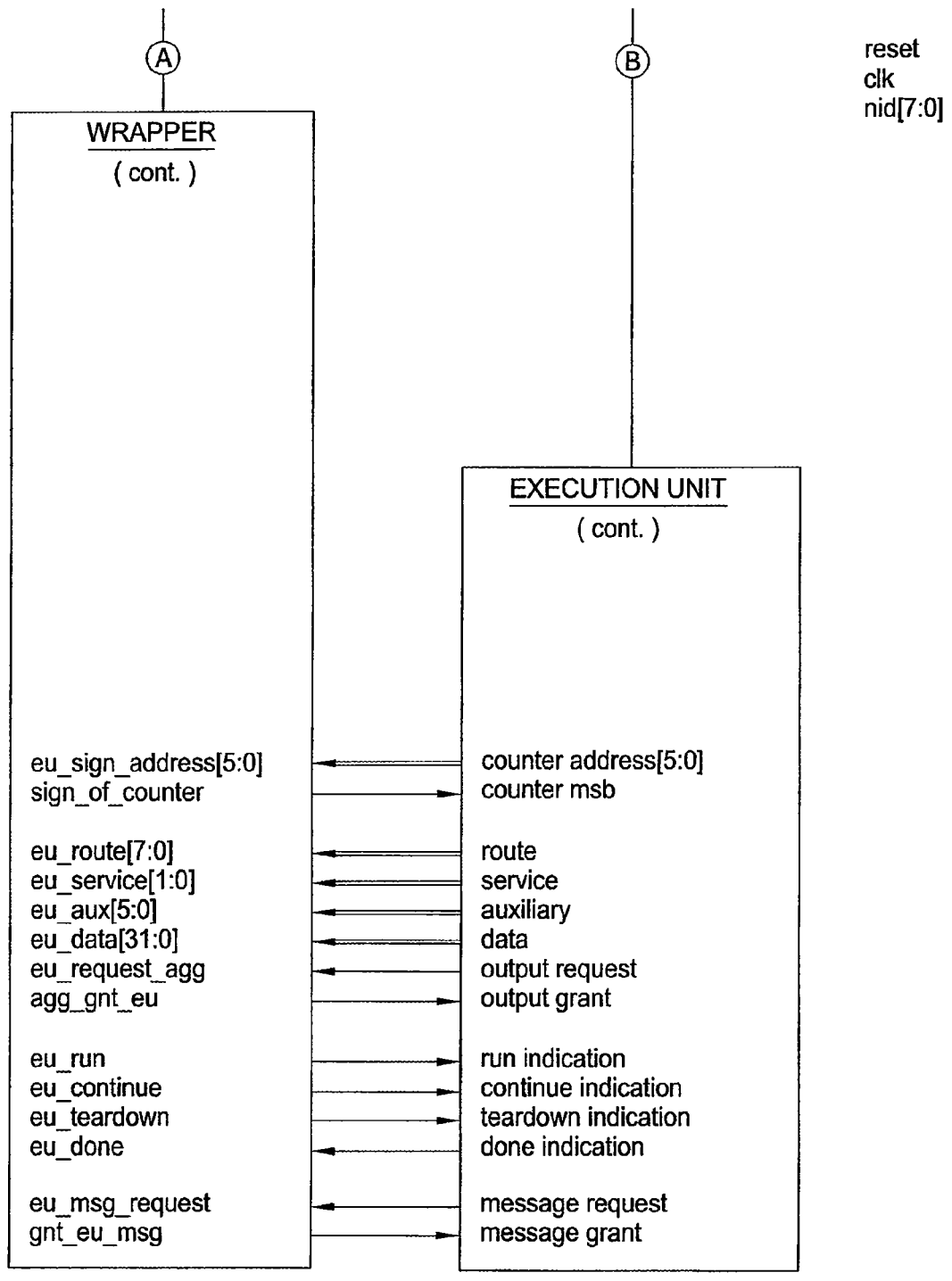

For receiving information, the node wrapper 310 includes a pipeline unit and a data distribution unit. For sending data, the node wrapper 310 includes a data aggregator unit and a pipeline unit. Node wrapper 310 also includes a hardware task manager 340 and a DMA engine 330 that coordinates direct memory access (DMA) operations. FIG. 5 shows the node wrapper interface in more detail.

The node core 320 is specific to the intended function of the node. Generally, the node core 320 includes node memory 350 and an execution unit 360. Node memory 350 serves as local storage for node configuration information and data processed by the node. Execution unit 360 processes data to perform the intended function of the node. The size and format of node memory 350 and the internal structure of the execution unit 360 are specific to the intended function of the node. For the RFN of the present invention, the execution unit 360 and the node memory 350 are designed as discussed below for digital filtering applications.

Figure 4:
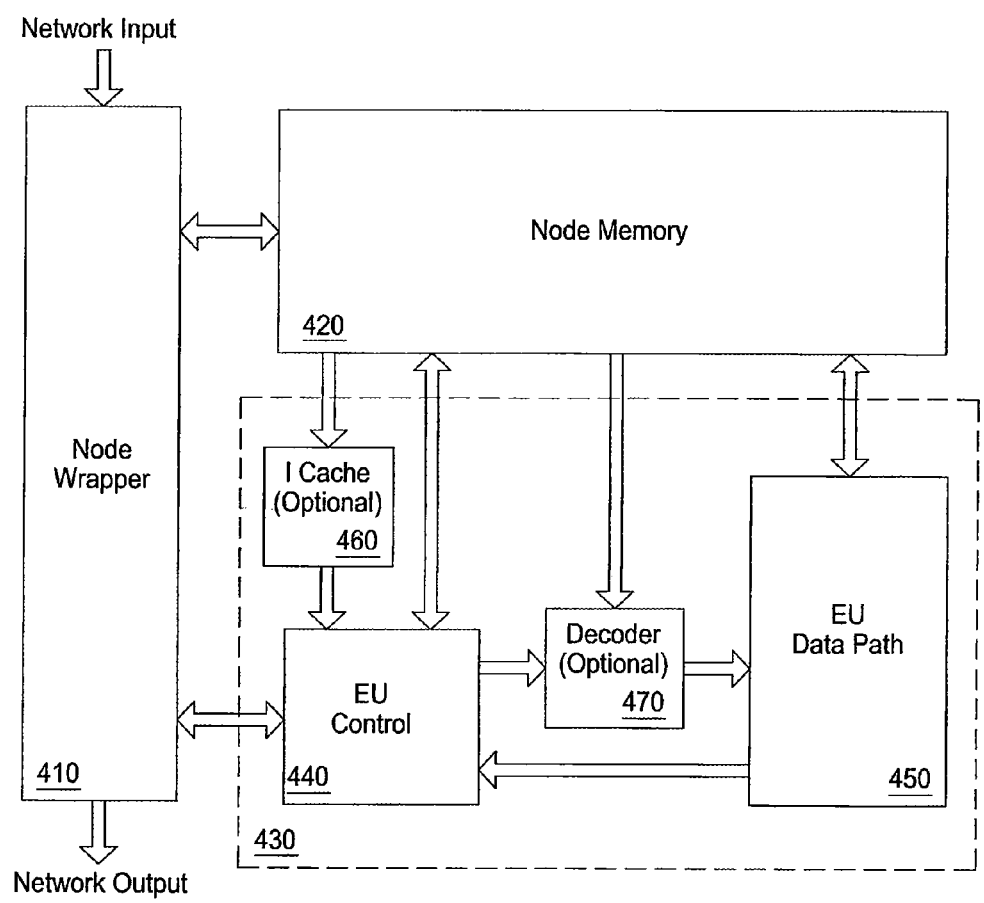
FIG. 4 illustrates the internal structure of a node according to an embodiment of the invention.

FIG. 4 illustrates a block diagram of a node 400 showing the connections between the node wrapper 410, node memory 420, and the execution unit 430. Execution unit 430 includes an execution unit controller 440 for controlling the functions of the execution unit, an optional instruction cache 460 for temporarily storing instructions to the execution unit controller 440, an optional decoder 470, and an execution data path 450 for processing data under the supervision of the execution unit controller 440.

Figure 6:
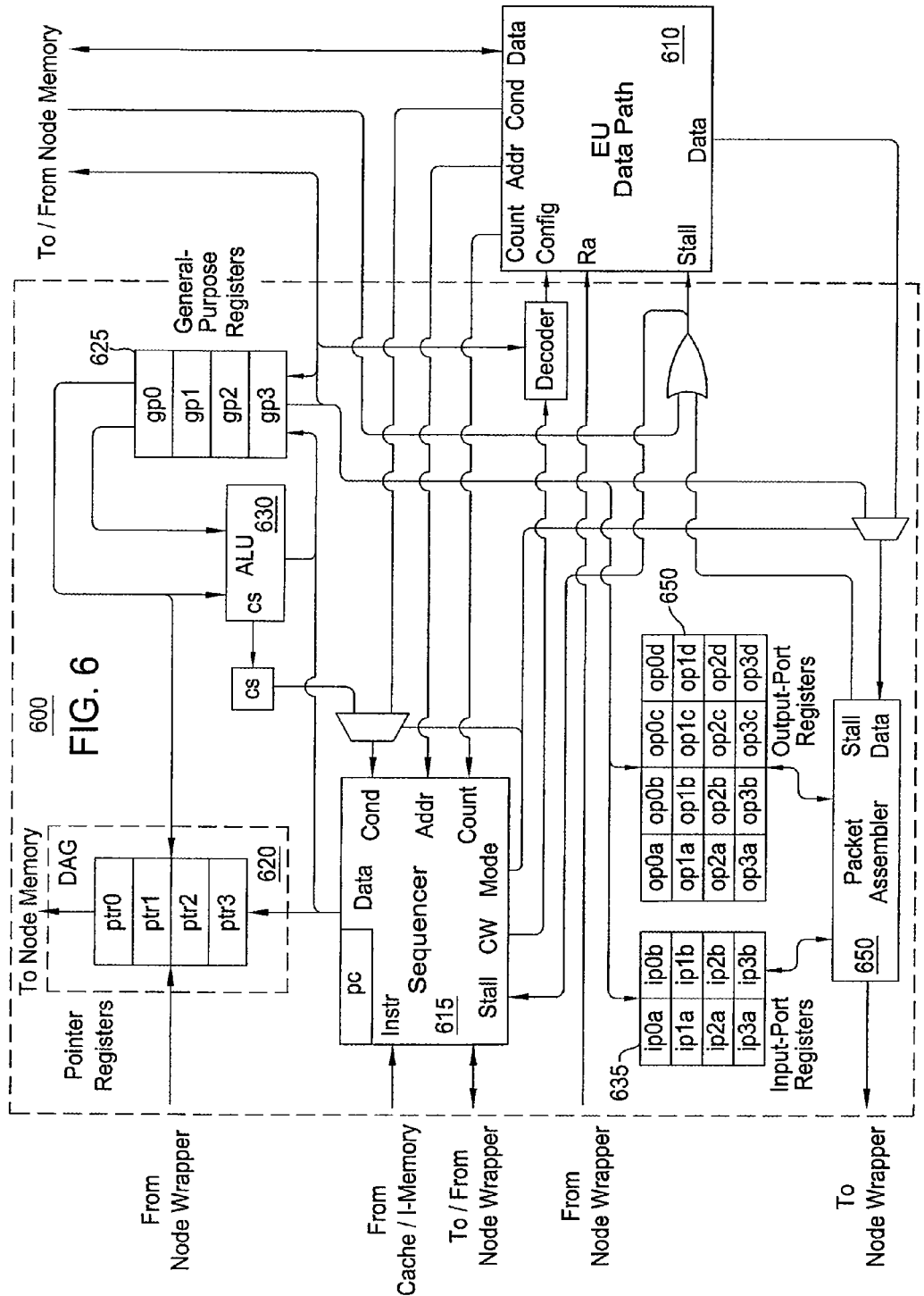
FIG. 6 illustrates a node execution unit controller according to an embodiment of the invention.

FIG. 6 illustrates an embodiment of an execution unit controller 600 for controlling execution unit data path 610. Execution unit controller 610 includes a sequencer 615 for processing controller instructions. Sequencer 615 operates pointer registers 620 and general purpose registers 625 to control the addressing, storage, and retrieval of information node memory. Sequencer 615 also configures the execution unit data path to implement the specific desired node function. ALU 630 is used to modify the information stored in general purpose registers 625. Input port registers 635 and output port registers 640 are used by packet assembler 650 to format data for communication over the programmable interconnection network.

Figure 7:
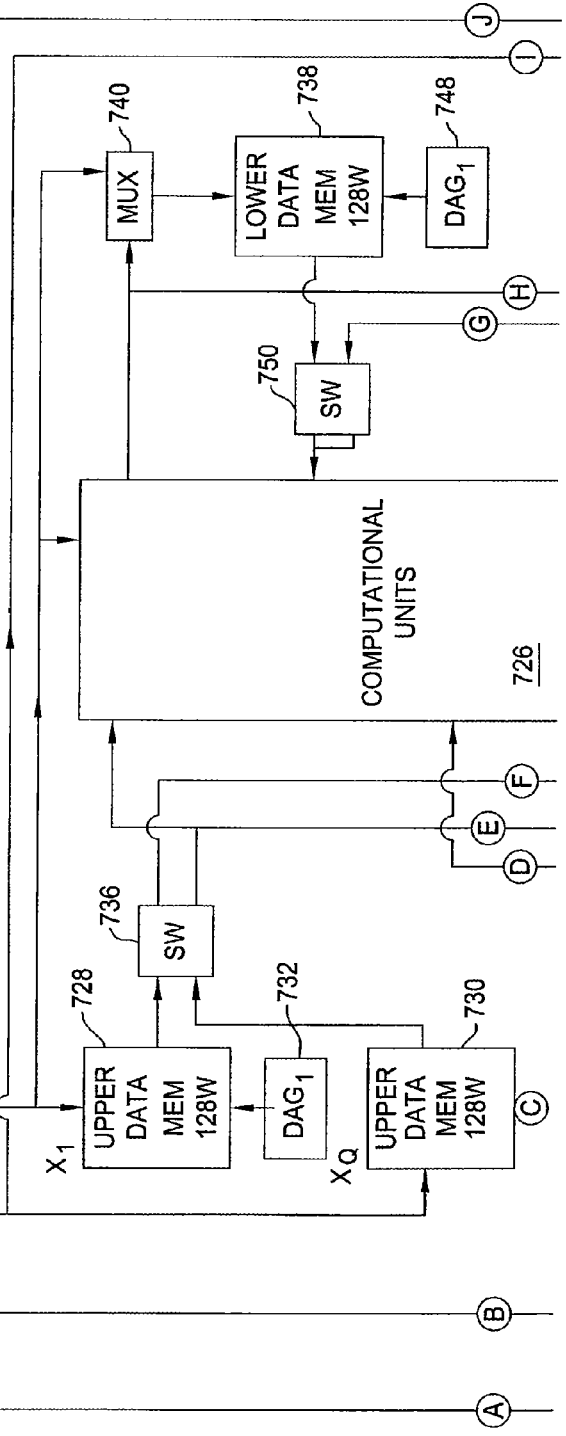
FIG. 7 illustrates a reconfigurable filter node execution unit data path according to an embodiment of the invention.
Figure 7:
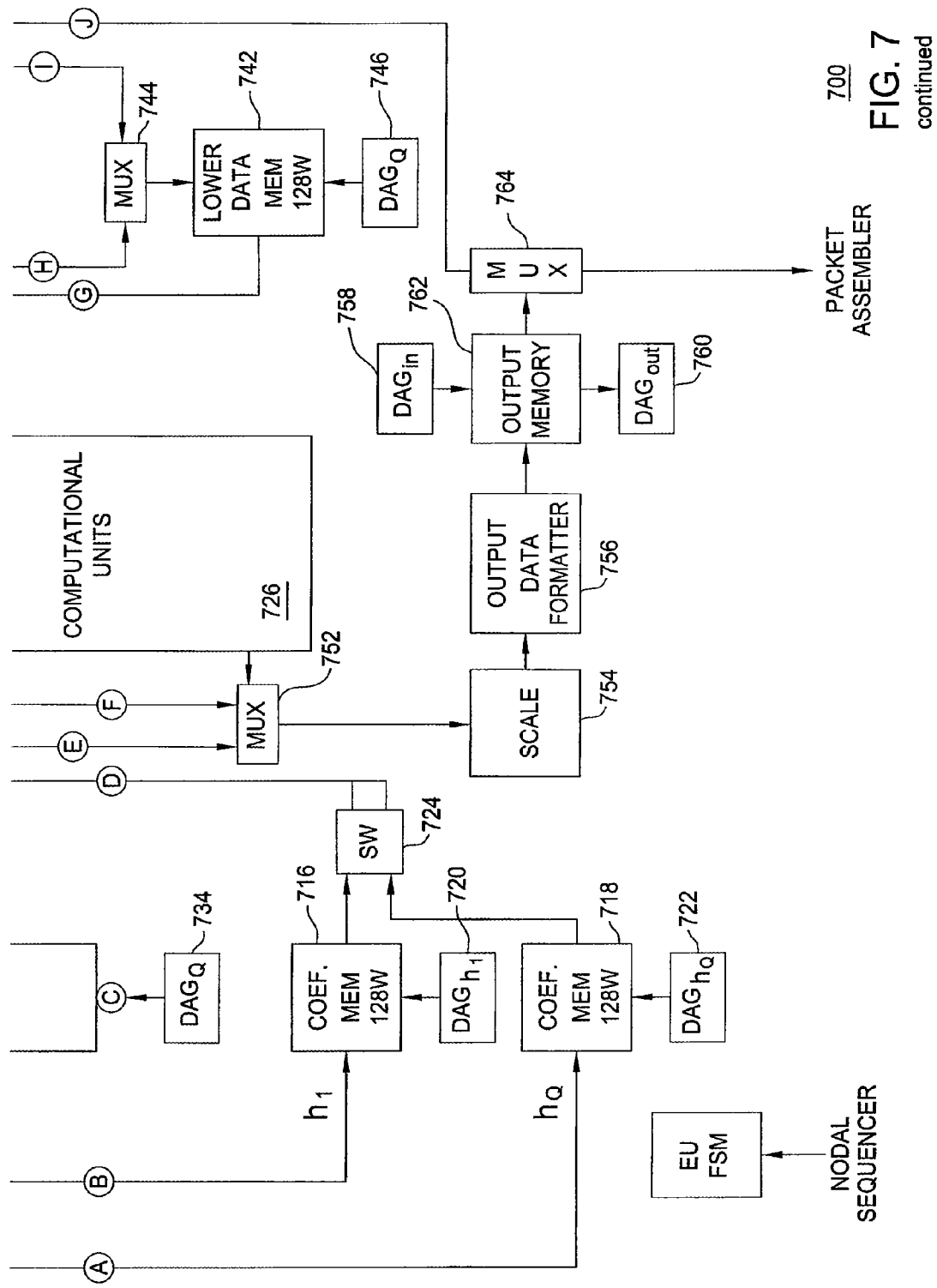

FIG. 7 illustrates an execution unit (EU) data path 700 for a reconfigurable filter node according to an embodiment of the invention. In this embodiment, EU data path 700 includes Y memory unit 702, X data unit 704, M memory unit 706, and I memory unit 708. In this embodiment, each of the above memory units has a capacity of 1024 double words; however, other memory capacities may be used depending on the intended application. In an embodiment, data stored is standardized in 32-bit double-words. Y memory unit is coupled with input data formatter 712. Input data formatter 712 optionally separates each data word into two components. For example, data may be packed as two real 16-bit samples in a 32-bit word, or I and Q data packed into a 16-bit word. This function is useful for applications which require simultaneous filtering of two separate signals, such as the processing of in-phase (I) and quadrature signals. Alternatively, input data from Y memory unit 702 is unmodified by input data formatter 712 where only a single signal is filtered.

I coefficient memory 716 and/or Q coefficient memory 718 are connected with the input data formatter 712. Coefficient memories 716 and 718 store data from Y memory unit 702. Coefficient memories 716 and 718 are further connected with the computational units 726 via switch 724. The data stored in coefficient memories 716 and 718 are used as filter coefficients for filtering data. Filter coefficients are selected by data address generators (DAGs) 720 and 722 and input into computational units 726 as needed. Data address generators 720 and 722 generate memory addresses corresponding to the location of each coefficient to be stored or retrieved from the coefficient memories, thereby selecting the appropriate filter coefficient to be input into computation unit 726. Depending on the filtering algorithm, data can be stored non-sequentially to optimize the performance of the EU data path 700.

X memory unit 704 and M memory unit 706 are alternately connected via multiplexer 710 with input data formatter 714 and further with upper data memories 728 and 730. Similarly to input data formatter 712, input data formatter 714 optionally separates each data word into separate in-phase and quadrature components. Upper data memories 728 and 730 store input signal data to be filtered and/or signal data already partially or completely filtered. Upper data memories 728 and 730 are connected with the computational units 726 via switch 36. Input signal data is selected by data address generators 732 and 734 and input into computational units 726 as needed. Data address generators 732 and 734 generate memory addresses corresponding to the location of the signal data to be stored or retrieved from the upper data memories 728 and 730.

X memory unit 704 and M memory unit 706 are further connected to lower data memories 738 and 742 through multiplexers 744 and 746. Lower data memories 738 and 742 store input signal data to be filtered and/or signal data already partially or completely filtered. Lower data memories 738 and 742 are connected with the computational units 726 via switch 750. Input signal data is selected by data address generators 746 and 748 and input into computational units 726 as needed. Data address generators 746 and 748 generate memory addresses corresponding to the location of the signal data to be stored or retrieved from the lower data memories 738 and 742.

In this embodiment, the coefficient memories 716 and 718, the upper data memories 728 and 730, and the lower data memories 738 and 742 each have a capacity of 128 words. The memory units may be sized according to the needs of the intended application; however, small data and coefficient memories are preferred to reduce power consumption in high-speed operations. Further efficiency is realized through the use of dual ported memories, which allow data to be read and written to a memory simultaneously.

As discussed in detail below, computational units 726 perform a filter convolution of the input signal data using the filter coefficients provided by the coefficient memories 716 and 718. The filter output is sent from computational units 726 through multiplexer 752 to scaling unit 754. Multiplexer 752 alternately selects data from either the filter output from computational units 726 or the data output from upper data memories 728 and 730, which allows signal data already partially or completely filtered to be output from the upper data memories.

Scaling unit 754 scales the value of the filter output as needed and is further connected with the output data formatter 756 for repacking separate I and Q filter outputs into a combined double word-sized value. Formatted filter output data is then stored in output memory 762 at a memory address specified by data address generator 758. Stored filter output data is retrieved from the output memory 762 at the memory address specified by data address generator 760. Like the other memories associated with EU data path 700, output memory 762 can be dual ported to allow simultaneous read and write operations.

Filter output data is alternately directed by multiplexer 764 from output memory 762 to either a packet assembler for forwarding to programmable interconnection network or back to multiplexer 710 for storage within the upper and/or lower data memories. Filter output data can also bypass the scaling unit 754 and be directed by multiplexer 740 to lower data memories for storage. Feedback of filter output data, through multiplexers 764 and/or 740, allows the partially computed filter output to be temporarily stored prior to further processing by computational units 726.

EU data path 700 further includes an execution unit finite state machine 766 that handles low-level, high-speed functions such as computational unit initialization and shifting. A nodal sequencer, such as the sequencer 615 as discussed above, directs the overall node configuration.

Figures 1, 8A:
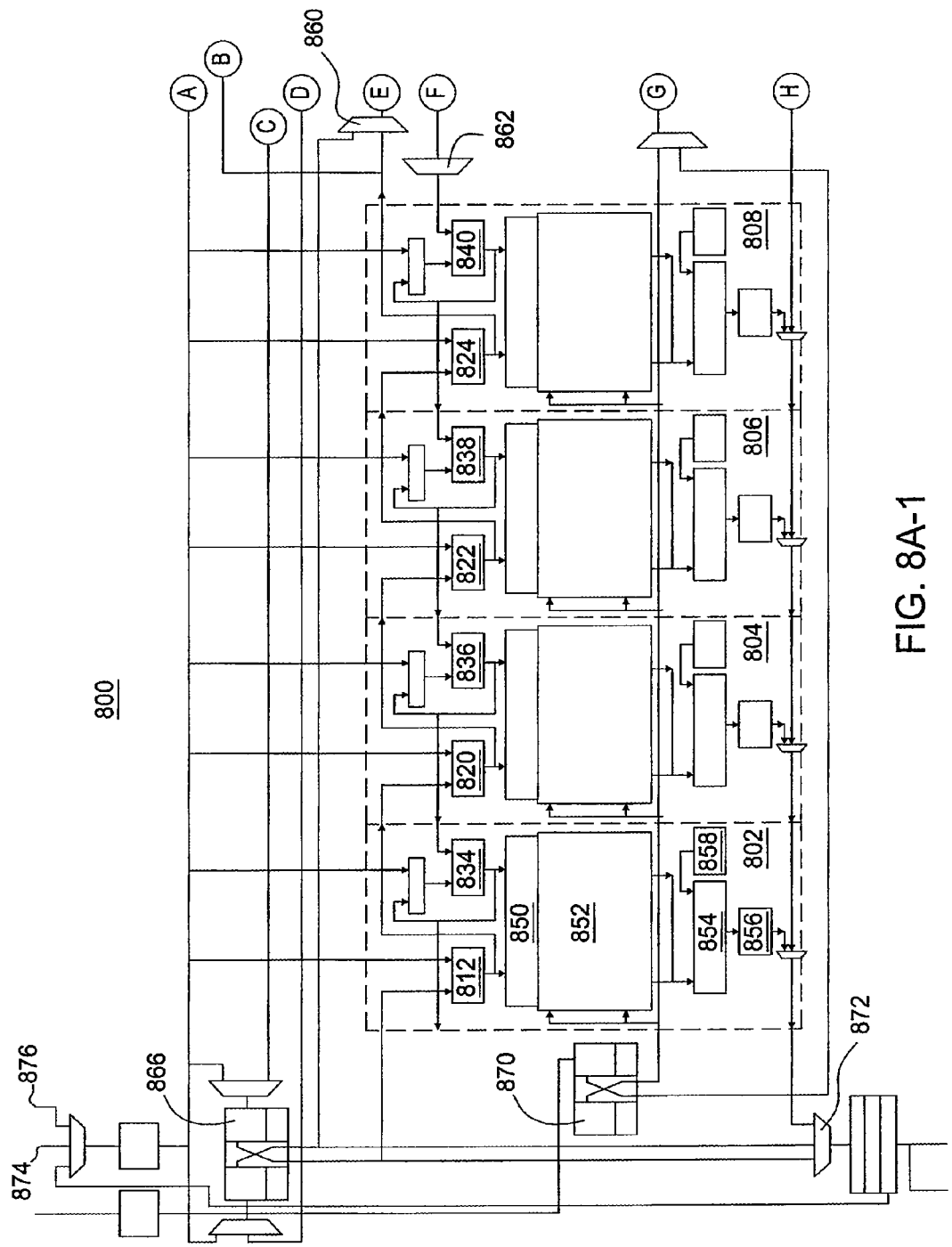
FIG. 8A illustrates a simplified overview of the computational units of a reconfigurable filter node according to an embodiment of the invention.
Figures 2, 8A:
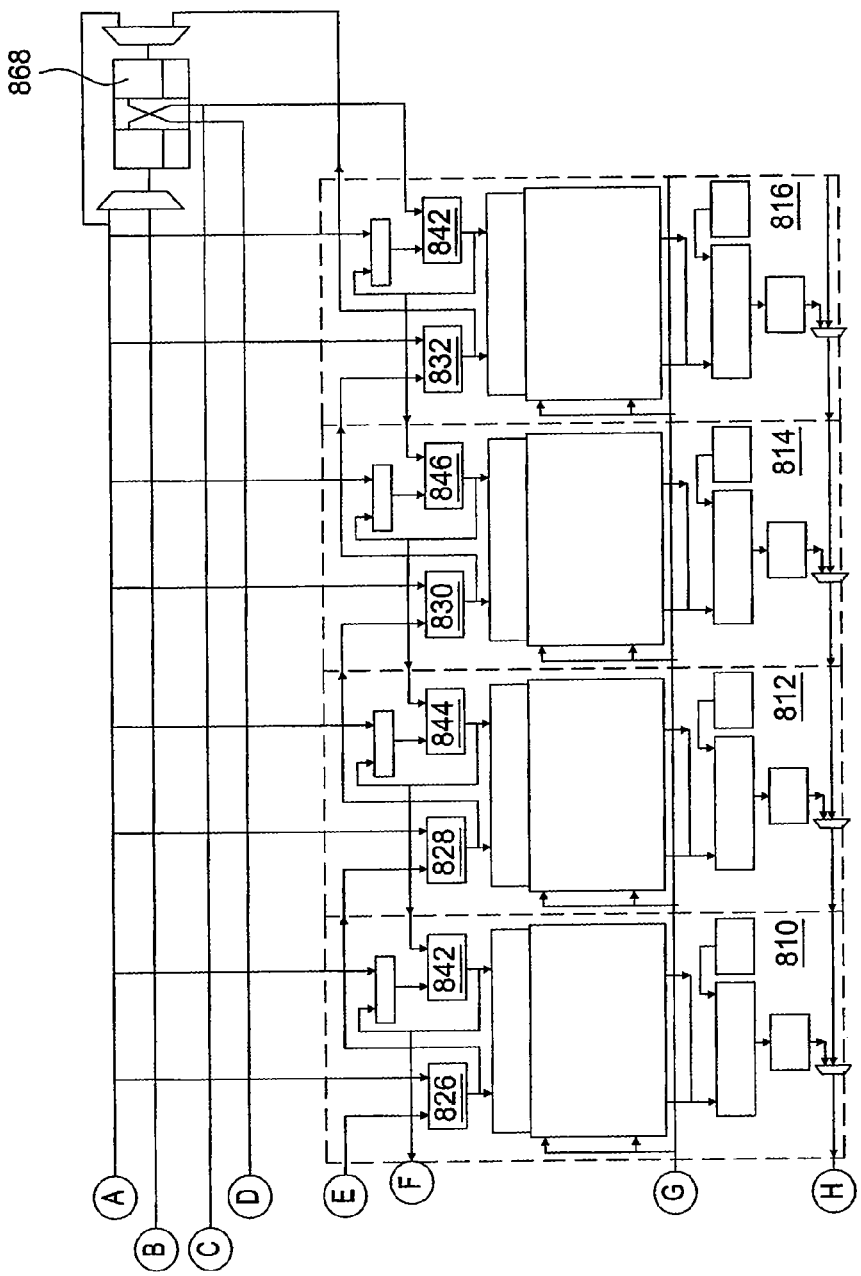
Figures 1, 8B:
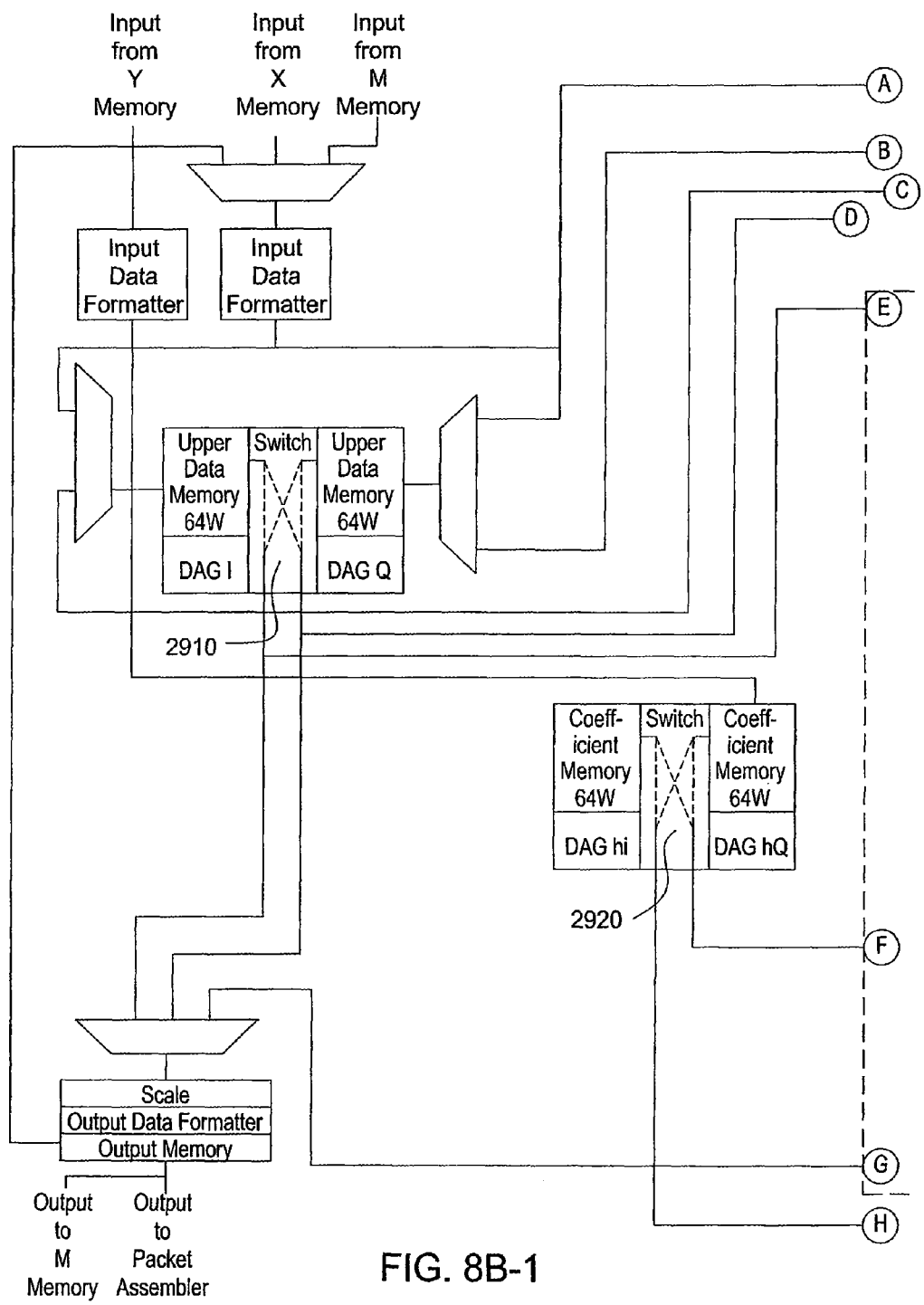
FIG. 8B illustrates a detail section of the computational units of a reconfigurable filter node according to an embodiment of the invention.
Figures 2, 8B:
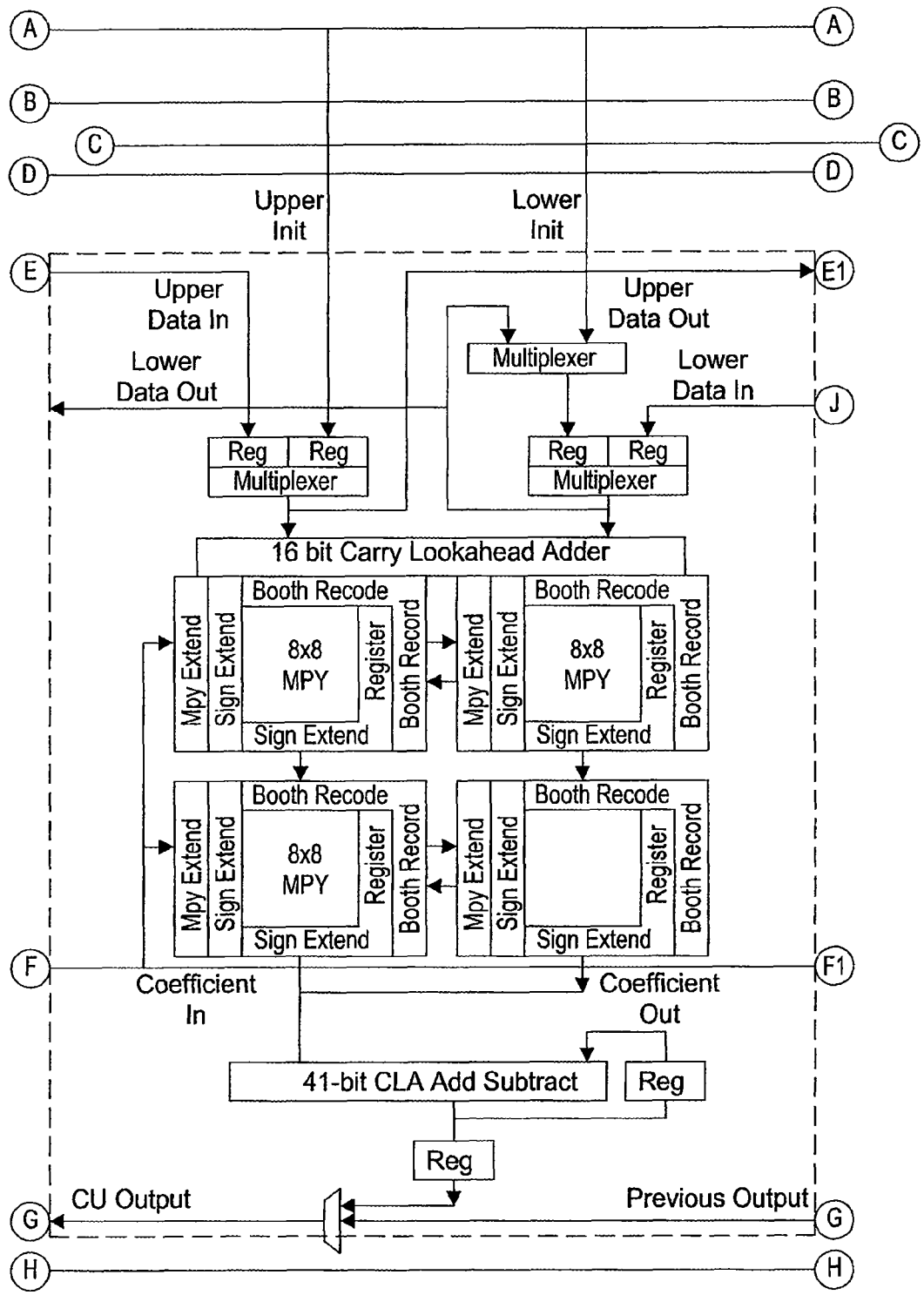
Figures 3, 8B:
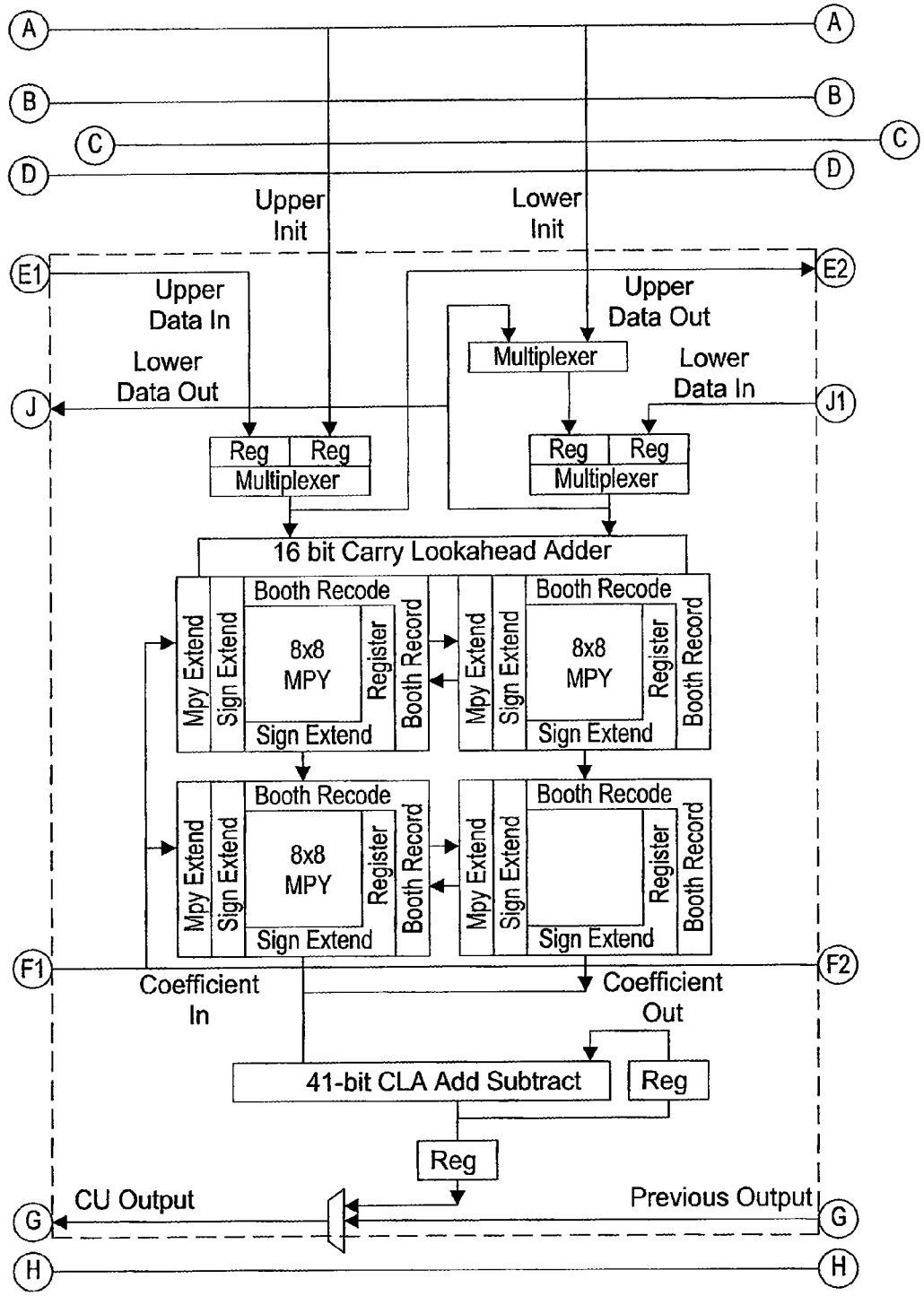
Figures 1, 8C:
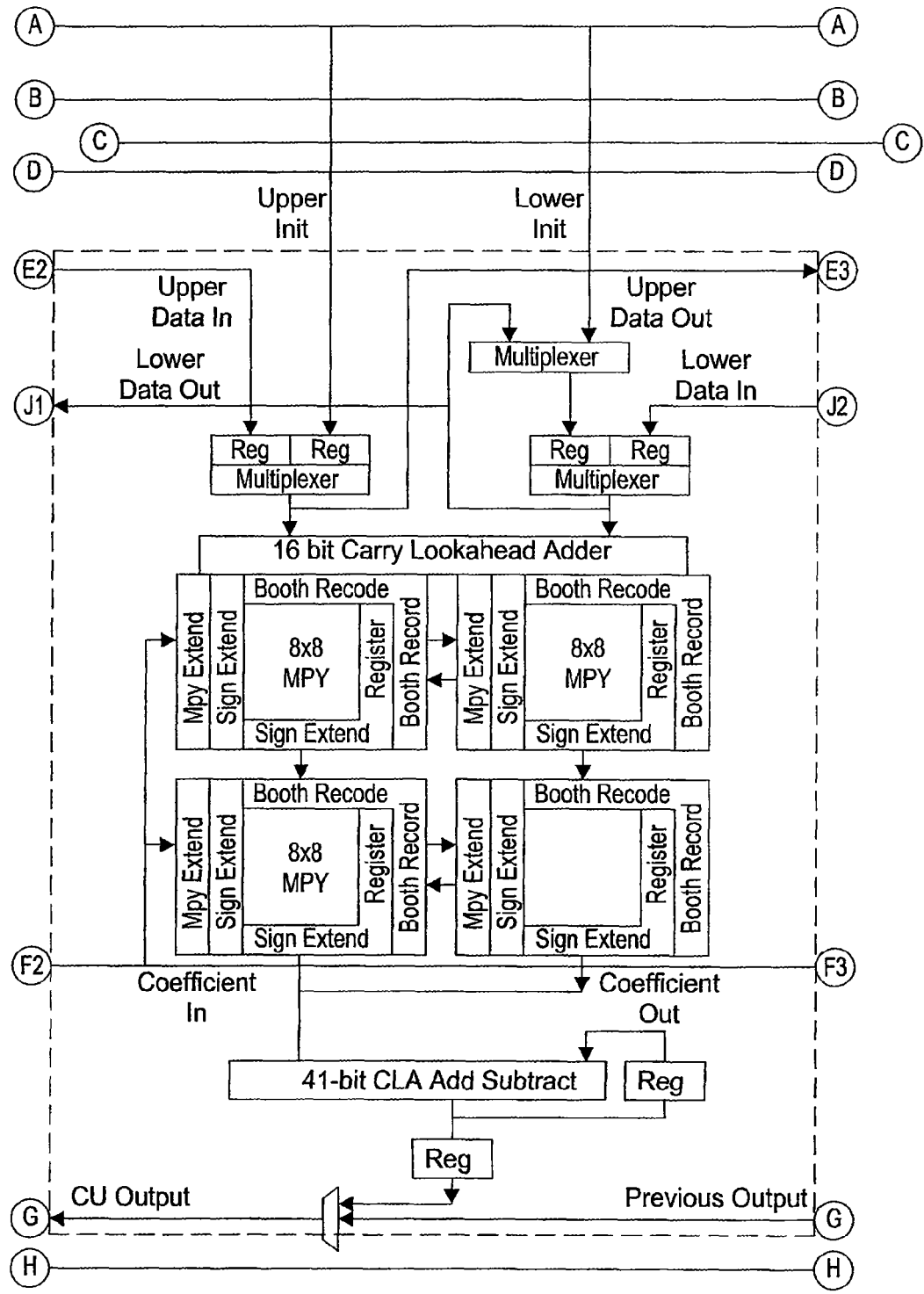
FIG. 8C illustrates a detail section of the computational units of a reconfigurable filter node according to an embodiment of the invention.
Figures 2, 8C:
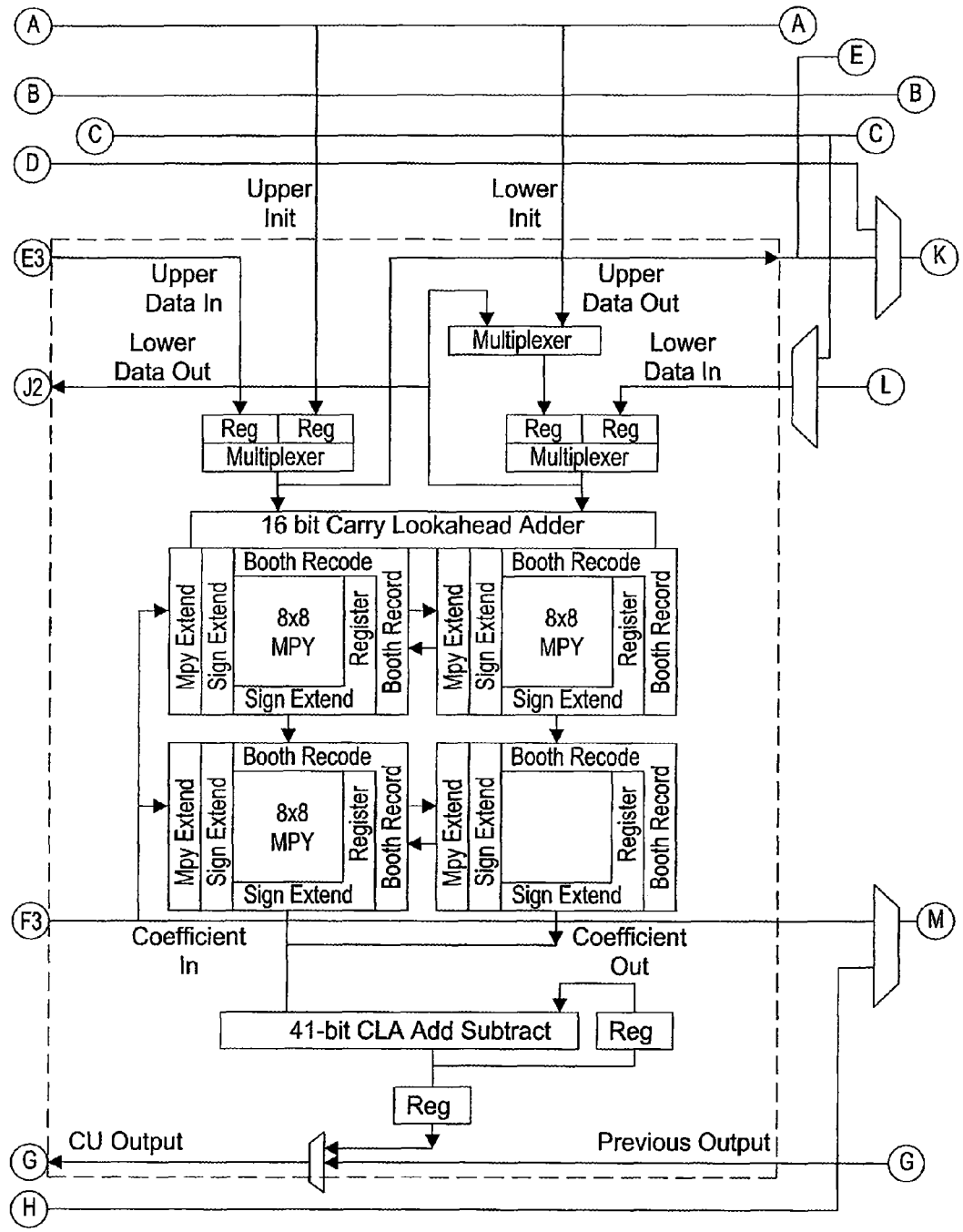
Figures 3, 8C:
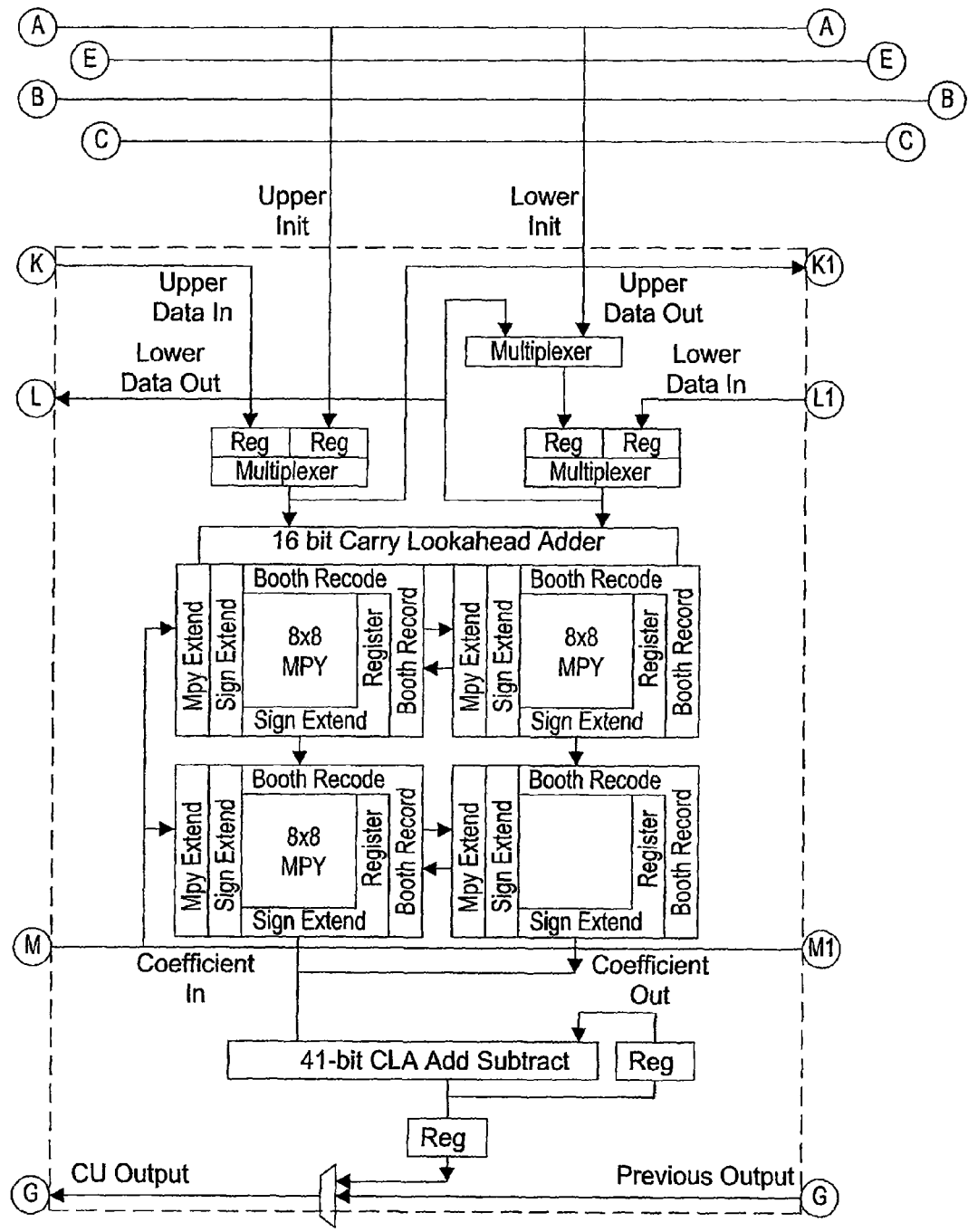
Figures 1, 8D:
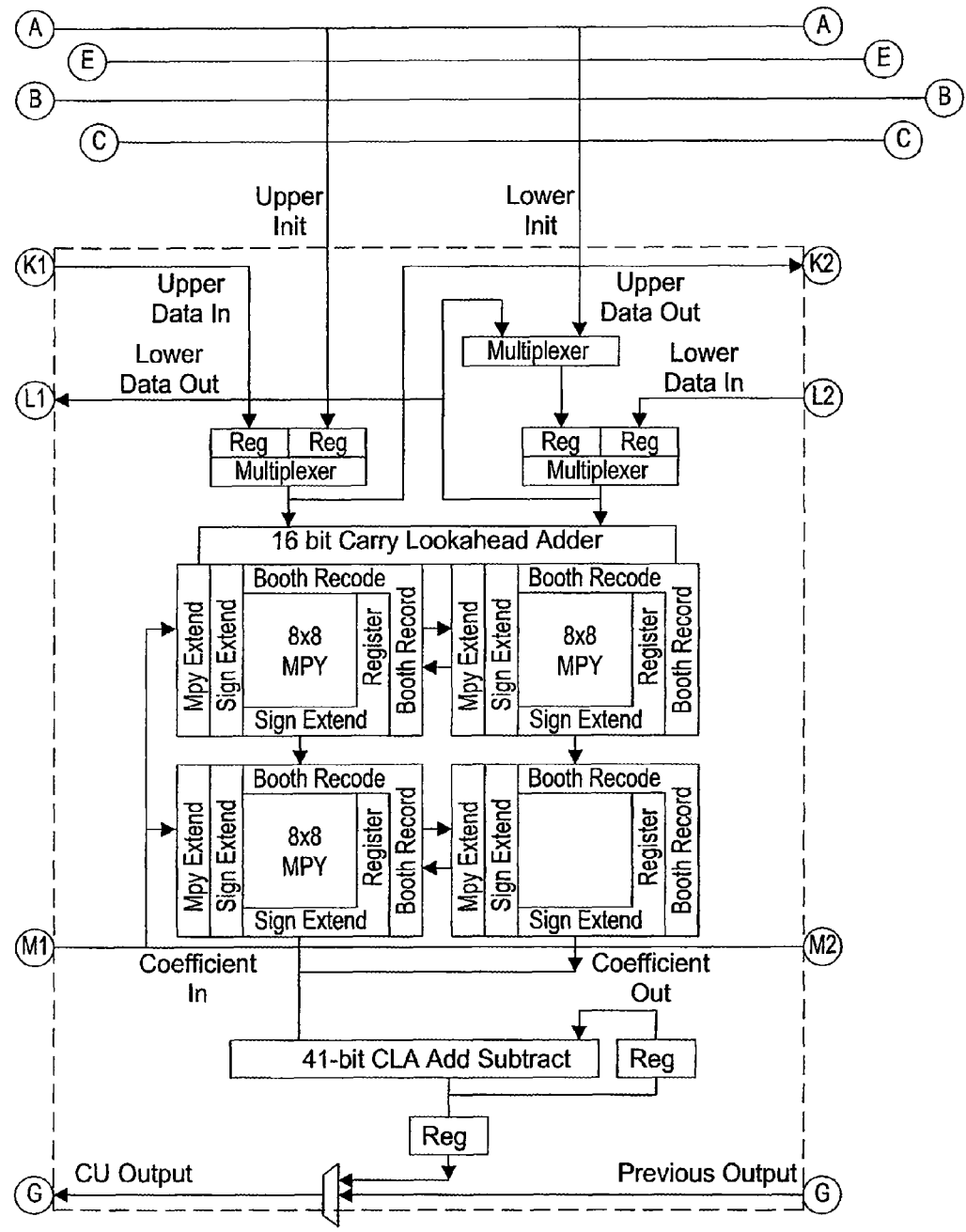
FIG. 8D illustrates a detail section of the computational units of a reconfigurable filter node according to an embodiment of the invention.
Figures 2, 8D:
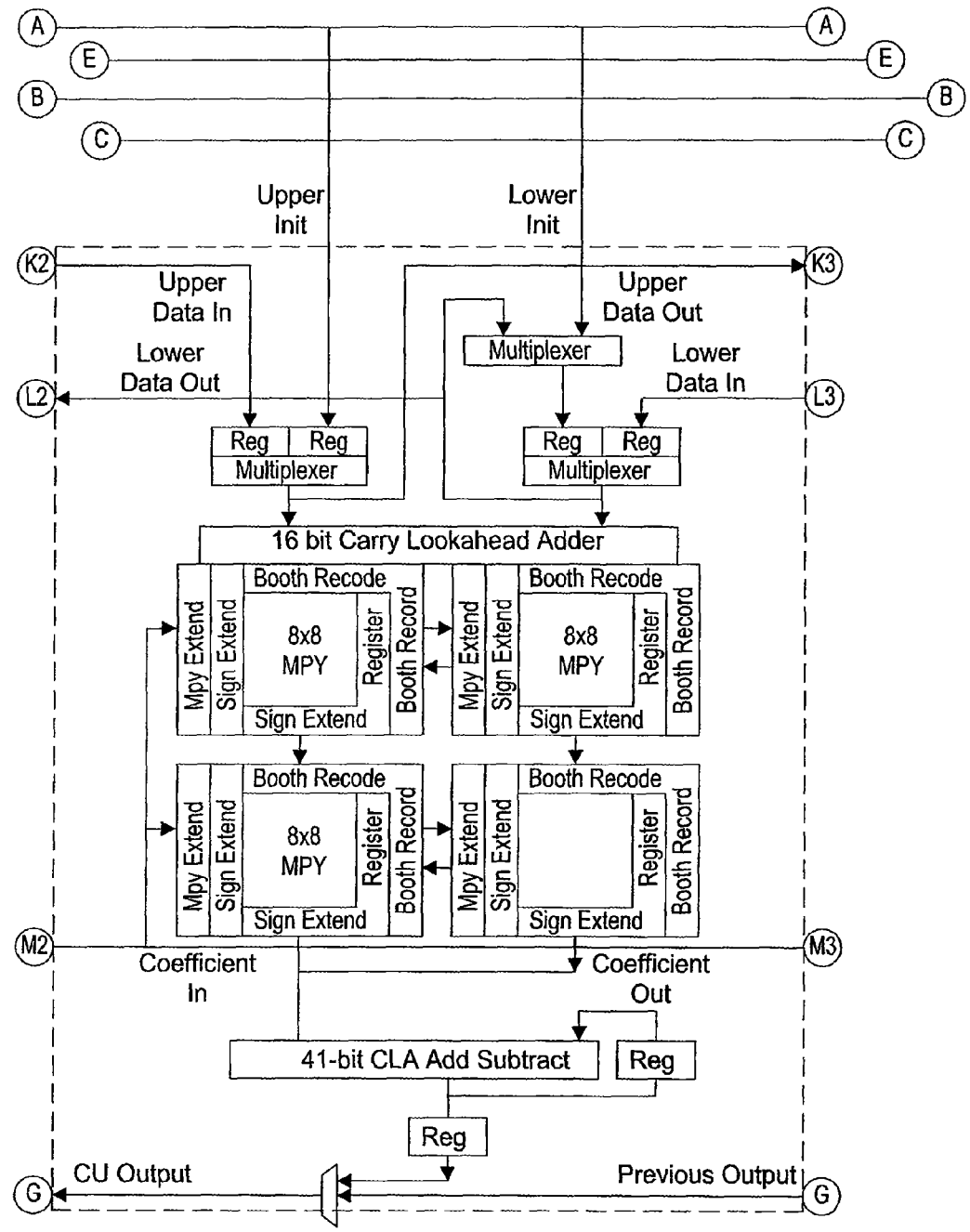
Figures 3, 8D:
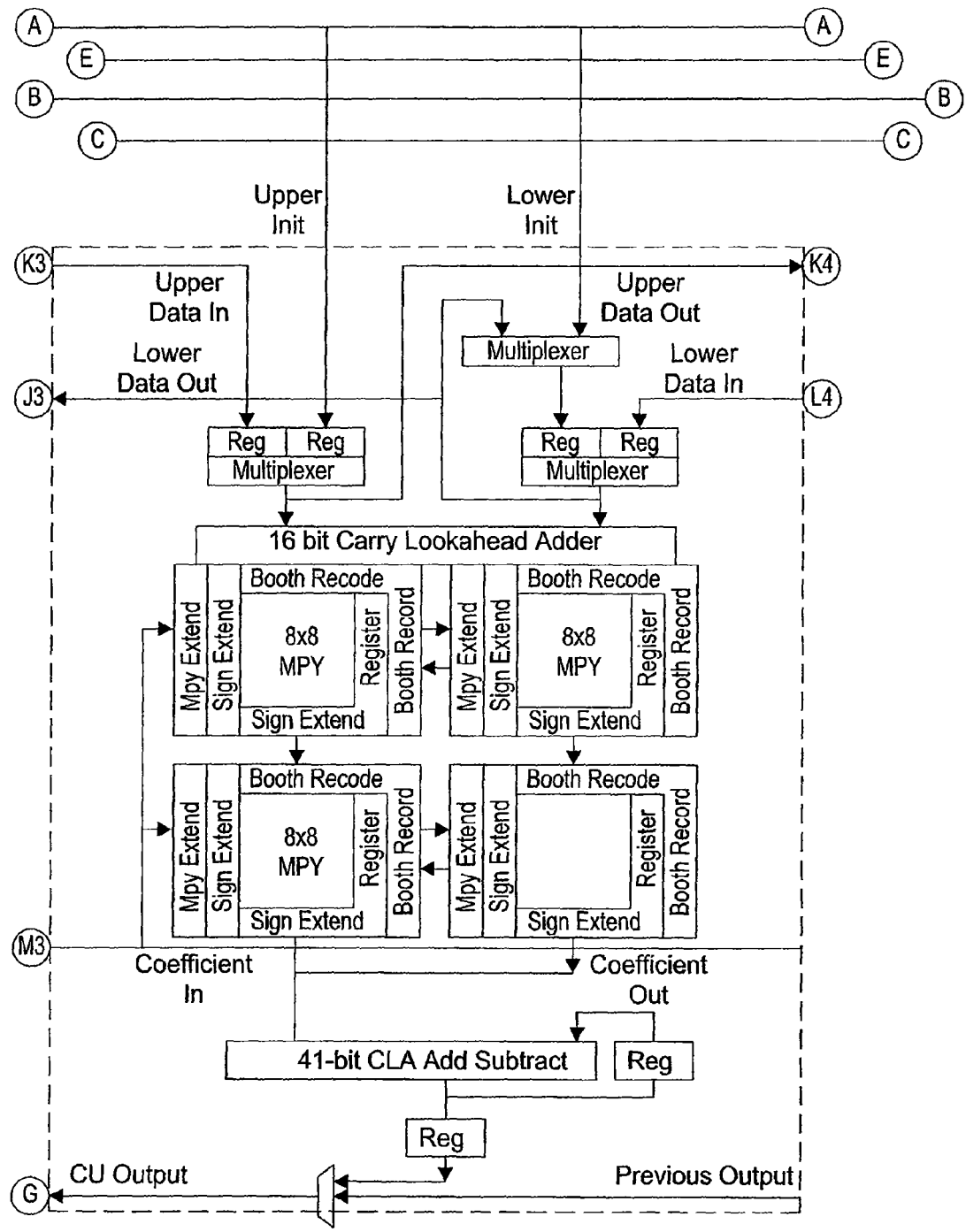
Figures 4, 8D:
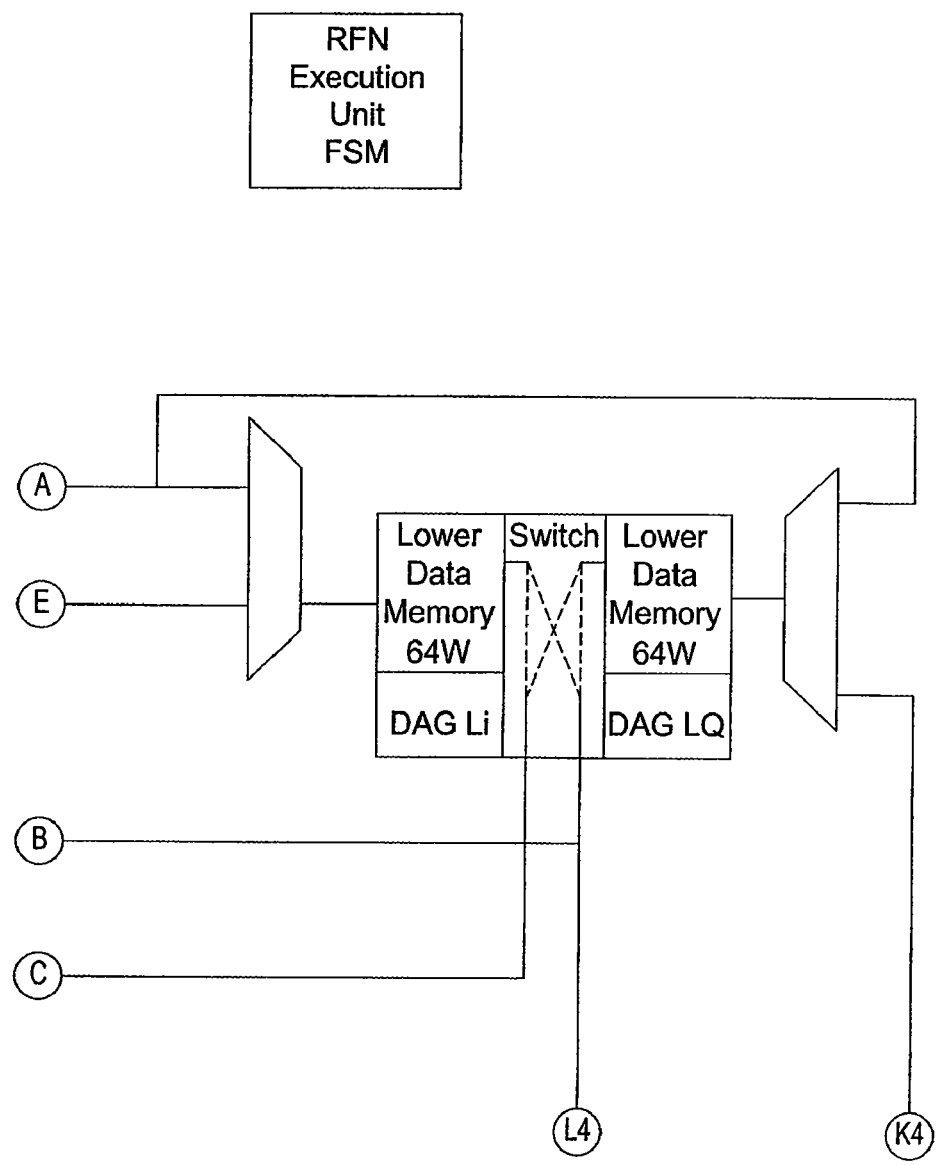

FIG. 8A illustrates a simplified overview of the internal structure of the computational units 800 according to an embodiment of the invention. FIGS. 8B, 8C, and 8D illustrate the computational units 800 in more detail. In this embodiment 800, the computational units are comprised of eight generally identical multiply-and-accumulate (MAC) units 802, 804, 806, 808, 810, 812, 814, and 816. Each MAC unit includes an upper data register, such as registers 818, 820, 822, 824, 826, 828, 830, and 832, and a lower data register, such as registers 834, 836, 838, 840, 842, 844, 846, and 848. The upper and lower data registers are alternately connected with X memory 874 or M memory 876. Data from either of these sources can be selectively loaded into any of the upper or lower data registers.

Additionally, upper and lower data registers can selectively load data from an adjacent upper and lower data registers, respectively. An upper data register can load data from the upper data register to its immediate left, while a lower data register can load data from the lower data register to its immediate right. For example, upper data register 820 can load data from upper data register 818. Similarly, lower data register 846 can load data from lower data register 848. This arrangement allows data to be successively shifted left or right from one MAC unit to another. Upper data register 818 and lower data register 848 are further connected with upper data memory 866 and lower data memory 868, respectively, to allow additional data to be "shifted-in" as data is shifted left or right to adjacent registers. Upper data register 832, being the rightmost upper data register, is further connected with an input to lower data memory 868, allowing data "shifted-out" of this register to be loaded into the lower data memory 868.

Multiplexer 860 is connected with upper data memory 866 and upper data register 824. The output of multiplexer 860 is connected with upper data register 826. Multiplexer 862 is connected with lower data memory 868 and lower data register 842. The output of multiplexer 862 is connected with lower data register 840. Each multiplexer can alternately select data from either an adjacent register or from the upper or lower data memory to be loaded into the destination register. The multiplexers 860 and 862 allow the eight upper data registers and eight lower data registers to be operated as a pair of eight stage delay-lines, or as two pairs of four stage delay lines.

MAC unit 802, which has a similar structure to the other MAC units, includes a first adder 850 for adding the contents of registers 818 and 834. Multiplier 852 then multiplies the output of first adder 850 by a coefficient provided from the coefficient memories 870, the structure of which is discussed above. Add/subtract accumulator 854 adds or subtracts the product from multiplier 852 to a previously computed filter output stored in register 858. Accumulator 854 and register 858 may be used in some configurations to add the values of successive filter taps in an FIR filter. Accumulator 854 and register 858 may be used in other configurations to subtract entries to compute complex cross-terms. The output of accumulator 854 can be loaded into register 858 for use in successive computations. The output of accumulator 854 can also be selectively loaded into output register 856 when a series of computations is complete. Multiplexer 872 alternately selects output data from the contents of output register 856 or from the contents of similar output registers associated with the other MAC units.

A single coefficient from coefficient memories 870 is sent to each MAC unit simultaneously, so that each MAC unit multiplies its respective input data by the same coefficient. Alternatively, multiplexer 864 selects a second coefficient from the coefficient memories 870, so that MAC units 802, 804, 806, and 808 multiply using a first coefficient and MAC units 810, 812, 814, and 816 multiply using a second coefficient. Multiplexer 864, along with multiplexers 860 and 862, allow the computational units 800 to act as a single filter computed with eight MAC units or to act as two separate filters computed with four MAC units each.

A RFN having an execution unit and computational units as disclosed above can implement a wide variety of digital filters. The following discussion illustrates example implementations of a few of these digital filters; however, the present invention is not limited to implementing only these example filters.

Figure 9:
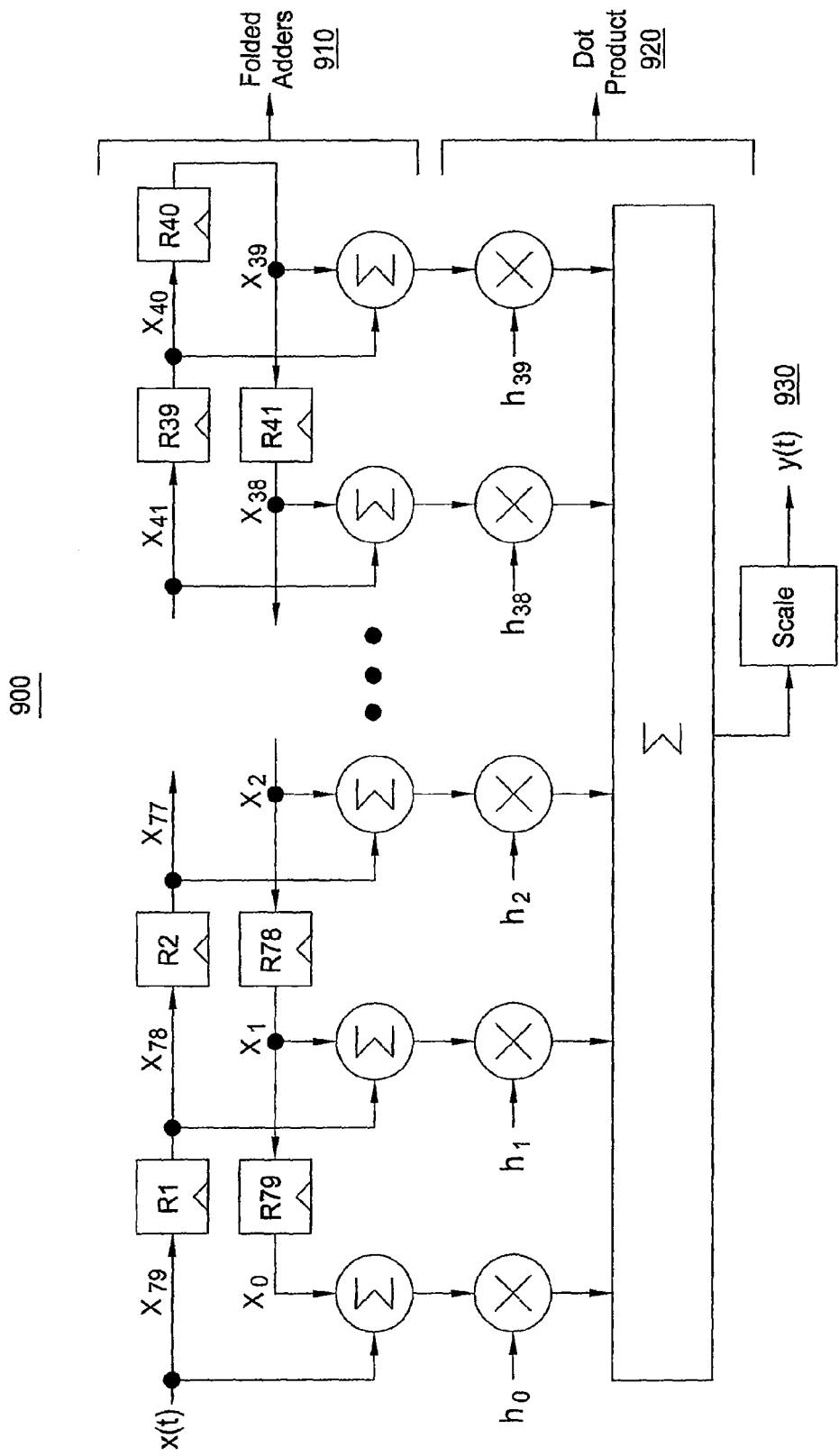
FIG. 9 illustrates a block diagram of a filter that can be implemented by an embodiment of the invention.

FIG. 9 is a block diagram of an 80 tap, real, symmetric filter 900 that can be implemented by the RFN of the present invention. Since the filter 900 is symmetric, the filter coefficients $h_i$, $i=0, 1, \ldots N$, have the property that $h_i=h_{N-i}$. Thus, the number of multiplies can be approximately halved by using folded adders to sum the data that would be multiplied by the same coefficient. In this example 900, the even number of coefficients (80) is reduced to 40 multipliers using folded adders 910. The folded adders 910 sum matching pairs of input data, such as $x_0$ and $x_{79}$, $x_1$ and $x_{78}$, and so forth. The summed inputs are then multiplied by their appropriate filter coefficients and summed by dot product operator 920 to produce a single filter output 930.

Figure 10:
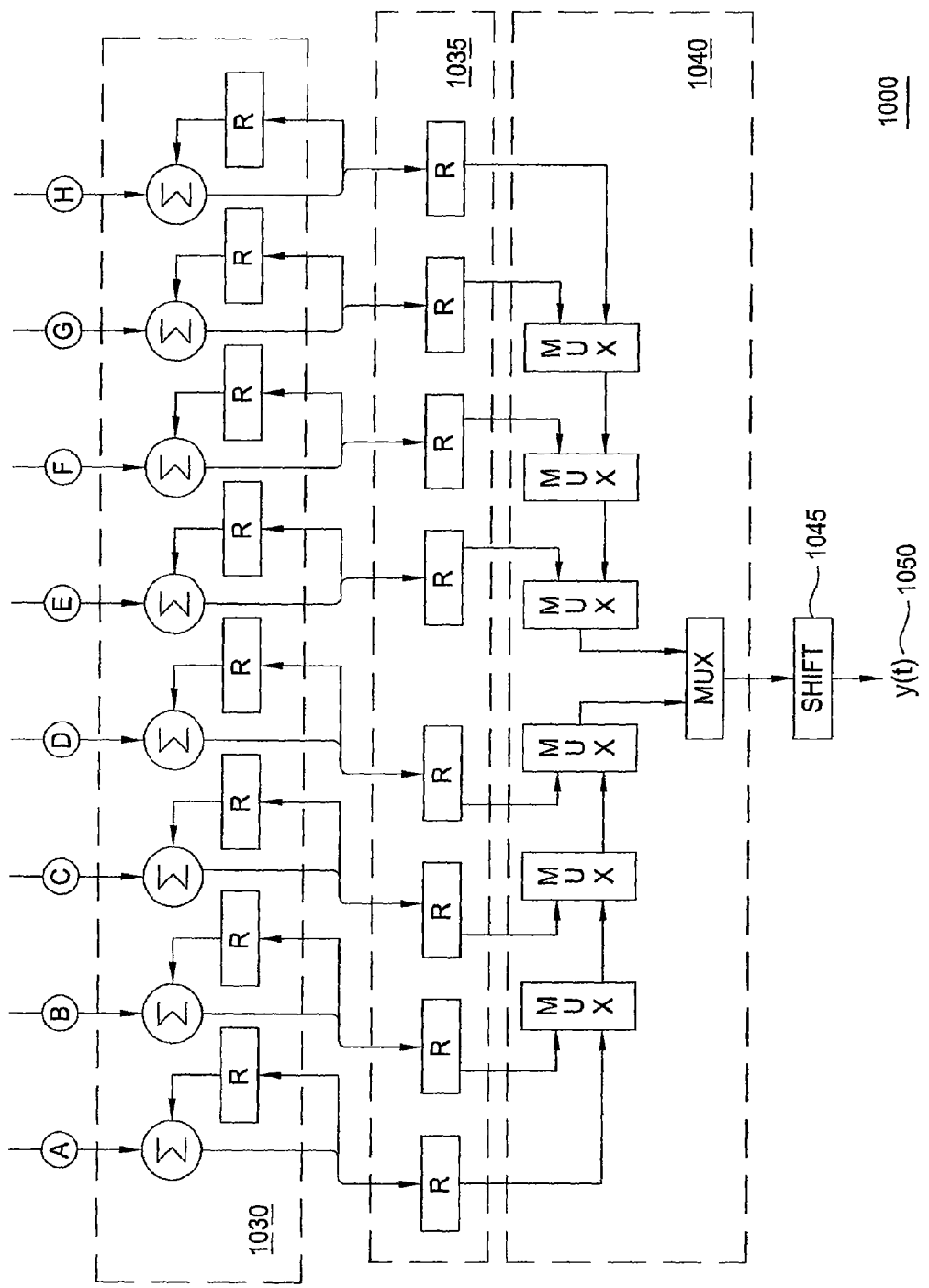
FIG. 10 illustrates the implementation of a filter by an embodiment of the invention.

FIG. 10 is a simplified register level diagram 1000 showing the implementation of filter 900 with the computational units disclosed above. This implementation computes eight filter outputs in parallel. Input data 1005 is connected with upper data memory 1008 and eight upper data registers 1010. Input data is also connected with lower data memory 1012. Eight lower data registers 1015 are connected with lower data memory 1012. The upper data registers 1010 and lower data registers 1015 are configured as eight element delay lines, with data from each register being successively shifted to adjacent registers.

Adder set 1020 comprises eight adders, each adder summing the contents of one upper data register and one lower data register. The summed inputs are then multiplied by the set of eight multipliers 1025 using a coefficient supplied by coefficient memory 1022. The resulting eight products are separately accumulated using the set of eight accumulators 1030. This process is repeated for each of the 40 filter coefficients. When the complete filter output has been computed, the output from each of the eight accumulators is stored in the set of eight output registers 1035. Multiplexers 1040 selectively output the contents of each of the eight output registers 1040 as successive filter outputs while the computational units compute the next eight filter outputs. The output is scaled by shift registers 1045 to give the final filter output 1050.

Figure 11:
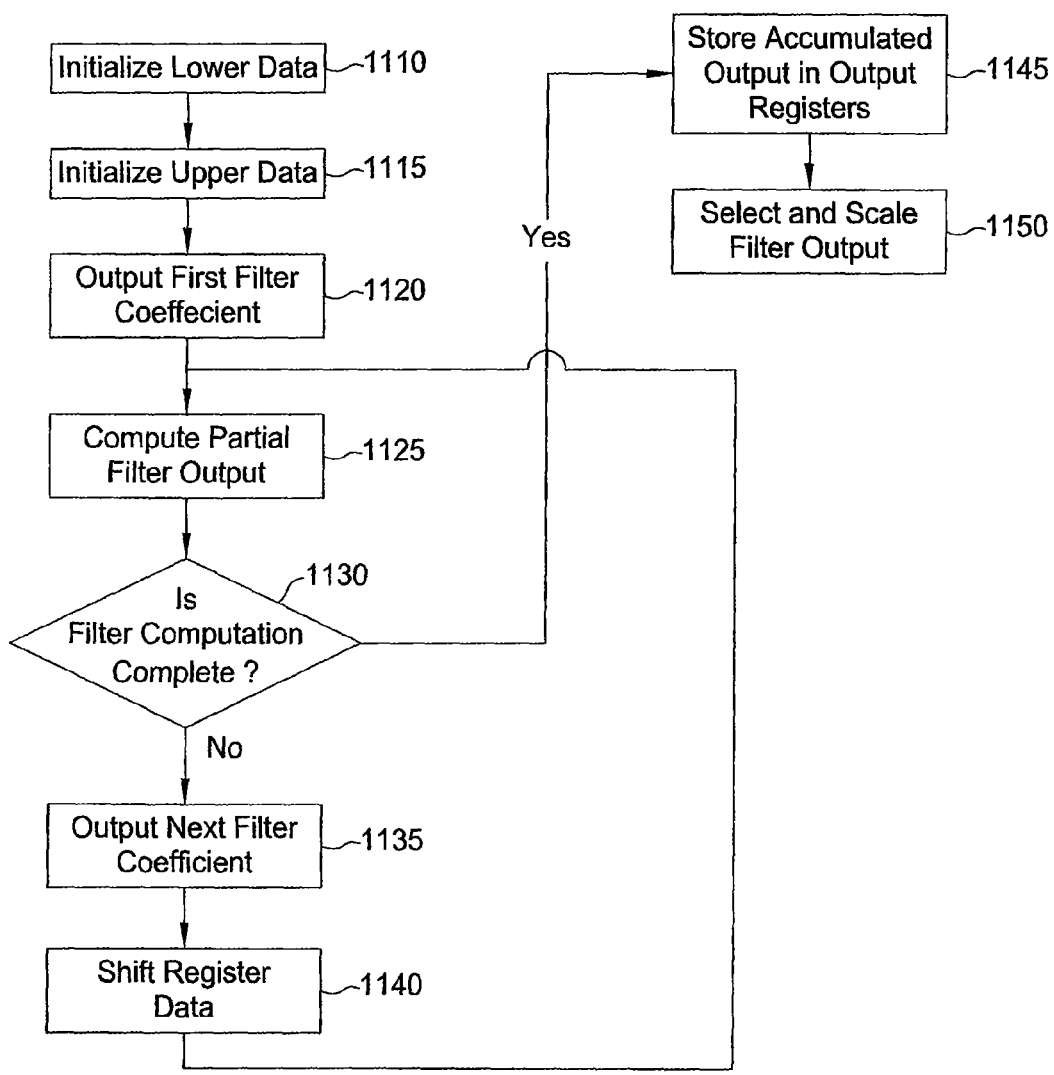
FIG. 11 illustrates a flow chart of the sequence of steps implementing a filter by an embodiment of the invention.
Figure 12:
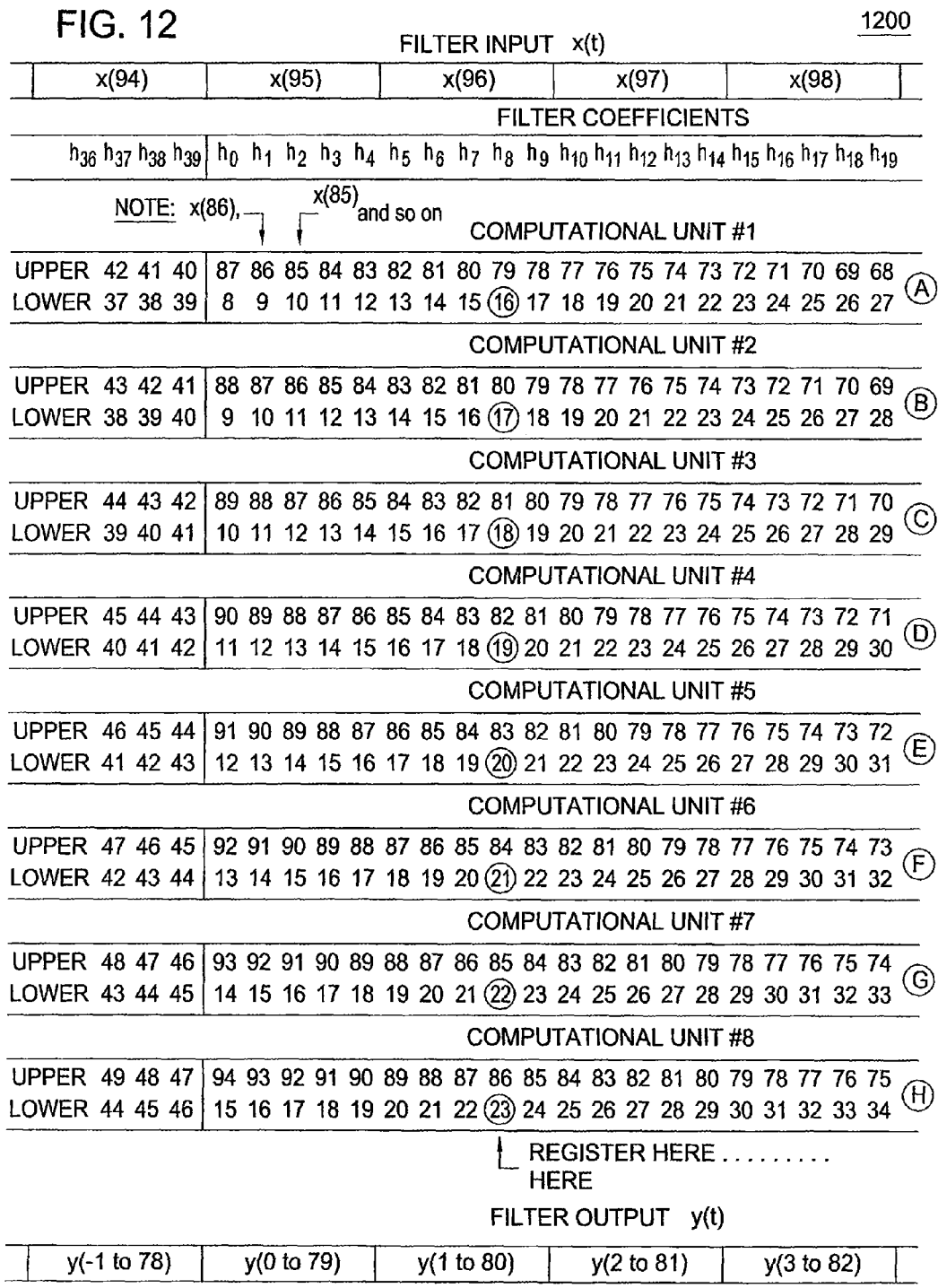
FIG. 12 illustrates an example timing diagram showing the flow of data during the implementation of a filter by an embodiment of the invention.

FIG. 11 is a flow chart 1100 detailing the sequence of steps performed by the computational units in implementing filter 900. FIG. 12 is a timing diagram showing an example of the progression of input and output data during execution of this sequence of steps. At step 1110, the lower data memory 1012 and lower data registers 1015 are loaded with the 47 oldest input data values from the last 94 input values stored in the node's X memory. The eight oldest input data values are loaded into the lower data registers 1015. In the example of FIG. 12, if computation begins at the eighth data point, the initializing values for the lower data registers 1015 are $X_8 \ldots X_{15}$, with $X_8$ loaded into the lower data register associated with the leftmost computation unit (CU#0) and $X_{15}$ loaded into the lower data register associated with the rightmost computation unit (CU#7). The remaining 39 input data values, $X_{16} \ldots X_{54}$, are loaded into the lower data memory 1012.

Step 1115 loads the upper data memory 1008 and upper data registers 1010 with the newest 47 input data values from the node's X memory. Continuing with the above example, the eight data values $X_{87}$ $X_{94}$ are loaded into the 8 upper data registers 1010, with $X_{87}$ loaded into the upper data register associated with CU #0, the left-most computation unit, and $X_{94}$ loaded into the upper data register associated with CU #7, the right-most computational unit. The remaining 39 input data values, $X_{48} \ldots X_{86}$, are read from X memory into the upper data memory 1008.

At Step 1120, as the filter computation begins, the coefficient memory 1022 outputs the first filter coefficient, $h_0$, to all eight multipliers 1025 simultaneously. The partial filter output is computed by each computation unit at Step 1125 by summing each pair of upper and lower data registers with adders 1020, multiplying each sum by the filter coefficient using multipliers 1025, and accumulating the result in accumulators 1030. In the above example, CU #0 first computes $Y_{8,87}=(X_8+X_{87})*h_0$ while CU#7 computes $Y_{15,94}=(X_{15}+X_{94})*h_0$.

If the filter computation is complete, which is determined in Step 1130 by the use of the last filter coefficient, the accumulated outputs are stored in output registers 1035 at step 1145. Otherwise, the coefficient memory 1022 outputs the next filter coefficient, for example h1, to all eight multipliers 1025 simultaneously at Step 1135.

In Step 1140, the data values from the upper data registers 1010 are shifted to the register to the right, and the data values from the lower data registers 1015 are shifted to register to the left. New data is read from the upper and lower memories (1008 and 1012) and shifted into the left-most upper and right-most lower data registers. In this example, upper data memory 1008 successively outputs the 39 values $X_{86} \ldots X_{48}$ to the left-most upper data register and the lower data memory 1012 successively outputs the 39 values $X_{16} \ldots X_{54}$ to the right-most lower data register.

Following the shifting of register data at Step 1140, the computation of Step 1125 is repeated. The output of each computational unit is added to the previously computed output and stored in accumulators 1030. Steps 1125-1140 are repeated using each filter coefficient in succession until the filter computation is complete, as discussed above. In the above example, these steps are repeated for all 40 filter coefficients, so that CU #0 finishes the filter computation by computing $Y_{47,48}=(X_{47}+X_{48})*h_{39}$ and CU #7 computes $Y_{54,55}=(X_{54}+X_{55})*h_{39}$.

As discussed above, the eight completed filter outputs values are transferred to output registers in Step 1145. The timing diagram of FIG. 12 shows that the eight computational units have computed eight successive filter outputs in parallel. In Step 1150, these eight filter outputs are sequentially output using multiplexers 1040, and scaled with shift register 1045.

While Step 1150 outputs the filtered data values, the computational units can begin computation of the next eight filter outputs immediately. As shown in the example of FIG. 12, each filtered data value is output over a five clock cycle duration, so that all eight filtered data values are output over a 40 clock cycle period. At this point, the next batch of eight filtered data values is ready for output. The computation proceeds as discussed above, with the upper data registers initialized with eight new starting values from the X memory, $X_{95} \ldots X_{102}$. The eight new starting values can be loaded into the right side partition of each upper data register during processing of the previous set of data values with the left side registers. Similarly, starting values for the lower registers, $X_{16} \ldots X_{23}$, can be captured in the left side registers of the lower data registers during the computation of the previous set of filter outputs. Further, the lower memory loads eight new values, $X_{55} \ldots X_{62}$, from the upper memory as they are processed with the previous set of filter outputs.

Figure 13:
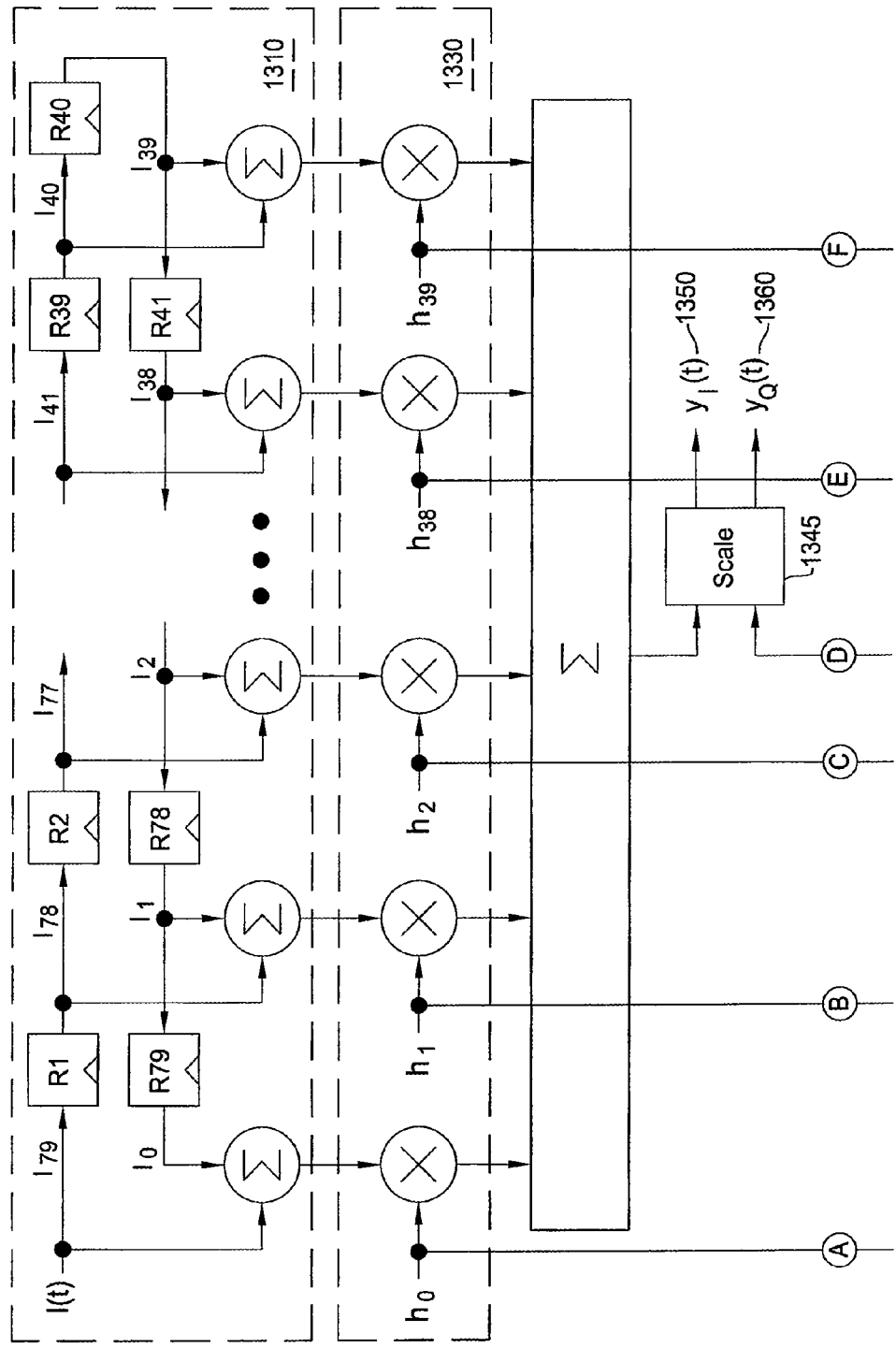
FIG. 13 illustrates a block diagram of a filter that can be implemented by an embodiment of the invention.
Figure 13:
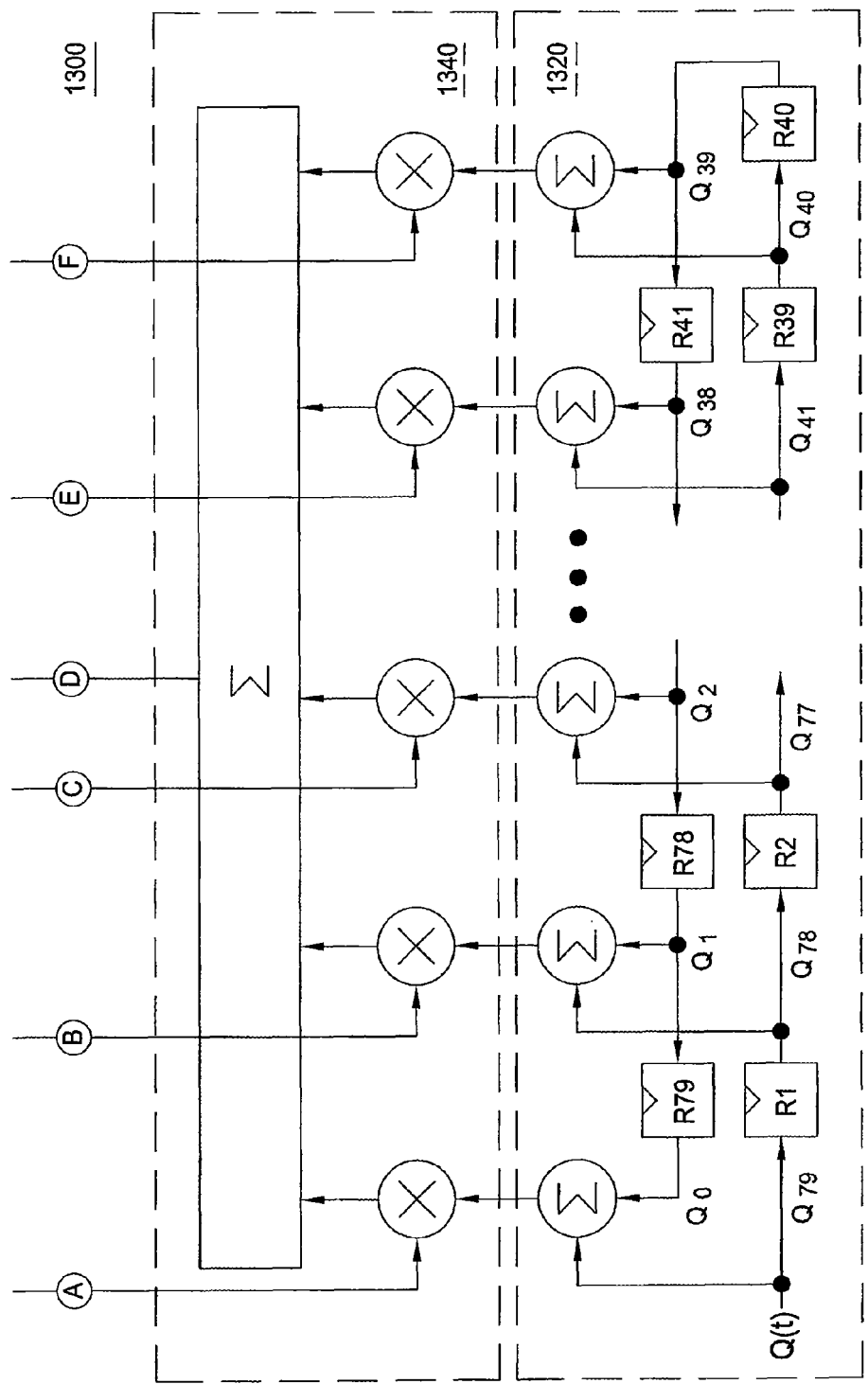

FIG. 13 shows a block diagram of an example half-complex, single-rate filter 1300 that can be implemented by the RFN of the present invention. A half-complex filter applies the same set of real filter coefficients to the in-phase (I) and quadrature (Q) components of a complex-valued input. Unlike fully complex filters, there are no cross-terms associated with a half-complex filter. An example application of a half-complex filter is a root-raised-cosine (RRC) filter operating on complex data produced by mixing a real signal with a complex local oscillator.

Half-complex filter 1300 is comprised of two separate folded adders, 1310 and 1320, receiving I and Q input data, respectively. The folded adders 1310 and 1320 sum corresponding pairs of I and Q input data. A pair of dot product operators 1330 and 1340 multiply the summed pairs of input data at each filter tap by the appropriate filter coefficient and accumulate the results. The summed I and Q filter taps are scaled by scaling unit 1345 to yield I filter output 1350 and Q filter output 1360.

Figure 14:
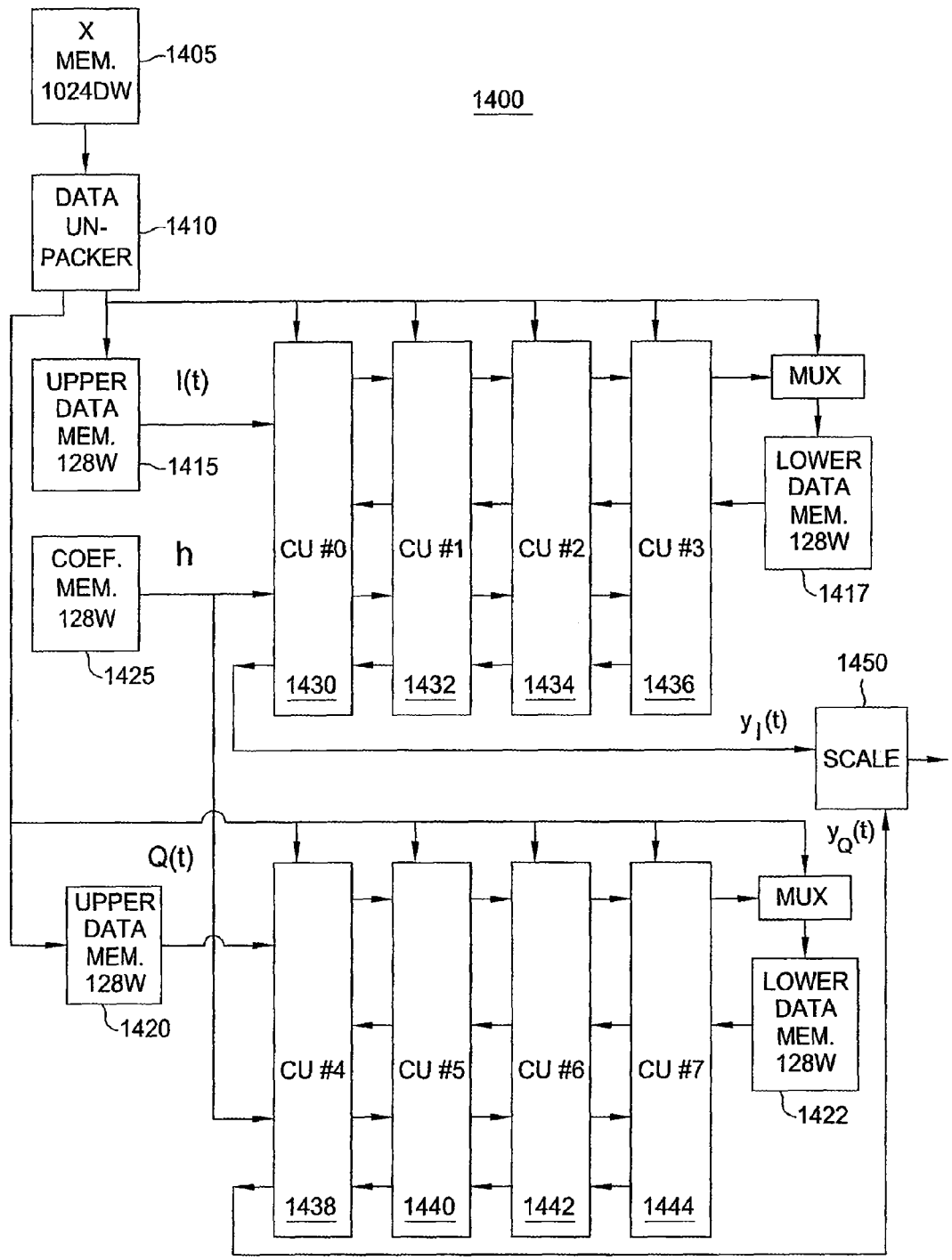
FIG. 14 illustrates the implementation of a filter by an embodiment of the invention.

FIG. 14 shows the simplified configuration 1400 of the above-described RFN to implement half-complex filter 1300. In this configuration, packed input data stored in X memory 1405 is unpacked and selectively loaded in upper data memories 1415 and 1420 and lower data memories 1417 and 1422. I input data is loaded into memories 1415 and 1417, while Q input data is loaded into memories 1420 and 1422. Similar to the implementation of filter 900 discussed above, the upper and lower data memories feed input data to the computational units. Unlike the implementation of filter 900, the implementation of filter 1300 configures the computational units to act as two separate delay lines of four delays each, rather than a single eight unit delay line. As discussed above, multiplexers 860 and 862 are used to configure the computational units in this manner.

Memories 1415 and 1417 send I input data in opposite directions along the four element delay line formed by computational units 1430, 1432, 1434, and 1436. Similarly, memories 1420 and 1422 send Q input data in opposite directions along the four element delay line formed by computational units 1438, 1440, 1442, and 1444. Each computational unit sums the corresponding pairs of input data, multiplies this sum by the filter coefficient simultaneously provided by memory 1425, and accumulates the result. This process is repeated for all 40 filter coefficients, with the appropriate input data values shifted to adjacent computational units in a manner similar to the computation of filter 900, except using only four computational units for each set of input data, rather than eight.

Once a set of I and Q input data has been processed, the I and Q filter values are loaded into output registers and sequentially sent to scaling unit 1450 for output. In this implementation, the computational units compute in parallel four sequential I filter outputs and four corresponding sequential Q filters outputs. In a further embodiment, the scaled 16 bit I and Q filter outputs are repacked into a 32 bit double word.

Interpolation by two and by eight are used in W-CDMA applications to increase the sample rate. The first step in interpolation by eight is to increase the data rate by inserting seven zeros between successive input samples, x(t). Zero insertion replicates the input signal spectrum at higher-order frequencies. To avoid aliasing, an interpolation filter removes the high-order spectral replicates. In doing so, it automatically interpolates the original signal by a factor of eight. To avoid wasteful multiplication by zero-valued input data, a polyphase filter may used.

Figure 15:
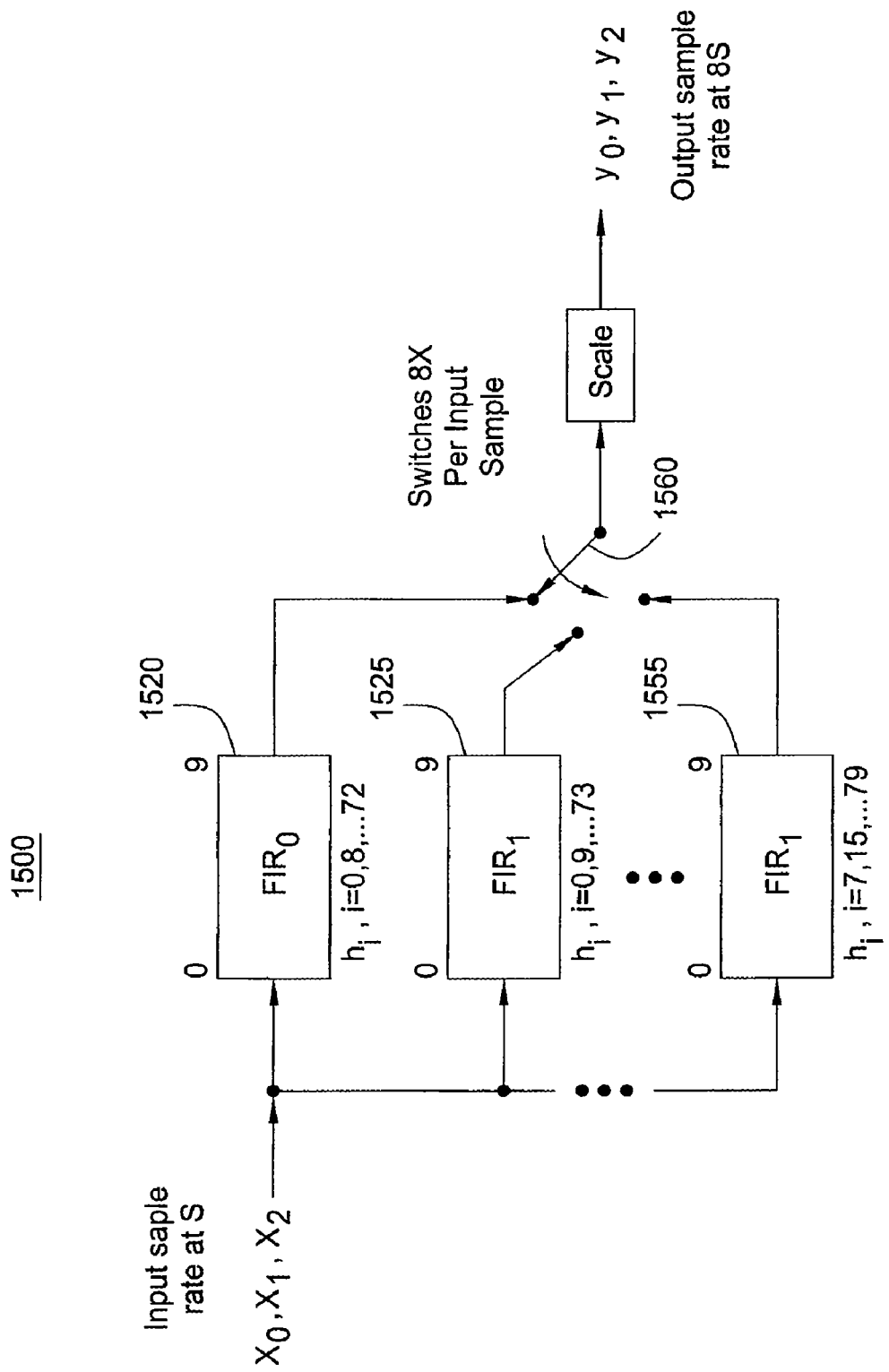
FIG. 15 illustrates a block diagram of a filter that can be implemented by an embodiment of the invention.

FIG. 15 shows a block diagram 1500 of a polyphase 8 times interpolation filter. To avoid multiplication by zero in the interpolation by eight, the filtering operation is split into eight sub-filters, such as sub-filters 1520, 1525, and 1555. The other five sub-filters are omitted from FIG. 15 for clarity. Each sub-filter uses alternate sets of every eighth coefficient to produce every eighth filter output. Switch 1560 selects each of the eight sub-filter outputs for every input data value to give the interpolated filter output. Because there is no zero insertion, every right data shift of the sub-filters corresponds to eight shifts of the interpolated output.

Figure 16:
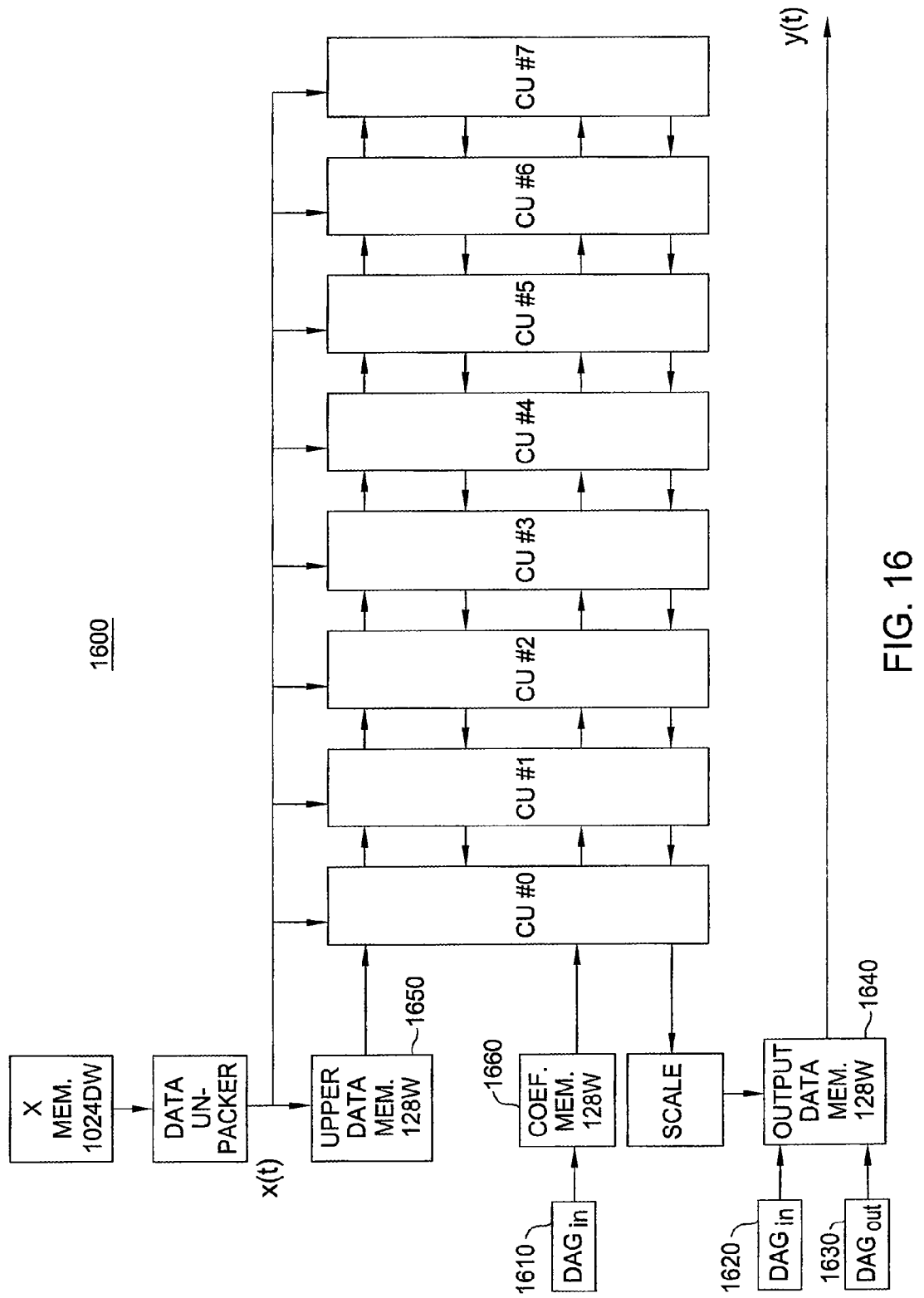
FIG. 16 illustrates the implementation of a filter by an embodiment of the invention.

FIG. 16 shows the simplified configuration 1600 of the above-described RFN to implement the interpolation by eight filter 1500. This configuration resembles the configuration used for the single-rate real, symmetric filter 900, but differs significantly in the addressing of data and coefficients and sequencing of the output. Unlike the single-rate filter 900, the eight sub-filters of filter 1500 use the same input data but require different filter coefficients.

To maximize the utilization of the eight computational units, the computational units in this configuration are used in a dataflow manner to compute eight successive sub-filter outputs from a single sub-filter before processing the next sub-filter. Each of the eight computational units computes a separate output point of the first sub-filter. After all of the input data has been processed with the first sub-filter's coefficients, the coefficients are changed to the next sub-filter and each computational unit computes the next eight interleaved output points of the second-sub-filter. This process continues until eight successive outputs of each of the eight sub-filters are computed.

The computation of each set of eight sub-filter outputs is just like that in the single rate filter 900, with each computational unit producing a successive filter output. Here, however, the successive filter outputs represent every eighth filter output, rather than eight sequential filter outputs. The upper data memory 1650 is initialized with N/8+6 data values before the first computation, where N is the underlying zero-padded filter length and N/8 is the length of each of eight sub-filters. Then the newest eight data points are loaded from X-Memory into the initialization registers in the upper row of registers associated with the computational units, while simultaneously one of these, the newest data value, is loaded into the Upper Data Memory, providing a total of N18+7 data samples in memory.

Coefficient Memory 1660, having N coefficient values stored in it, outputs every eighth value starting with the first coefficient for the first sub-filter. This coefficient is used by all eight multiply-accumulate units. DAG 1610 selects the appropriate filter coefficient from the coefficient memory 1660, by generating every eighth memory address. Upper data memory 1650 then shifts out N/8−1 more data values that are multiplied by the same number of coefficients and accumulated in each of the eight computational unit accumulators. This is repeated using all the input data and sub-filter coefficients to compute eight successive sub-filter outputs.

Since the successive output data from each sub-filter need to be interleaved with the output from the other sub-filters, the sub-filter outputs are stored in an output buffer and rearranged in order for final output. Data Address Generators (DAGs) 1620 and 1630 are used to properly sequence the filter output. DAG 1620 determines the address for storing a given sub-filter output in output data memory 1640, while DAG 1630 selects data for output from output data memory 1630.

In an embodiment, there is an optional output-packing step. In one embodiment, DAGs 1620 and 1630 interleave sub-filter outputs from each phase in the output data memory. After all of the sub-filters have processed a set of input data, the output data memories 1630 and/or 1640 contain the complete filter output data in proper sequential order. In an alternate embodiment, each sub-filter's outputs are separately stored sequentially in the output data memories 1630 and/or 1640. After all of the subfilters have processed a set of input data, DAGs 1620 and 1630 read sub-filter outputs from the data output memory non-sequentially to output the complete filter data in the proper sequence.

The size of the output data memory 1640, double-buffered for reordering while new outputs are being produced, is the product of twice the number of computational units and the interpolation factor. The length of the interpolation filter, N, is limited by the amount of available memory. The amount of original data needed by a N-length zero-padded interpolate-by-eight filter is N/8. In an embodiment where the filter length N is 128, the maximum space needed is memory for sixteen samples. An additional sample is taken in as the first block is processed for a total of seventeen samples needed in memory for computing a single output. Since this configuration computes eight successive sub-filter outputs for efficiency, seven more samples are required in data memory for a total of twenty-four. For an asymmetrical filter, no lower data memory is required, as shown in FIG. 16.

While the computations for each sub-filter are being done, the eight most recent values in memory are used to initialize the eight computational units for the next sub-filter computation. Since this initialization is done during the eight multiply-accumulates of the previous sub-filter computation, one of the computational units may be required to be double-registered. During the computation of the last sub-filter, only the seven most recent data values are used to initialize the computational units, while the eighth data value comes from a new input data value and is simultaneously used to initialize the eighth computational unit (CU #7) and is stored in upper data memory 1650 for subsequent dot products.

Although FIG. 16 shows the configuration of this RFN to implement the real filter 1500, a similar configuration can be used for interpolation with a half-complex filter.

Figure 17:
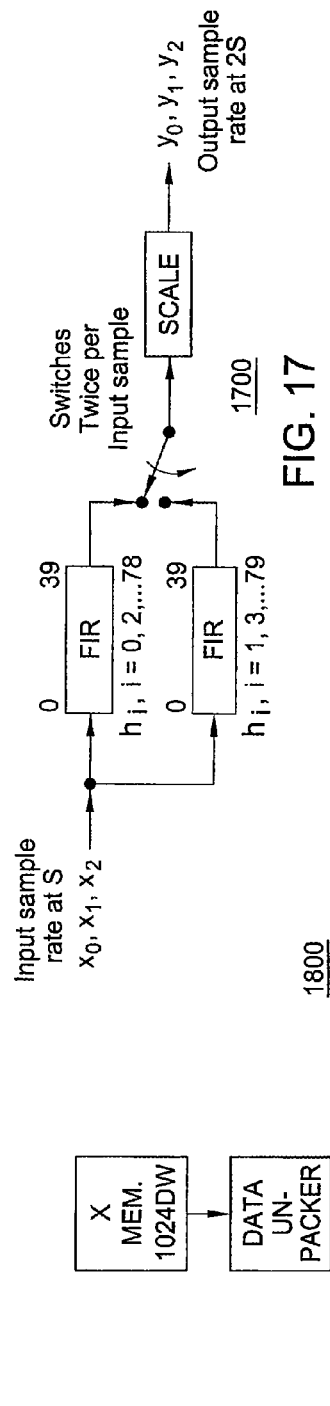
FIG. 17 illustrates a block diagram of a filter that can be implemented by an embodiment of the invention.
Figure 18:
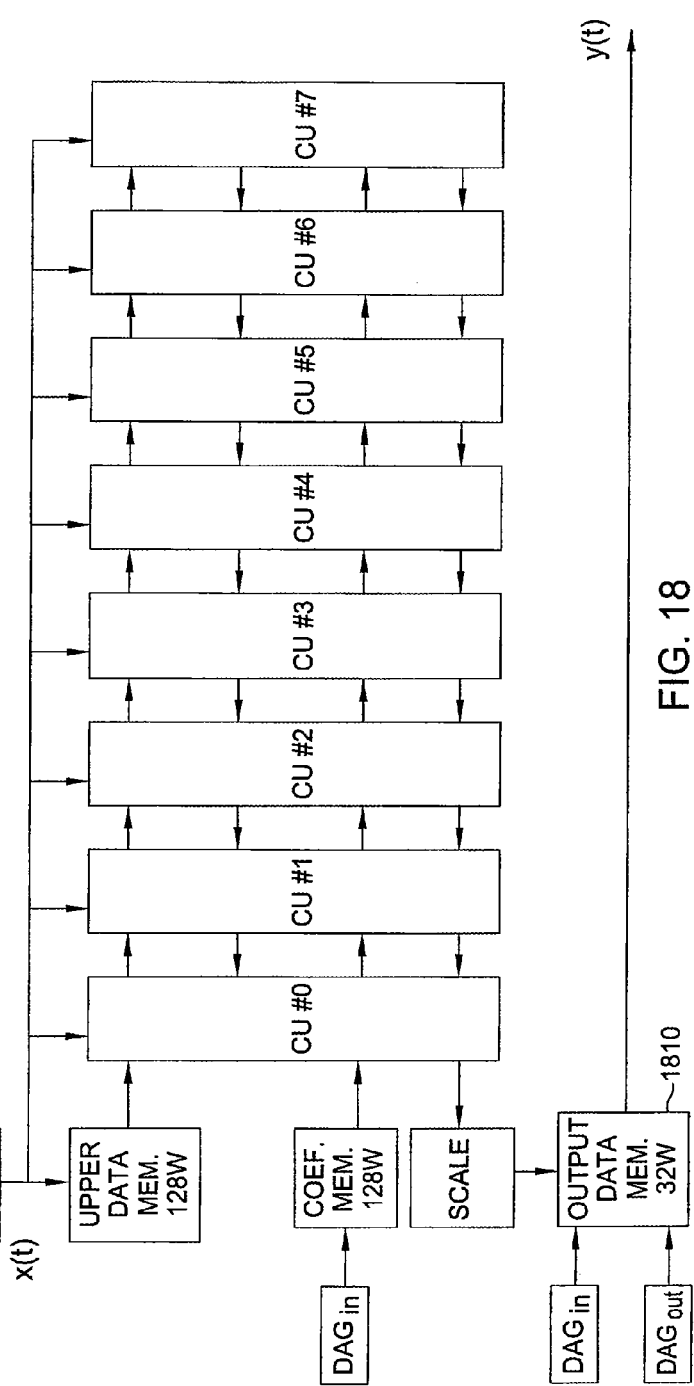
FIG. 18 illustrates the implementation of a filter by an embodiment of the invention.

FIG. 17 shows a block diagram 1700 of real, interpolation by two filter, and FIG. 18 shows the simplified configuration 1800 of the above-described RFN to implement the interpolation by two filter 1700. The configuration 1800 for the interpolation by two filter 1700 differs from the configuration 1600 for the interpolation by eight filter primarily by the size of the output data buffer 1810. The output data buffer 1810 is a double buffer whose size is twice the product of the interpolation factor and the number of computational units. In the embodiment of FIG. 18, this is 32 data words.

The configuration 1800 operates in a similar fashion to configuration 1600. Since there are only two sub-filters in this case, the configuration 1800 first computes eight sub-filter outputs from the odd filter coefficients, and then computes eight sub-filter outputs from the even filter coefficients. The odd and even sub-filter outputs are interleaved to produce the final interpolation by two filter output.

W-CDMA applications require interpolation by two using a 97-tap half-complex filter. Implementation of this filter as a polyphase design at the data rates used by W-CDMA requires 2980 million multiplies per second. However, symmetry can be exploited to reduce the required number of computations. When the underlying filter is symmetric, has an odd number of coefficients, and has only two phases, the sub-filters of a multi-rate polyphase filter are also symmetric. In this case, the symmetry of the polyphase filters can be exploited to reduce the number of multiplies by a factor of 2.

For original filters of length 4N+1, where N is an integer, interpolations by 2 can be decomposed into two symmetric polyphase filters of lengths 2N+1 and 2N. Using folded adders, these filters can themselves be decomposed into folded filters of lengths N+1 and N, halving the number of multiplies. In the implementation of the 97-tap half complex filter discussed above, the number of multiplies is reduced to 1490 MMpy/s. This is within the capabilities of an embodiment of the invention having eight multipliers operating at 200 MHz.

Figure 19:
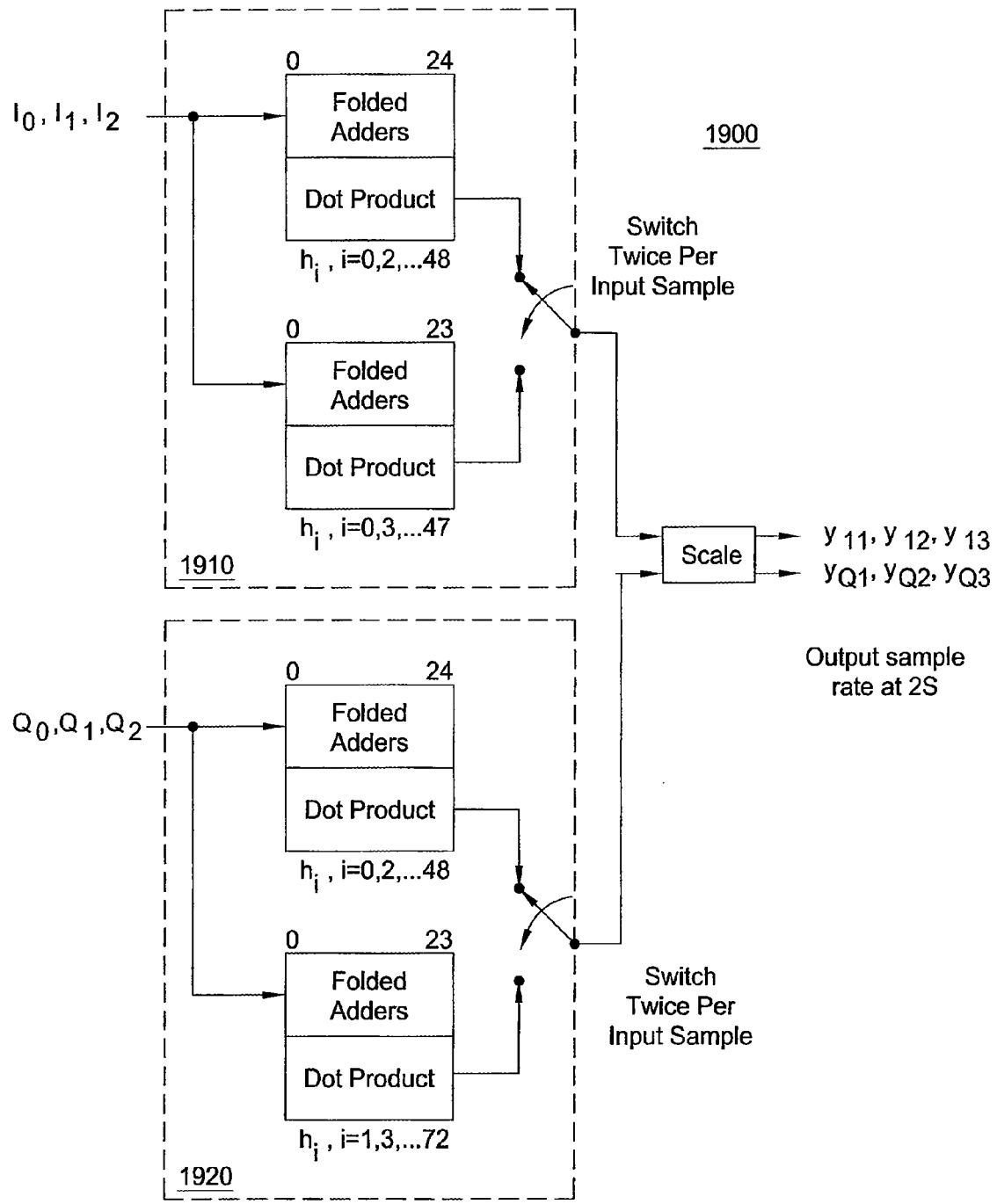
FIG. 19 illustrates a block diagram of a filter that can be implemented by an embodiment of the invention.

FIG. 19 shows a block diagram of a 97-tap half-complex filter 1900 that exploits this polyphase symmetry. Filter 1900 comprises a polyphase filter 1910 for the I input data and a second polyphase filter 1920 for the Q input data. Each of the sub-filters of the polyphase filters 1910 and 1920 are symmetrical, allowing the use of folded adders to reduce the total number of filter taps. For each polyphase filter in this example, one sub-filter has an even length and the other an odd length. When the sub-filter has odd length, N, taking every other coefficient starting with the first for the first polyphase sub-filter results in the first sub-filter having (N−1)/2+1 coefficients, an odd number. This results in the input data value added to itself at was the center of the unfolded filter, so in the folded adder implementation, half the value of the center coefficient should be used. For the second, even length sub-filter, the remaining coefficients to form a filter with (N−1)/2 coefficients, an even number.

Figure 20:
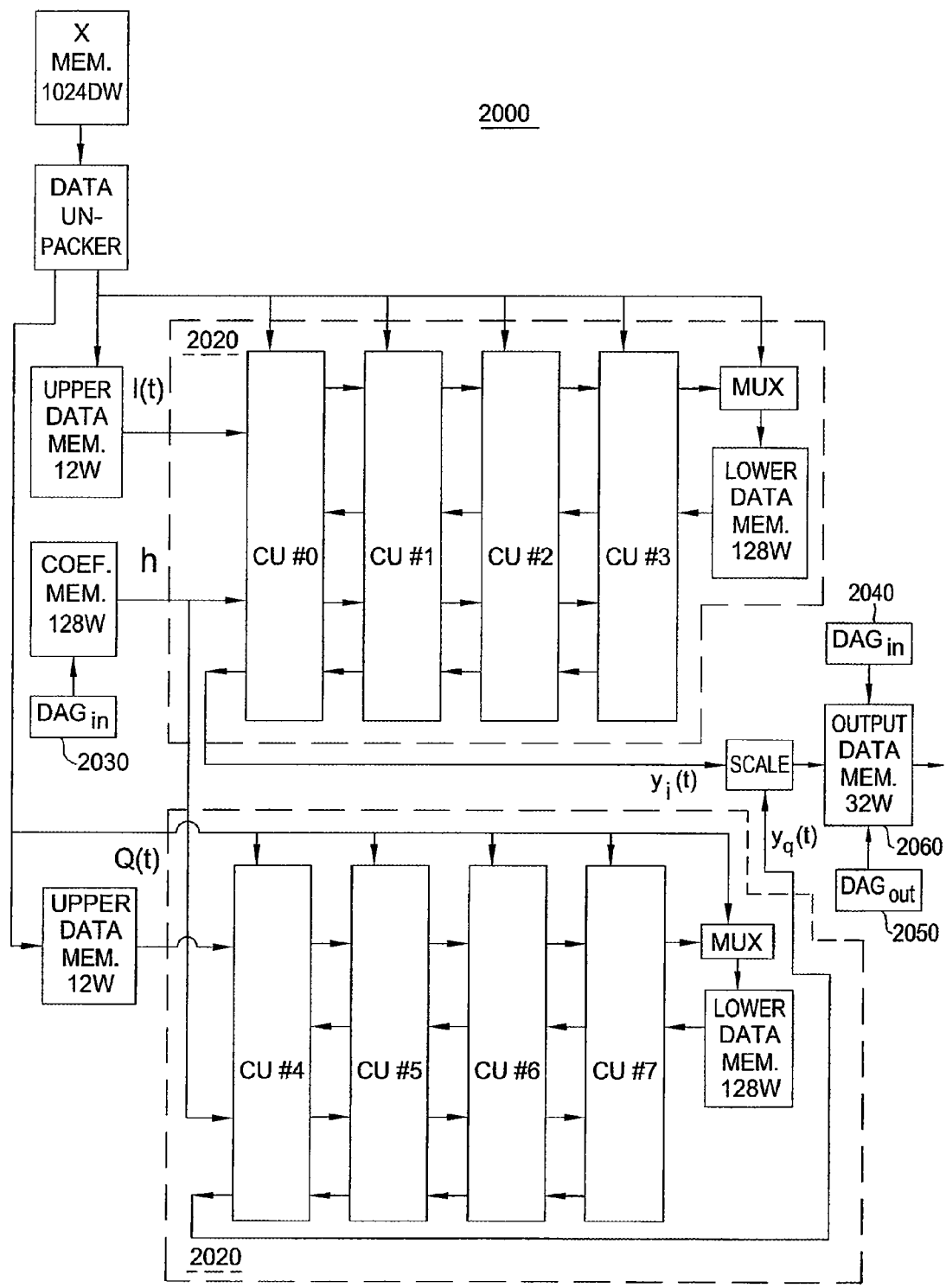
FIG. 20 illustrates the implementation of a filter by an embodiment of the invention.

FIG. 20 shows the configuration 2000 of a RFN implementing filter 1900. In this implementation 2000 of filter 1900, four complex outputs of the first sub-filter are computed using the group 2010 of computational units to compute the I sub-filter output and the group 2020 of computational units to compute the Q sub-filter output. The multiplexers are configured in a similar fashion to that described with a single-rate, half-complex filter discussed above. Data address generators 2030, 2040, and 2050 are used to select filter coefficients and sort sub-filter output data as discussed above with regard to polyphase filters. In an embodiment, there is an optional output data packing stage, for example putting a complex data point into one double word.

The upper delay line and the lower delay line of each sub-filter are initialized prior to each output computation. For the first sub-filter, the upper shift registers and the upper data memory are initialized with the four newest complex data samples. On the very first execution of this configuration

2000, the lower shift registers are initialized from the lower data memory. On subsequent executions, the lower shift registers are initialized by capturing input data from previous executions as they pass.

Initialization of the second sub-filter is done after the first shift of the lower folded delay line of the first sub-filter. The initial values for the upper delay line are the same as the initial values of the upper delay line for the first sub-filter. The correct initial values for the lower line are the next data values to the right at the start of the first sub-filter execution. Because both sub-filters in an interpolator use the same data, the lower delay line may be initialized with the oldest data samples by capturing them into the initialization registers as they fly by on earlier calculations, as discussed above.

The output data memory 2060 is a double buffer whose size is twice the number of data points produced by a single pass of both filters. For the special case, this is 2×2 sub-filters×4 complex points per sub-filter, or 16 double words or 32 words. In this configuration 2000, the number of complex filter outputs produced in each execution cycle is equal to half the total number of computational units.

Figure 21:
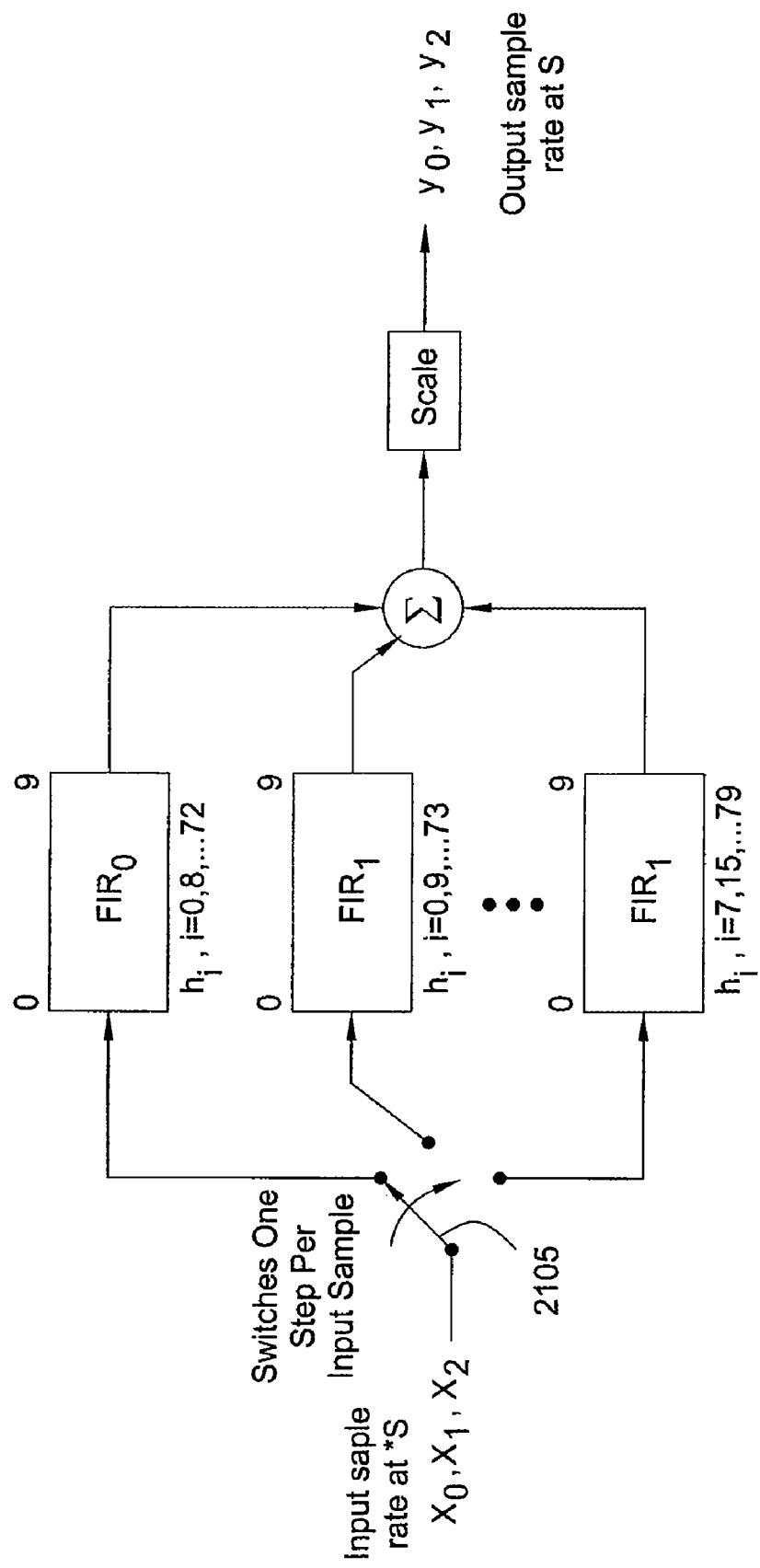
FIG. 21 illustrates a block diagram of a filter that can be implemented by an embodiment of the invention.

The RFN can also be configured to perform decimation filtering. Decimation filtering is used to reduce the sample rate of oversampled signals. For example, the Telematics application requires decimation of up to a factor of 32. A polyphase filter is an implementation of decimation filtering. In general, a polyphase decimation by N filter divides the required filter dot product into N shorter dot products and sums their output, producing exactly the same output that the direct filter would if it only generated the required output samples. In a polyphase decimation filter, every Nth input sample is directed into a separate polyphase filter. FIG. 21 shows an example polyphase decimation by eight filter 2100. Sequential input samples are directed into separate polyphase filters by switch 2105. The sub-filter outputs are summed by output summer 2110.

Figure 22:
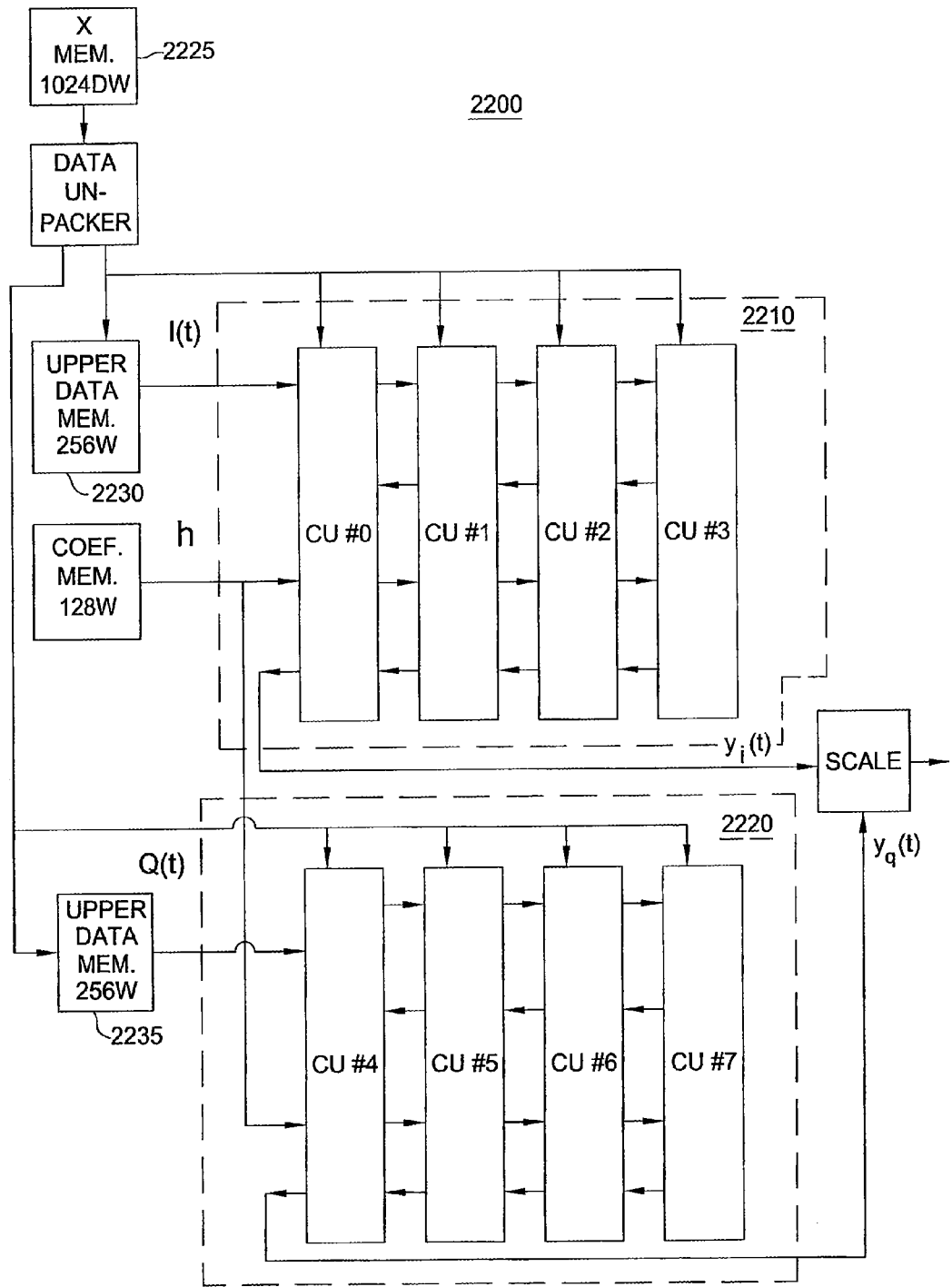
FIG. 22 illustrates the implementation of a filter by an embodiment of the invention.

FIG. 22 shows a configuration 2200 of a RFN to implement a decimation by 32 filter. The decimation filter uses the efficient polyphase structure of FIG. 21, but with 32-sub-filters. If the original single-rate decimation by 32 filter has 128 coefficients, each sub-filter of the polyphase filter has 4 coefficients. Configuration 2200 uses group 2210 of four computational units for I input data computations and group 2220 of four computational units for Q input data computations. In this configuration 2200, there is no connection between the total number of filter coefficients and the number of computational units.

In the polyphase configuration 2200, four polyphase sub-filter outputs are computed per initialization. The computational units of groups 2210 and 2220 are initialized from the X-memory 2225 and then fed in a dataflow fashion from the upper data memories 2230 and 2235 to compute an I or Q sub-filter outputs at each computational unit. At the same time that the computational units of 2210 and 2220 are being initialized with the most recent data, the input data values that will be reused on the next computation of this sub-filter output are placed into the upper data memories 2230 and 2235. Unlike prior configurations, no lower data memory is needed if the filters are asymmetric.

In the case of a 128-coefficient decimation by 32 filter comprised of thirty-two sub-filters, a complete four-tap sub-filter output is computed from just four data points, consisting of the initial datum plus 3 more. Thus by initializing and shifting three input data values from the upper data memories 2230 and 2235 through the computational units, four complex sub-filter outputs may be computed. The results of the four complex sub-filter outputs are stored in the accumulators associated with each computational unit.

The second and subsequent sub-filters are initialized from input data shifted during the execution of the previous sub-filter execution. In the example of a four coefficient sub-filter, there are only three shifts of input data, so only three of the four new initialization points needed for each group may be stored in the computational units memory from X-memory 2225. In this situation, the computational units of groups 2210 and 2220 are idle while the fourth input data value is loaded for the next sub-filter execution. When the number of sub-filter coefficients is greater than the number of computational units used for each sub-filter, as may be the case for lower decimation factors, this idle time does not occur because there are enough clock cycles for all four of the computational units of each group to be initialized for the next sub-filter execution.

Following the initialization of the second or subsequent sub-filters, the four complex sub-filter outputs are added to the previously accumulated sub-filter outputs stored in the accumulators associated with each computational unit. After all thirty-two sub-filter outputs are calculated, the sum of all thirty-two sub-filter outputs resides in the accumulators and may be shifted out while the next set of computations begins. The accumulators sum the sub-filter outputs without the use of a separate output summer 2110 as shown in FIG. 21.

Computation of a single polyphase output based on a 128-tap filter requires 128 input data values, and computation of four decimated outputs requires approximately an additional three times the decimation factor number of points. As a result, the size of the upper data memories is doubled. In an alternate embodiment, the additional memory required may be taken from the lower data memory, which is not needed for an asymmetrical filter.

Polyphase filter symmetry may be exploited in decimation filters when there is decimation by two and the single-rate decimation filter's length is 4N+1. In this situation, the sub-filters of each polyphase filter are symmetrical, allowing the number of multiplications to halved through the use of folded adders.

Figure 23:
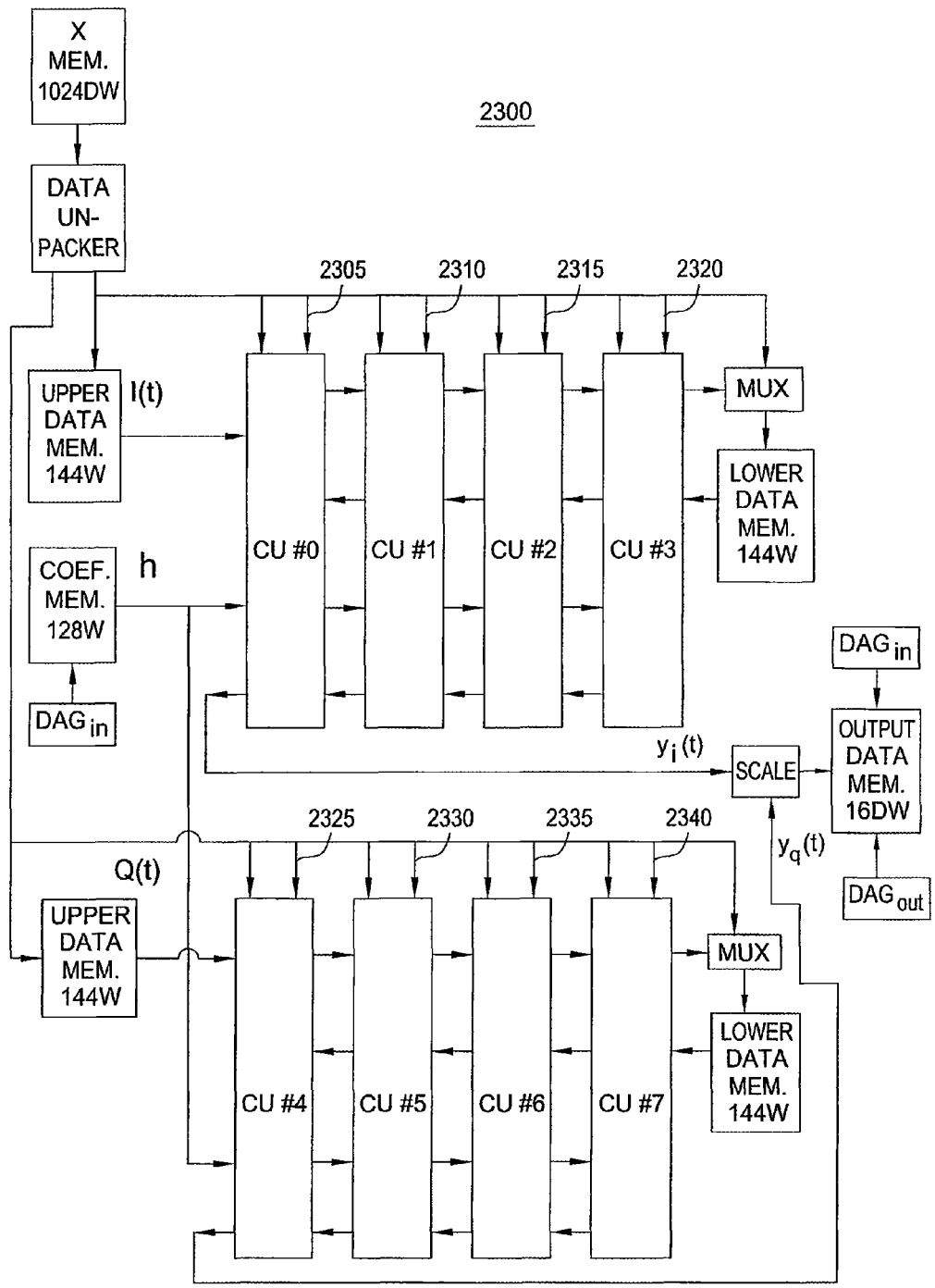
FIG. 23 illustrates the implementation of a filter by an embodiment of the invention.

FIG. 23 shows a configuration 2300 of an RFN implementing an odd length, half-complex, decimation by 2 filter exploiting this symmetry. Configuration 2300 operates in a similar manner to configuration 2000 of an odd length interpolation by 2 filter. However, configuration 2300 executes the two decimation sub-filters with different input data values owing to the switch used to direct input values in polyphase decimation filters, such as switch 2105 in the example decimation filter discussed above. Therefore, initialization of the lower folded delay line after switching from one sub-filter to the other cannot be done by retaining old values as it was for interpolation. Instead, initialization of both delay lines must be done via the X-register. This requires four more initialization cycles. Alternatively, computational units have additional registers to save previous values, or a Y-register is used simultaneously. FIG. 23 shows additional initialization paths 2305, 2310, 2315, 2320, 2325, 2330, 2335, and 2340 connected with the lower data registers of each computational unit.

As with decimation by 32, efficient use of configuration 2300 is achieved by computing four successive outputs sequentially from each sub-filter and storing them in an output buffer for sorting out. Computation of four outputs from each sub-filter requires an output buffer of sixteen double words.

In an example, using an N=255-coefficient decimation by two filter, the number of coefficients for the first sub-filter is (N−1)/2+1 and for the second sub-filter is (N−1)/2. Taking account of the symmetry of the sub-filters, the first sub-filter requires (N−1)/4+1 different coefficients and the second sub-filter requires (N−1)/4, a total of (N−1)/2+1, or 128 coefficients. Continuing with the example of a 255-coefficient decimation by 2 filter, the simultaneous computation of 4 outputs requires an input buffer with an upper data memory of approximately 128 data words plus the decimation factor (2) times the number of outputs computed (4), plus any new data stored in the memory during the computation (the number of outputs, 4, times the decimation factor 2), for a total of 144 words of memory each for the I and Q data inputs.

Figure 24:
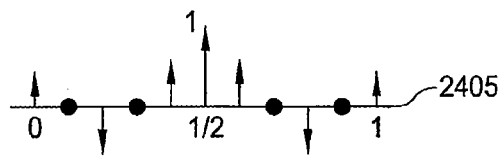
FIG. 24 illustrates a block diagram of a filter that can be implemented by an embodiment of the invention.
Figure 24:
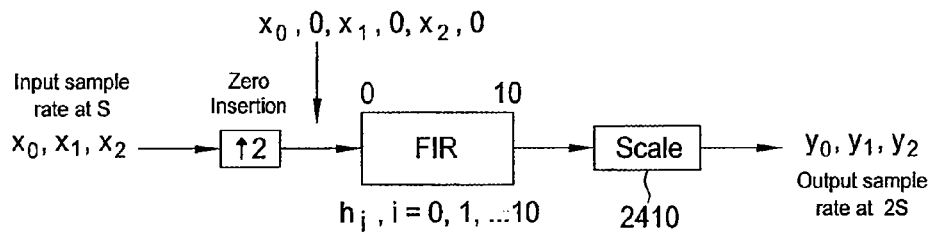
Figure 24:
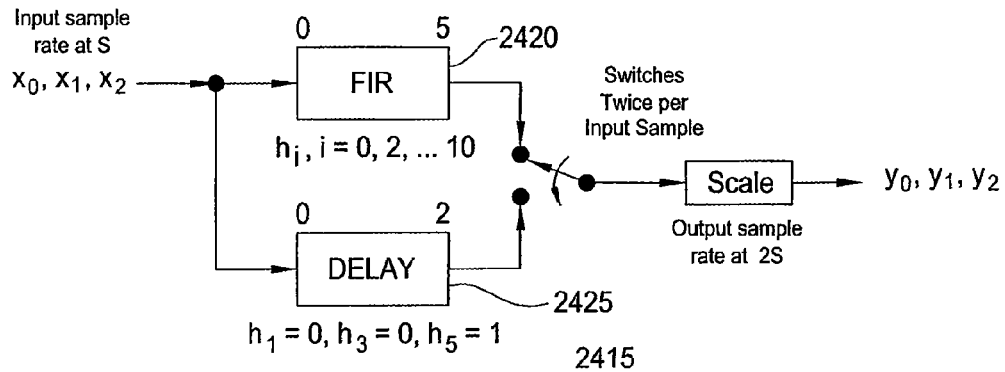

The RFN can also perform half-band filtering. Half-band filters always have zeros for the even coefficients, except for the center coefficient, which is unity. FIG. 24 shows an example half-band interpolation filter impulse response 2405. The direct implementation of this filter, 2410, is inefficient because of the numerous wasteful multiplies by zero. The polyphase implementation 2415 uses a first sub-filter 2420 with the odd, non-zero valued coefficients, and a second sub-filter 2425 with the even coefficients. Since the even-coefficients are zero, except for the center coefficient, filter 2425 acts as a simple delay unit.

Figure 25:
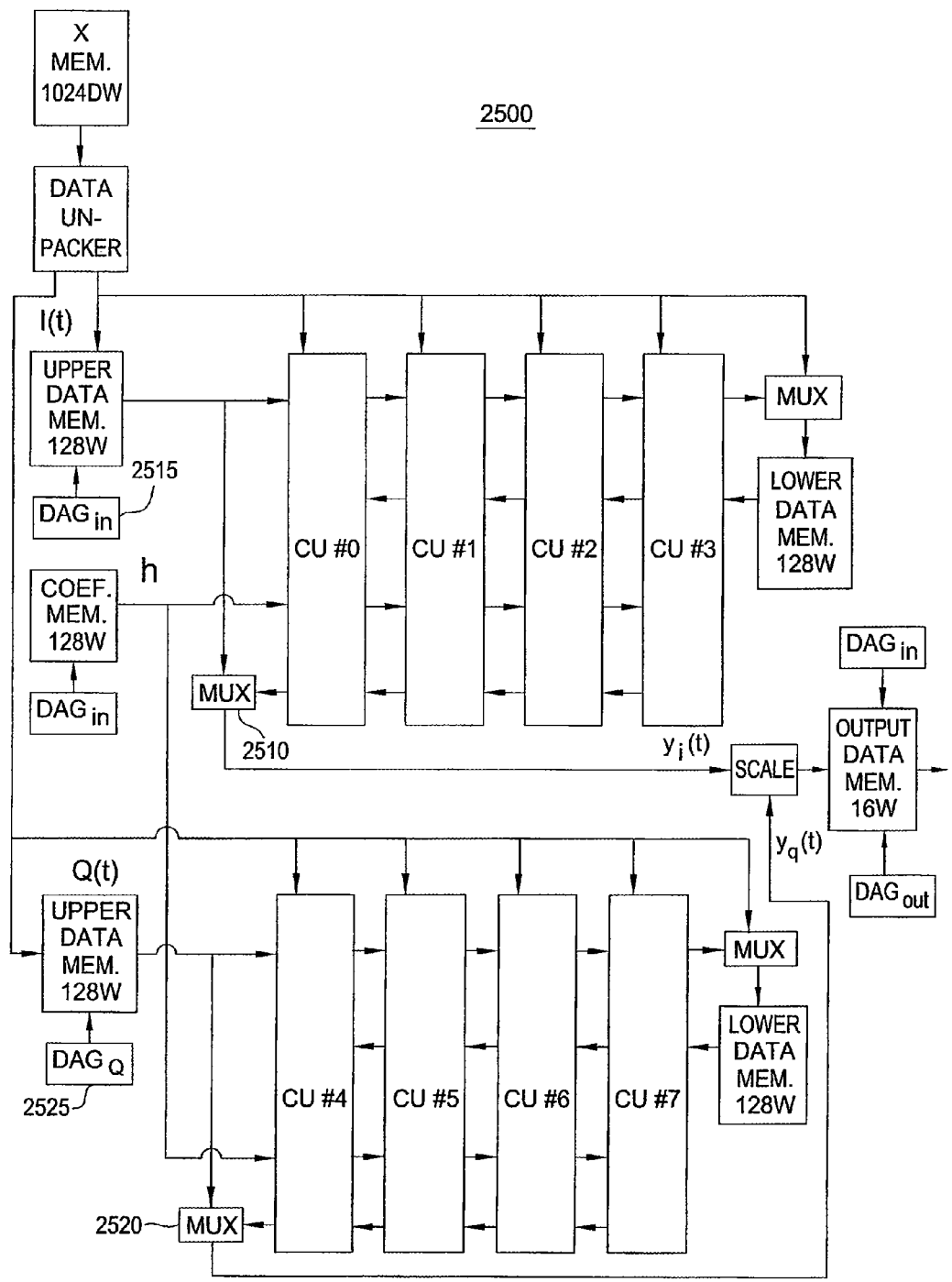
FIG. 25 illustrates the implementation of a filter by an embodiment of the invention.

FIG. 25 shows configuration 2500 for implementing this polyphase half-band interpolation filter. The first sub-filter is implemented as described above for a half-complex polyphase decimation by 2 filter. However, since the second sub-filter is merely a delay, it is implemented using multiplexers 2510 and 2520 to divert an input data values from memory to the output after the appropriate delay time. Data address generators 2515 and 2525 select from memory the appropriate input data values that correspond to the delayed filter outputs at the proper time. In a further embodiment, if the half-band interpolation filter is symmetric, folded adders can be used to reduce the number of multiplies for the first sub-filter. For example, IEEE 802.11a wireless data applications can benefit from this optimization.

Figure 26:
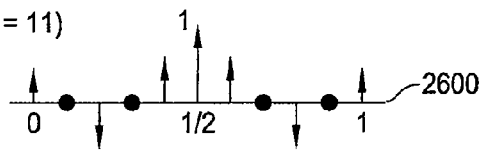
FIG. 26 illustrates a block diagram of a filter that can be implemented by an embodiment of the invention.
Figure 26:
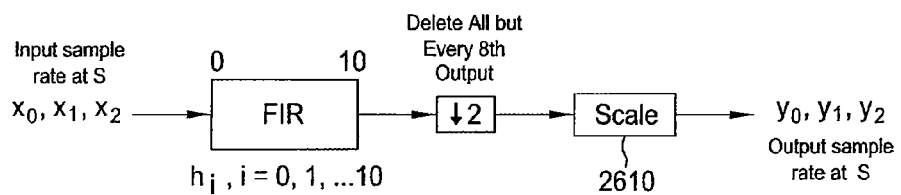
Figure 26:
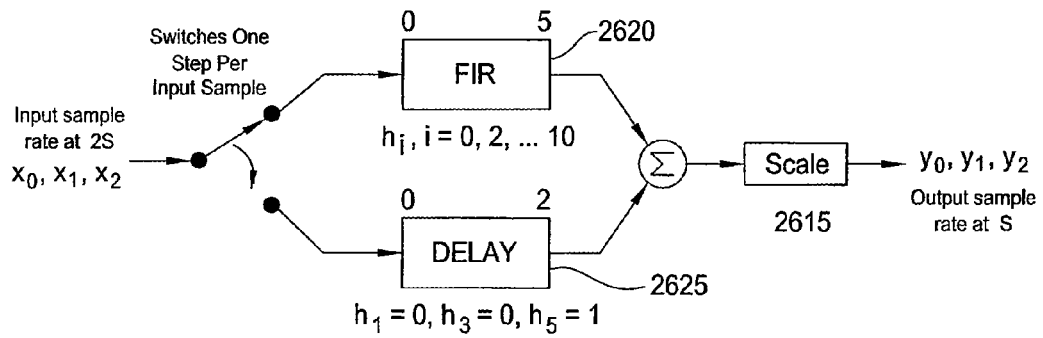

Half-band decimation filters can also be implemented with this RFN. FIG. 26 shows a half-band decimation filter impulse response 2600. The direct implementation of this filter, 2610, is inefficient because of the numerous wasteful multiplies by zero. The polyphase implementation 2615 uses a first sub-filter 2620 with the odd, non-zero valued coefficients, and a second sub-filter 2625 with the even coefficients. Since the even-coefficients are zero, except for the center coefficient, filter 2625 acts as a simple delay unit.

Figure 27:
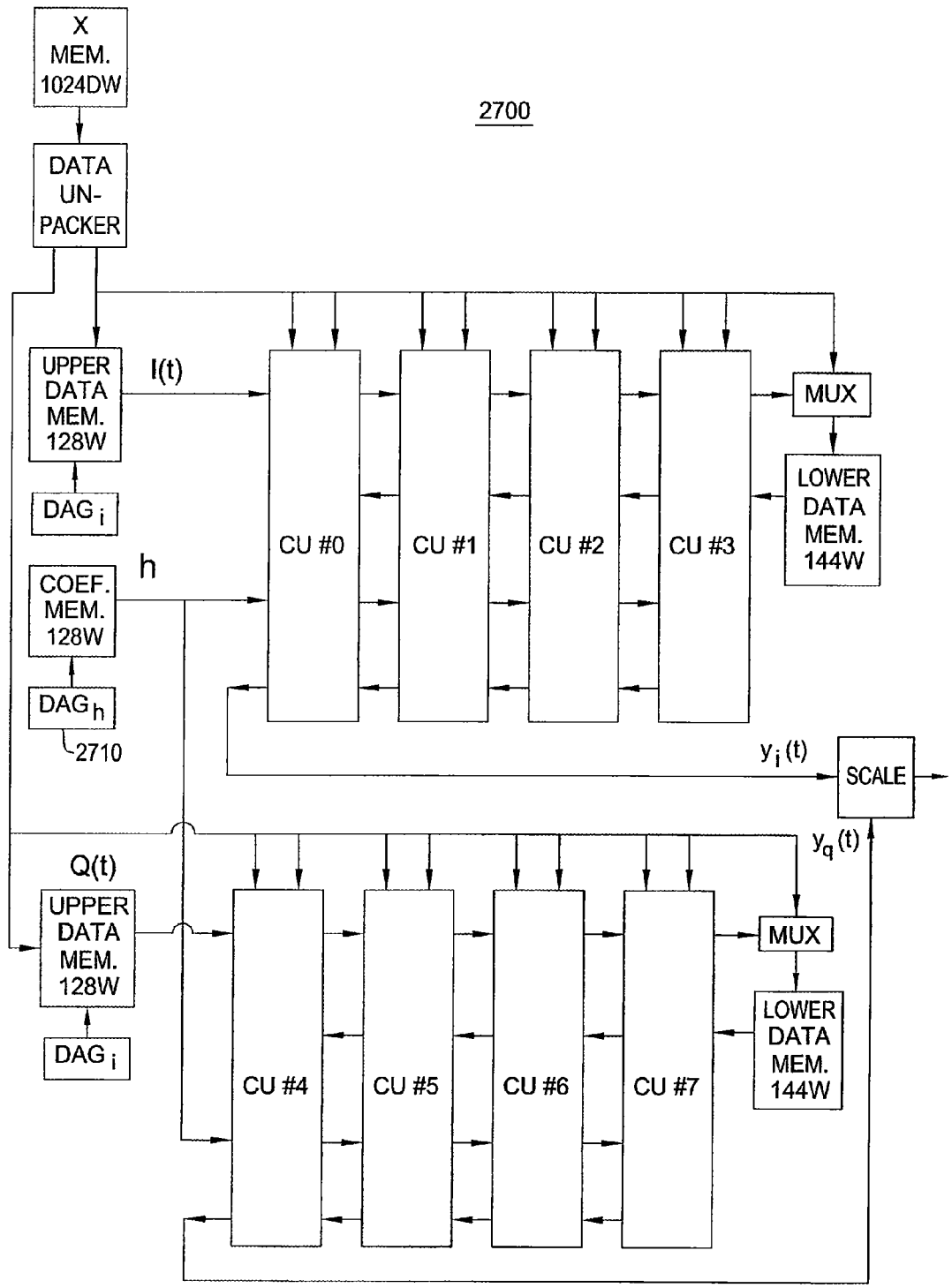
FIG. 27 illustrates the implementation of a filter by an embodiment of the invention.

FIG. 27 shows a configuration 2700 of the RFN implementing the half-band decimation filter. Similar to its half-band interpolation counterpart, the half-band decimation by 2 filter has a first sub-filter and a delay. In the half-band decimation filter, the output from the delay is summed with the first sub-filter output. Since summing the delayed input value with the first sub-filter output can be viewed as an additional coefficient of unity, the configuration 2700 only needs to use data address generator 2710 to move an additional unity valued coefficient into the computational units at the appropriate time. No output buffer is needed in this configuration.

Adaptive filters are filters whose coefficients change over time to produce a desired result. In general, adaptive filters may have complex-valued coefficients. The coefficients are adjusted over time by an adaptive algorithm. A large number of adaptive algorithms exist and many variants of each are possible to simplify computations or decrease the convergence time to a desired result. Coefficient updates may occur as often as every input sample or far less frequently, for example to track a slowly changing signal environment.

Figure 28:
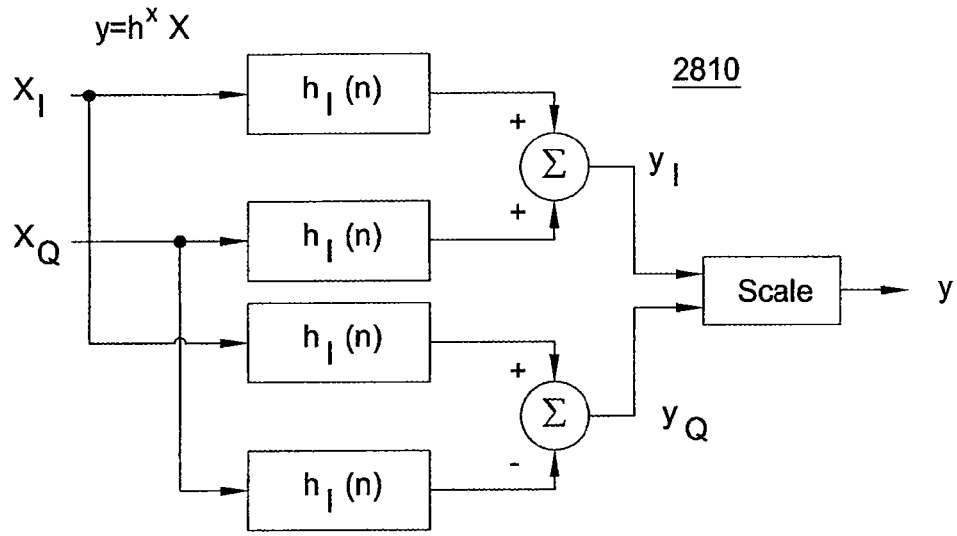
FIG. 28 illustrates a block diagram of a filter that can be implemented by an embodiment of the invention.
Figure 28:
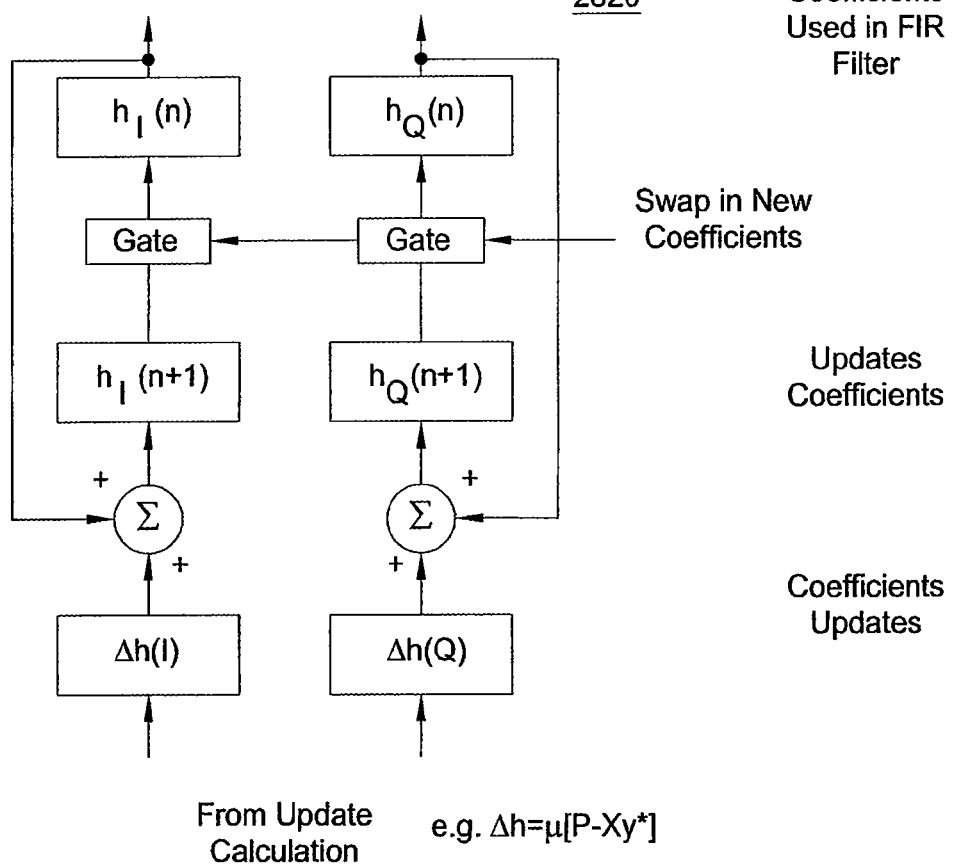

FIG. 28 shows the implementation of the complex FIR filter 2810 as a straightforward complex dot product. In general, adaptive filters must be implemented as complex dot products with coefficient vectors drawn from a register for the duration of the dot product. Because the coefficients change as they are updated, it must be double-buffered, as shown in block diagram 2820, so that new coefficient values do not interfere with ongoing filter computations.

The coefficient update computation usually involves the adaptive filter output, the present filter coefficients, and the input data vector, and sometimes other scalar quantities and vectors. Since the filter outputs, the input data and the current weights are all available within the RFN, it is desirable from a speed and power perspective to perform the update computation entirely within the RFN whenever possible. Occasionally, coefficient computations require operations such as division, square root, and magnitude computations. These computations may be done in a separate programmable DSP-oriented node and sent to the RFN for further processing.

Programmable sequencer 766 within the RFN enables the node to perform programmable vector operations used in adaptive filters, including vector additions, scalar/vector multiplications, vector complex conjugates, and vector dot products. Adaptive filter techniques such as standard LMS, Griffiths LMS, and normalized LMS are all capable of being performed entirely within the RFN, with additional desired signal and normalization factors computed in another node.

Figure 29:
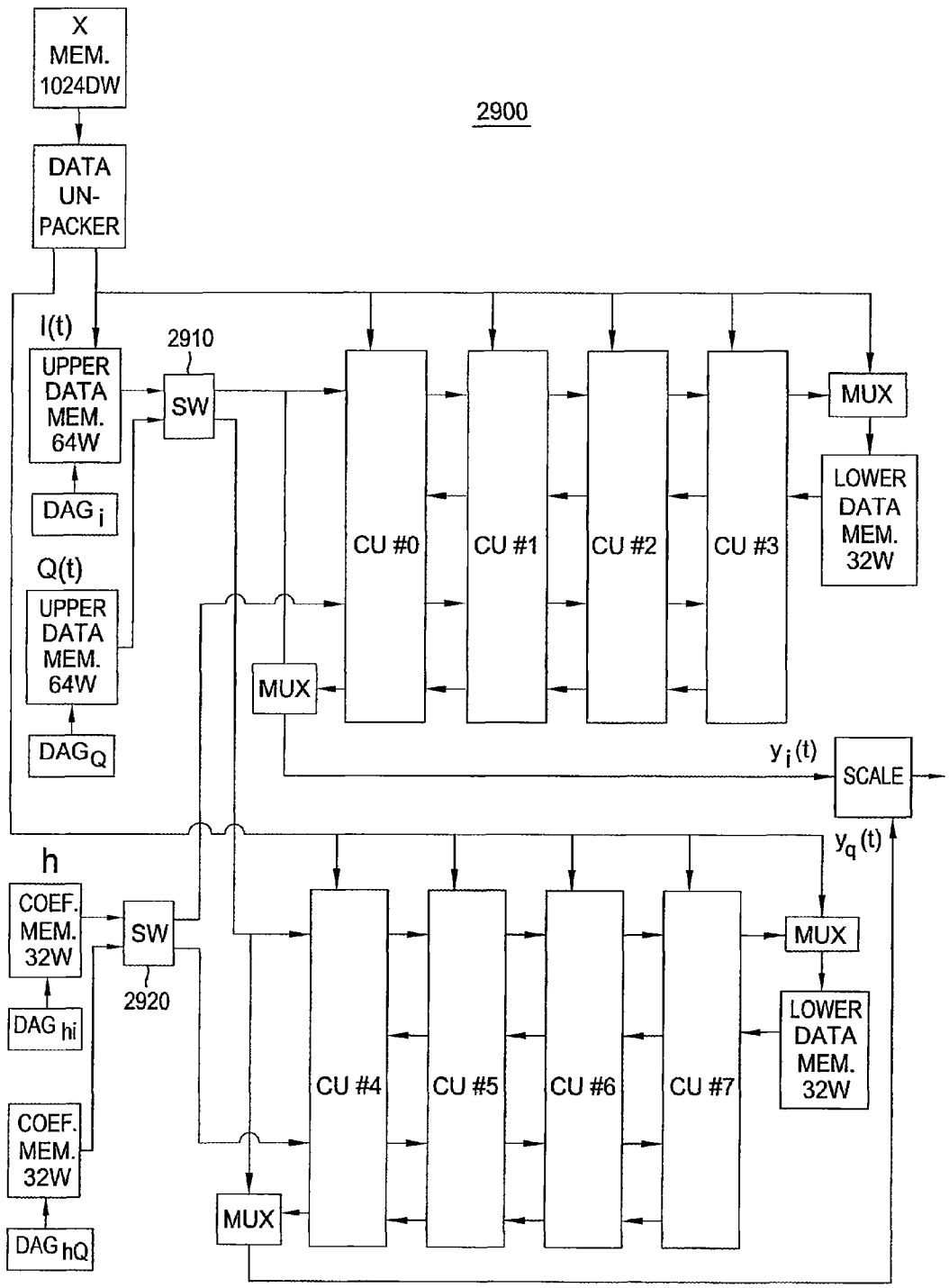
FIG. 29 illustrates the implementation of a filter by an embodiment of the invention.

Adaptive filters may be implemented by the RFN by time-sharing update computations with FIR filtering computations. In this implementation, extra memory storage holds the values used in the update computations. FIG. 29 shows a configuration 2900 of the RFN implementing a complex adaptive FIR filter. In this example implementation, it is assumed that the FIR filter is fully complex and symmetrical and that the input data is complex.

In the complex FIR filter, the complex conjugate of the filter weights is multiplied by the data to form the output. Configuration 2900 computes four complex outputs by the four pairs of computational units. Because two dot products are required per computational unit per output, two passes of the input data and filter coefficients are made and the computational units accumulate the output. As shown in FIG. 28, one dot product must be negated to produce the filter output. The negation of dot products is performed by the accumulators associated with each computational unit. As mentioned above, the accumulators associated with each computational unit are add/subtract accumulators and are therefore able to subtract as well as to add. The complex filter also needs access to the I and Q data inputs to compute cross-products. Switches 2910 and 2920, also shown in FIG. 8A, provide the appropriate data to the computational units.

The update computations for adaptive filters depend on the update algorithm. The programmable sequencer 766 is used to implement the steps needed for the update algorithm. An example of an update computation that could be done entirely on the RFN is the Griffiths algorithm, which is $$h(n+1)=h(n)+\mu[P-X(n)y^*(n))]=h(n)+\mu P-\mu X(n)y^*(n)$$

where
$h(n+1)$ is the new coefficient vector of length N,
$h(n)$ is the old coefficient vector of length N,
P is a constant vector of length N supplied by the algorithm designer,
$X(n)$ is the complex data vector of length N,
$y^*(n)$ is the complex conjugate of the scalar output of the filter,
$\mu$ is a scalar, usually a small number compared to $X^H X$.

The new coefficient vector may be computed by first computing the filter output y(n) and shifting it to provide µy(n). Alternatively, a computational unit can explicitly compute µy(n) while simultaneously negating it. −µy*(n) is then multiplied by X(n) in a computational unit, and the result is added to the pre-computed µP in a pre-adder, followed by adding to h(n) again in a pre-adder. After each component is added in the pre-adder, it is immediately output and stored in a small temporary register. The final coefficient vector replaces the old coefficients in the next FIR filter calculation.

Figure 30:
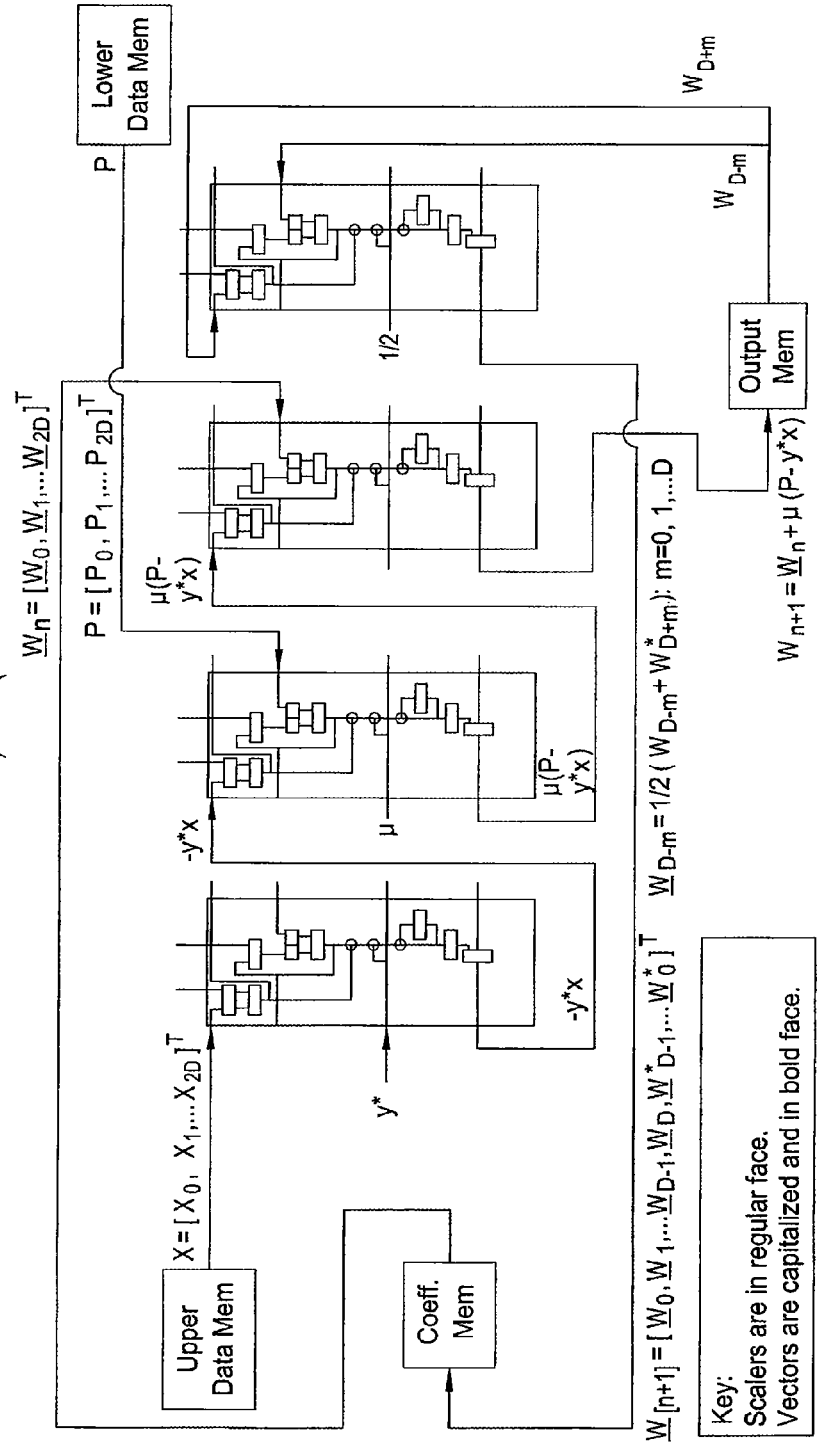
FIG. 30 illustrates an adaptive filter update computation according to an embodiment of the invention.

Adaptive filter update computations may be optimized for use with the RFN node. FIG. 30 shows an example update computation that is unoptimized for the RFN. This update requires the computation of the following vectors:

| | | |
|---|---|---|
| Gradient Descent: | $W[n+1] = \underline{W}[n] + \mu (P - y^*[n]X[n])$ | 2D+1 vectors |
| Constraint: | $\underline{w}_{D-m}[n+1] = 1/2 (\underline{w}_{D-m}[n+1] + w^*_{D+m}[n+1])$, | m=0,1,...D |
| | $\underline{w}_{D+m}[n+1] = \underline{w}^*_{D-m}[n+1]$, | m=1,2...D |

These vector additions may be done almost simultaneously, with one clock delay, by pipelining the additions. At the same time, the vectors can be multiplied by scalars. In an example embodiment, if D=10, X is a vector of 21 complex data samples, and there are eight computational units in this implementation, then computation of y*X with two computational units (one for I input data and one for Q input data) requires 21×2 clocks. Computation of the vector µ(P−y*X) in two addition computational units requires only one additional clock cycle since it is pipelined. Adding Wn+1= Wn+µ(P−y*X) in two more computation units requires one more clock cycle owing to pipelining. Applying the constraint wD−m=1/2(wD−m+w*D+m); m=0, 1, ... D requires a few (e.g. 2-3) more multiply-add clock cycles, depending on details of its implementation.

Figure 31:
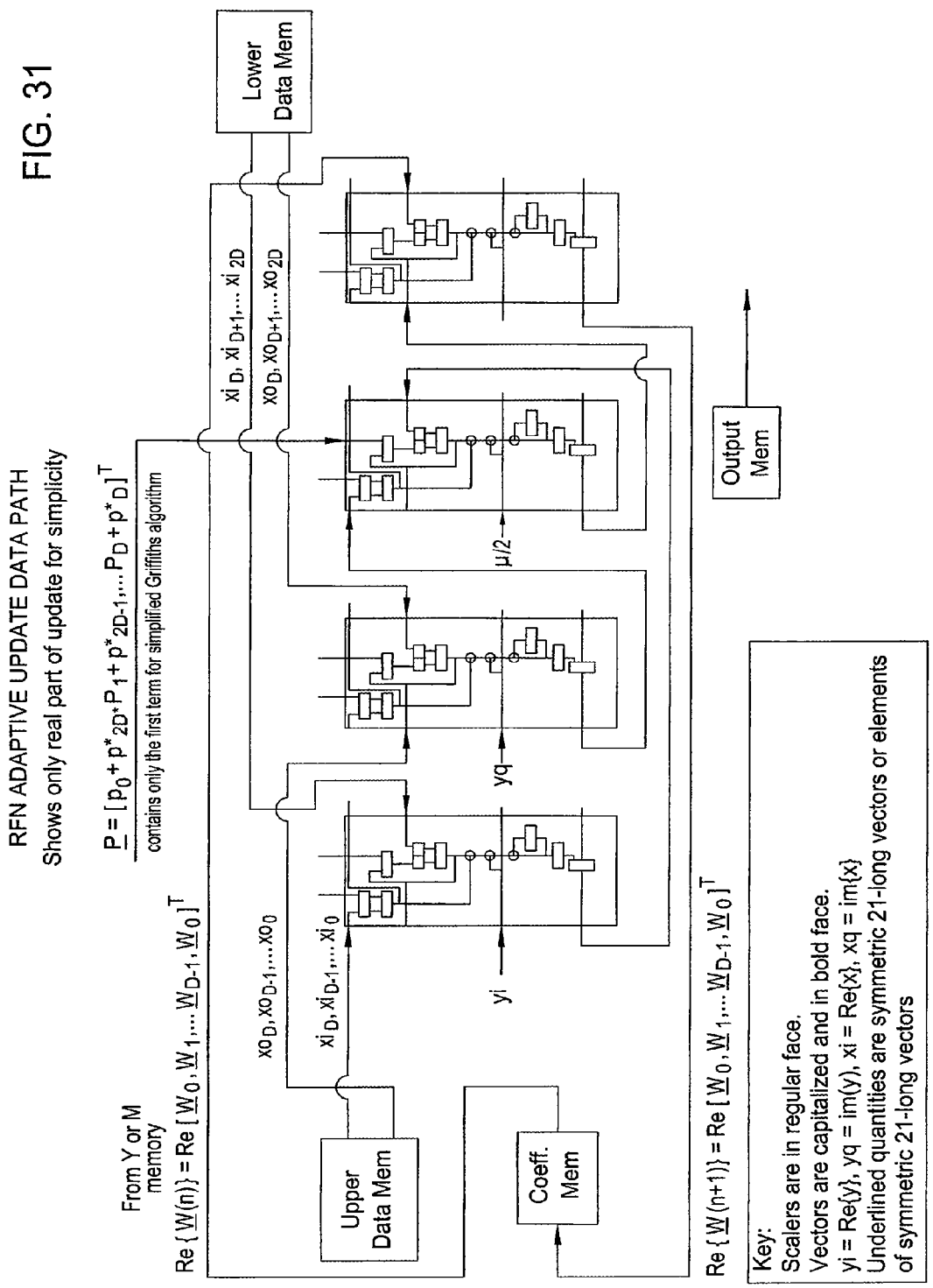
FIG. 31 illustrates an adaptive filter update computation according to an embodiment of the invention.

FIG. 31 shows an improvement to the update calculation to achieve the desired speed. This example updates the 11-element, non-redundant part of the weight vector. Continuing with the above example, the constrained adaptive update computation can be minimized by using D+1 vectors. It can be shown that the constrained update is equivalent to:

$w_{D-m}[n+1]=$
$\quad w_{D-m}[n]+\mu/2(p_{D-m}+p^*_{D+m})-\mu/2yi(xi_{D-m}+xi_{D+m})+yq$
$\quad (xq_{D-m}+xq_{D+m})+j(yi(xq_{D-m}-xq_{D+m})-yq$
$\quad (xi_D-m-xi_{D+m})), m=0,1,...D$ where $\underline{w}_{D+m}[n+1]=w^*_{D-m}[n+1]$, m=1, 2 ... D The weight vector may be computed as a D+1 vector and never expanded. If D=10, X is a 21-element vector, and eight computational units are used in this implementation, then the computation of the terms involving y and x may be done with six computational units (three pipelined for I shown in FIG. 31, and the three for Q not shown) in 11+1+1 clocks. Pre-adding the first and only non-zero term of P in the simplified form of the algorithm requires no additional clocks since it can be done at the same time as the first add and accumulated. Adding the weight in two more computational units requires one additional clock cycle to compute the D+1 length weight vector, for a total update computation time of 14 clocks for the simplified P vector form. Alternatively, a general P vector would use some intermediate storage in the output memory and recirculation in a computational unit, resulting in 10 additional clocks. Additionally, the weight vector never needs to be explicitly expanded and computation of the dot product for the FIR filter may be done with the weight vector compressed.

Figure 32:
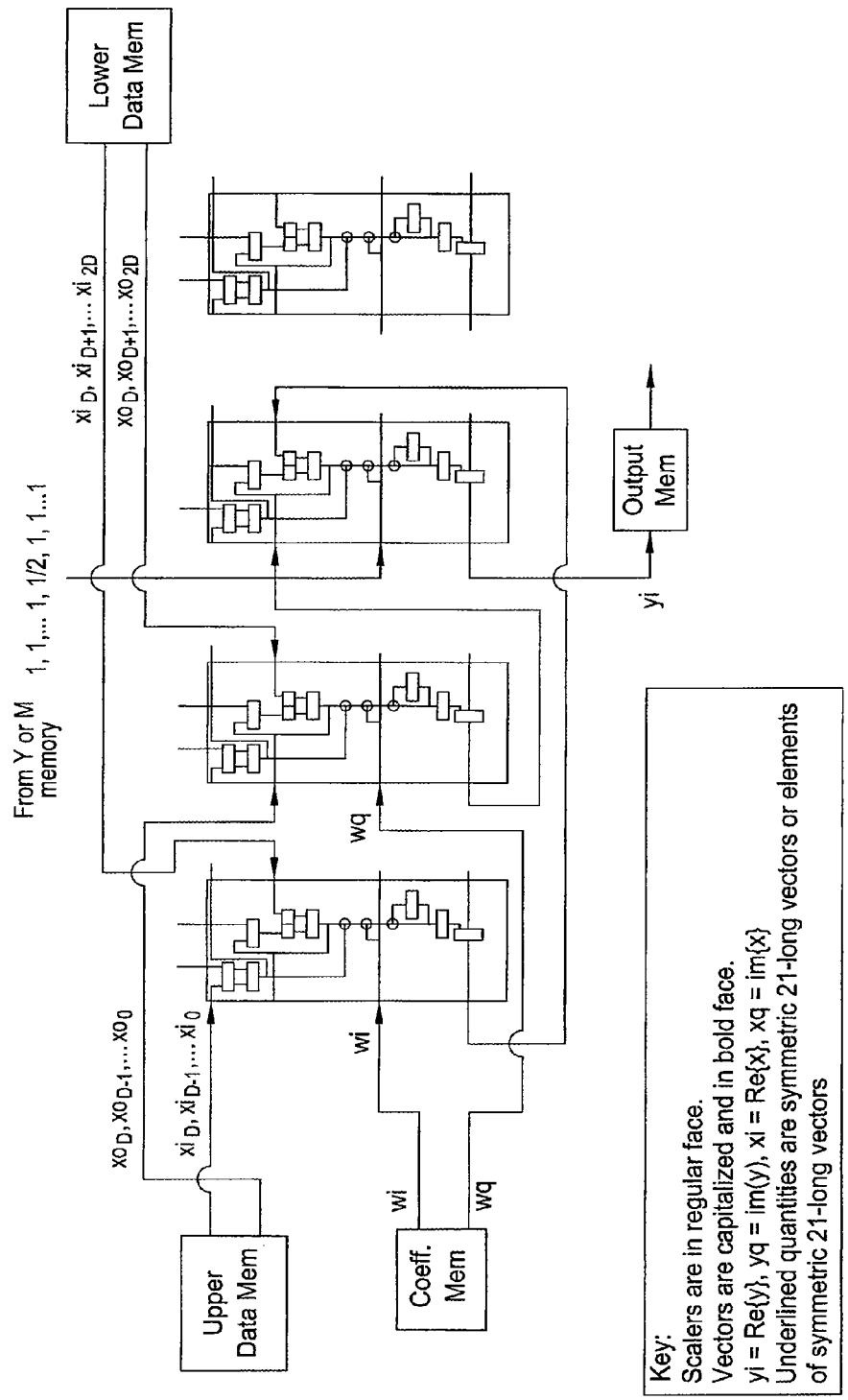
FIG. 32 illustrates an adaptive filter update computation according to an embodiment of the invention.

Additional optimizations may be realized if the filter is conjugate-symmetrically constrained. FIG. 32 shows the update computation using the non-redundant half of the conjugate-symmetric weight vector. Combined with the accelerated update calculation discussed with respect to FIG. 31, this optimization of the FIR filter output computation allows the ability to adapt the filter after every output for a 21-element weight vector.

The computation of the constrained FIR filter can be minimized by using D+1 vectors. It can be shown that the conjugate-symmetrically-constrained FIR filter output is equivalent to:

$y=W^H X$, where W and X are vectors of length 2D+1, and H signifies transpose conjugate.

Ordinarily this would require 4×(2D+1) real multiplies. If D=10 this is 84 multiplies. However, since W is conjugate symmetric, $\underline{w}_{D+m}=\underline{w}^*_{D-m}$, m=0,1,2 ... D and y can be expressed by pre-summing symmetric terms of X and computing the dot product, resulting in half as many real multiplies:

$y=\underline{w}_D x_D+\Sigma(w^*_{D-m}x_{D-m}+\underline{w}_{D-m}x_{D+m}), m=1,2,...D$ The number of real multiplies is 4D+2 because $w_D$ is real. For D=10 computing y requires 42 real multiplies. The weight vector may be computed as a D+1 vector and never expanded.

Because of the conjugation of w, the data cannot simply be summed and multiplied, but rather computed as follows:

$y=w_D xi_D+jw_D xq_D+\Sigma wi_{D-m}(xi_{D-m}+x_{D+m})+wq_{D-m}$
$\quad (xq_{D-m}-xq_{D+m})+j(wi_{D-m}(xq_{D-m}+xq_{D+m})-wq$
$\quad (xi_D-m-xi_{D+m})), m=1,2,...D$ If D=10 and X is a 21-element vector, computation may be done with six computational units (three pipelined for I shown in FIG. 32, the three for Q not shown) in 11+1, or 12 clocks. Since in this example application there are 52 clocks available per sample, both the dot product (12 clocks) and the adaptive update for the simplified Griffiths algorithm (14 clocks) can be performed between samples in 26 clocks.

Figure 33:
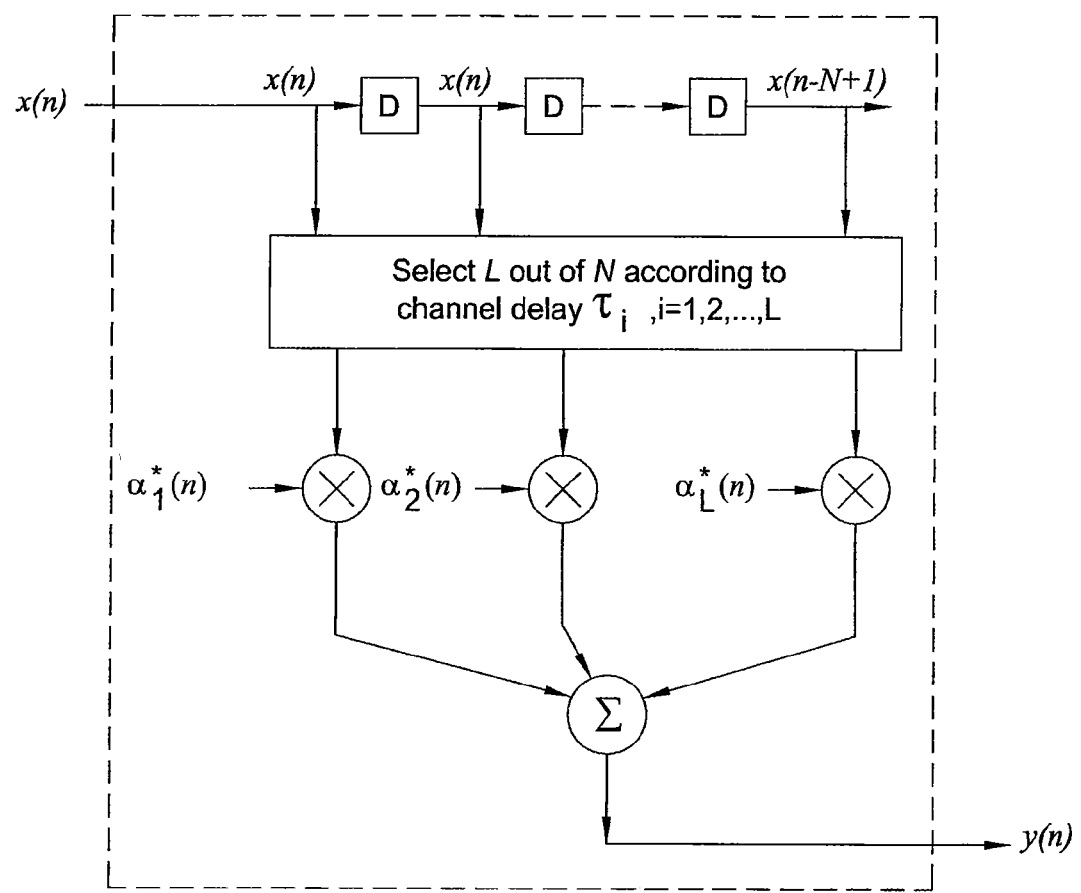
FIG. 33 illustrates a block diagram of a filter that can be implemented by an embodiment of the invention.

Sparse adaptive filters are often used in W-CDMA multipath combiners. FIG. 33 shows a block diagram of a sparse adaptive filter used in this type of application. These filters are characterized by having a small number of non-zero complex coefficients compared to the total number of taps in the filter. Unlike the half-band filters, the location of the non-zero coefficients are not evenly distributed. Since the filter is adaptive, the coefficient values themselves can be adaptively updated.

Sparse filters require that a table of active tap locations be kept and used to address the data values to be multiplied by the coefficients. In an example W-CDMA application, it is assumed that the number of complex coefficients used is no greater than L=16 active out of a possible 128 tap locations. However, any number of coefficients may be used in other applications. In the example W-CDMA application, adaptation of the 16 sparse coefficients occurs on every chip, at a W-CDMA chip rate of 3.84 MHz rate. The update calculation can be a Griffiths algorithm, as discussed above, or any other adaptive filter algorithm.

Figure 34:
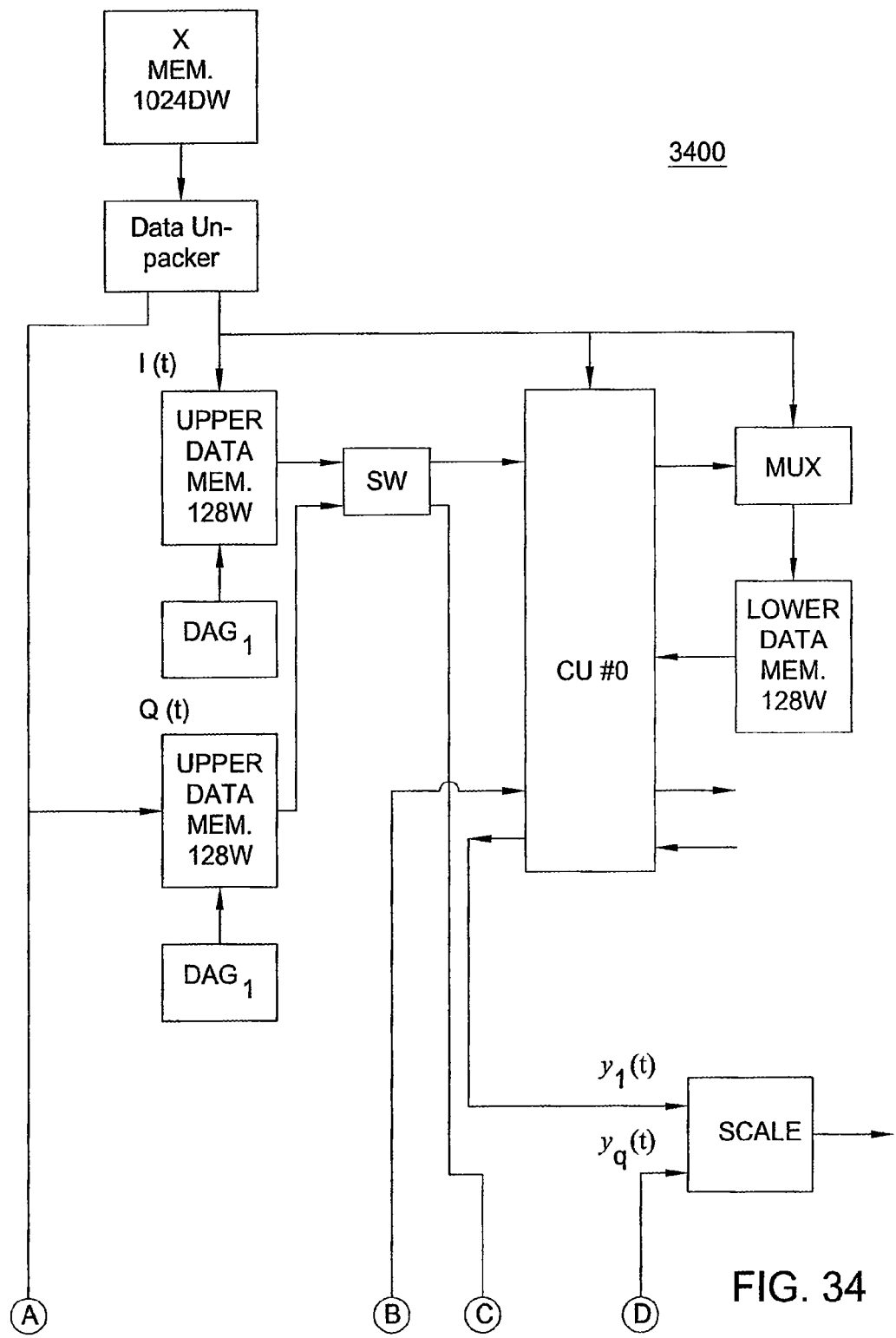
FIG. 34 illustrates the implementation of a filter by an embodiment of the invention.
Figure 34:
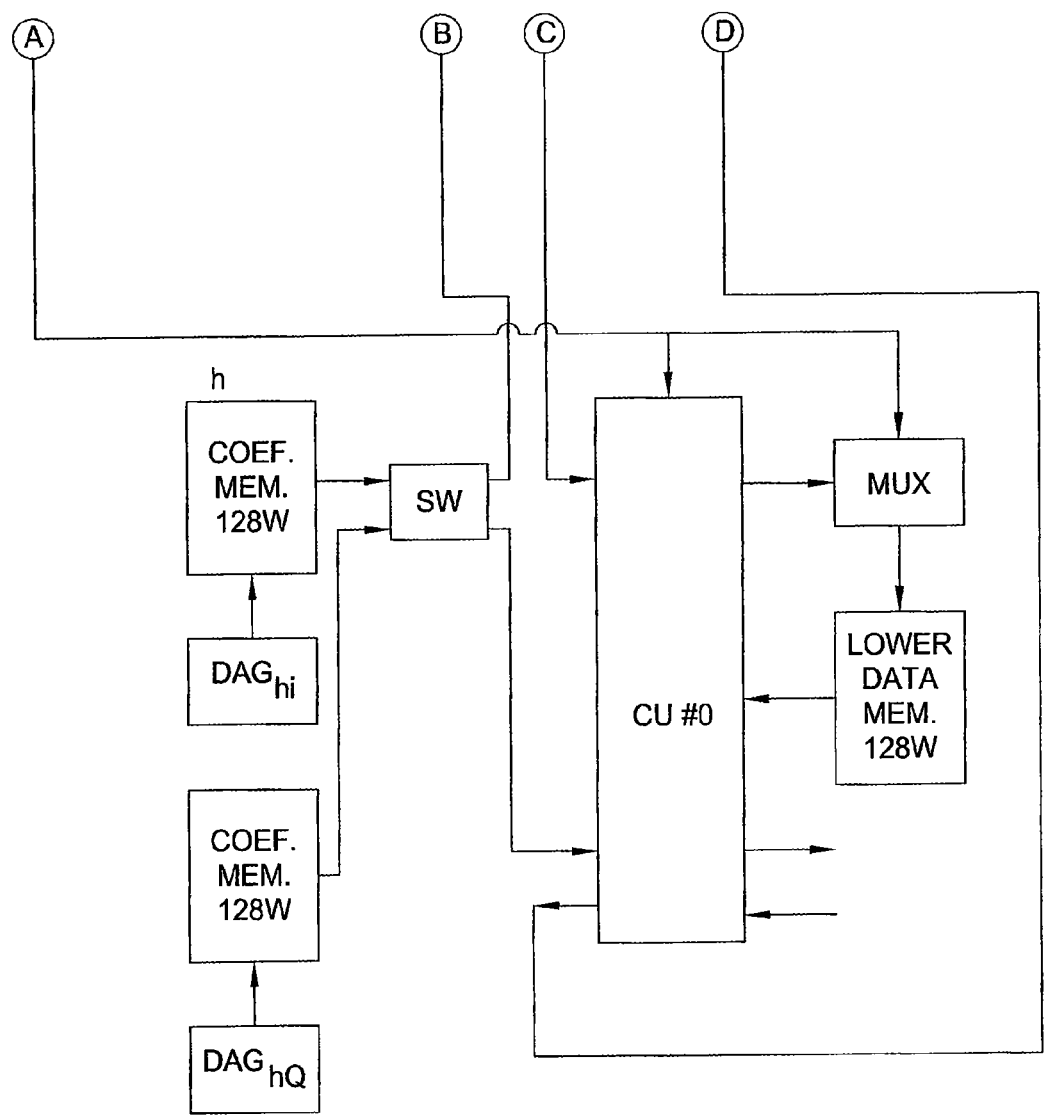

Sparse filters cannot make efficient use of more multipliers than it takes to compute a single output point because their non-zero coefficients are non-uniformly spaced; hence they have no polyphase representation. As a result, FIG. 34 shows a configuration 3400 of a sparse adaptive filter using only two computational units. Configuration 3400 computes the output of complex sparse filters one point at a time.

A special requirement of sparse filters is that the program provides a short list (e.g. 16) of coefficient locations, which changes from time to time. Thus the data address generators fetch the input data according to the list of relative coefficient positions. There is no corresponding complication for the coefficient data address generators, which simply fetch the coefficients in numerical order.

Figure 35:
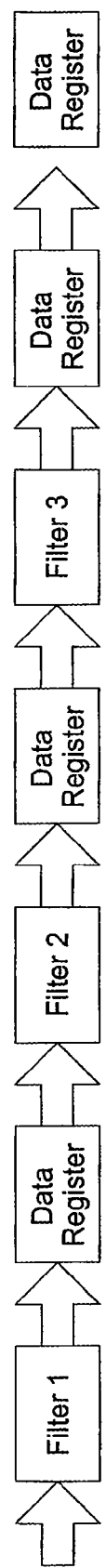
FIG. 35 illustrates a block diagram of a multistage filter that can be implemented by an embodiment of the invention.

Multistage filters are efficient sample-rate changers and are often required in receiver and transmitter applications. For example, the IEEE 802.11a receiver may require multirate filters. Common applications use three stage multirate filters. In addition, a fourth stage of adaptive filtering is sometimes required. Multi-stage filters require that the output of one stage becomes the input to the next stage. FIG. 35 shows the arrangement of a three stage multirate filter. A requirement for these filters is that intermediate memory retain state variables of the filters as the multipliers are applied first to one stage and then another. For power conservation, it is desirable to store intermediate results in registers, for example I memory 708 shown in FIG. 7, rather than in memory. The size of the intermediate data memory required per stage is equal to the number of taps on the intermediate filters plus the number of computational units used in a stage. The only limit on the number of stages implemented is the availability of intermediate memory. Further, any allowable data format (real, half-complex, or complex) or any combination of formats that makes sense may be used between filters.

The foregoing describes a reconfigurable filter node that provides fast performance, flexible configuration, low power consumption, and low cost for a wide variety of digital filter types. The reconfigurable filter node can be easily configured to implement virtually any type of digital filter, including single-rate, polyphase, and adaptive finite impulse response filters. The reconfigurable filter node can filter real, half-complex, or complex inputs and use symmetrical or asymmetric coefficients. The reconfigurable filter node is not limited to the filters or applications discussed. A principal advantage of the present invention is the ability to easily adapt the reconfigurable filter node to different applications as needed.

Although the invention has been discussed with respect to specific embodiments thereof, these embodiments are merely illustrative, and not restrictive, of the invention. For example, although the node has been described as part of an adaptive computing machine, or environment, aspects of the filter node design, processing and functions can be used with other types of systems. The node can also be operated as a stand-alone processor, or as a processing device in other architectures. Deviations, or variations, from the specific design of FIG. 8 are possible and are within the scope of the invention. For example, more or less computational units can be used, additional registers may be added to improve efficiency in particular applications, and the control circuitry can vary. Thus, the scope of the invention is to be determined solely by the scope of the claims.

What is claimed is:

1. A reconfigurable filter node comprising:
    an input data memory adapted to store a plurality of input data values;
    a filter coefficient memory adapted to store a plurality of sets of filter coefficient values, each set having a plurality of filter coefficient values; and
    a plurality of computational units adapted to simultaneously compute a set of filter data values from the input data values and one of the sets of filter coefficients;
    wherein the reconfigurable filter node is adapted to successively compute a plurality of sets of filter data values, each set of filter data values computed by a computational unit that performs a filter convolution on a portion of the input data values using a different one of the plurality of sets of filter coefficients; and
    each computational unit being adapted to receive a different one of the sets of filter coefficients in the plurality of filter coefficients so that different ones of the computational units apply different functions to the portion of the input data values.

2. The reconfigurable filter node of claim 1, further comprising an output data memory adapted to store filter data values.

3. The reconfigurable filter node of claim 2, further comprising a first data address generator for directing filter data values to specified memory addresses within the output data memory.

4. The reconfigurable filter node of claim 3, further comprising a second data address generator for selecting the filter data values from the specified memory addresses within the output data memory to output complete filter data, wherein the complete filter data comprises the filter data values from each set of filter data values.

5. The reconfigurable filter node of claim 4, wherein the first data address generator is adapted to intersperse at a regular interval the filter data values from the each set of filter data values within the output data memory.

6. The reconfigurable filter node of claim 5, wherein the regular interval corresponds to the number of sets of filter coefficient values.

7. The reconfigurable filter node of claim 6, wherein interspersing at the regular interval the filter data values from the each set of filter data values within the output data memory results in the complete filter output data being stored in the output data memory in proper sequential order.

8. The reconfigurable filter node of claim 7, wherein the second data address generator is adapted to select the filter data values from consecutive memory addresses within the output data memory to output the complete filter data.

9. The reconfigurable filter node of claim 4, wherein the first data address generator is adapted to store the filter data values from the each set of filter data values in consecutive memory addresses within the output data memory.

10. The reconfigurable filter node of claim 9, wherein the second data address generator is adapted to select the filter data values interspersed at a regular interval within the output data memory to output the complete filter data.

11. The reconfigurable filter node of claim 10, wherein the regular interval corresponds to the number of sets of filter coefficient values.

* * * * *